United States Patent
Spencer et al.

(10) Patent No.: US 10,256,410 B2
(45) Date of Patent: Apr. 9, 2019

(54) COMPOSITIONS COMPRISING OXYGEN SUBSTITUTED BENZOCYCLOBUTENES AND DIENOPHILES, AND ELECTRONIC DEVICES CONTAINING THE SAME

(71) Applicants: Dow Global Technologies LLC, Midland, MI (US); Rohm and Haas Electronic Materials LLC, Marlborough, MA (US)

(72) Inventors: Liam P. Spencer, Manvel, TX (US); Liang Hong, Schwenksville, PA (US); Chun Liu, Midland, MI (US); Minrong Zhu, Shanghai (CN); Jichang Feng, Shanghai (CN); Jing Jing Yan, Shanghai (CN); Zhengming Tang, Shanghai (CN); Shaoguang Feng, Shanghai (CN); Peter Trefonas, III, Medway, MA (US); David D. Devore, Midland, MI (US); Nolan T. McDougal, Houston, TX (US)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 15/318,396

(22) PCT Filed: Aug. 20, 2015

(86) PCT No.: PCT/CN2015/087658
§ 371 (c)(1),
(2) Date: Dec. 13, 2016

(87) PCT Pub. No.: WO2016/026451
PCT Pub. Date: Feb. 25, 2016

(65) Prior Publication Data
US 2017/0170400 A1    Jun. 15, 2017

(30) Foreign Application Priority Data

Aug. 21, 2014    (WO) ................ PCT/CN2014/084918

(51) Int. Cl.
*C08G 61/12*        (2006.01)
*H01L 51/00*        (2006.01)
(Continued)

(52) U.S. Cl.
CPC .......... *H01L 51/0043* (2013.01); *C08G 61/12* (2013.01); *C08G 61/128* (2013.01);
(Continued)

(58) Field of Classification Search
CPC ................................. C08G 61/00; C08G 61/12
(Continued)

(56) References Cited

U.S. PATENT DOCUMENTS 7,425,375 B2    9/2008    Shirai et al.
7,893,160 B2    2/2011    Inbasekaran et al.
(Continued)

FOREIGN PATENT DOCUMENTS

CN    102329411 A    1/2012
JP    2010062120 A    3/2010
(Continued)

OTHER PUBLICATIONS

Yen-Ju Cheng, et al., Chemistry of Materials, 2008, pp. 413-422, vol. 20.
(Continued)

*Primary Examiner* — Duc Truong
(74) *Attorney, Agent, or Firm* — S. Matthew Cairns

(57) ABSTRACT

A light emitting device comprising a polymeric charge transfer layer, wherein the polymeric charge transfer layer is formed from a composition comprising a polymer, said
(Continued)

polymer comprising one or more polymerized units derived from Structure A, and one or more polymerized units derived from Structure (B), each as follows: A) a monomer having the Structure (A), as defined herein: and B) a monomer that comprises one or more dienophile moieties.

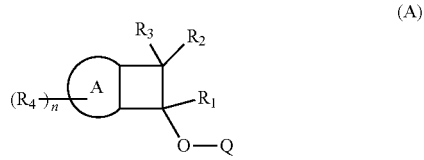

(A)

10 Claims, 4 Drawing Sheets

(51) Int. Cl.
C08L 65/00 (2006.01)
H01L 51/50 (2006.01)

(52) U.S. Cl.
CPC .......... *C08L 65/00* (2013.01); *H01L 51/0034* (2013.01); *H01L 51/0039* (2013.01); *C08G 2261/122* (2013.01); *C08G 2261/135* (2013.01); *C08G 2261/312* (2013.01); *C08G 2261/314* (2013.01); *C08G 2261/3142* (2013.01); *C08G 2261/3162* (2013.01); *C08G 2261/3241* (2013.01); *C08G 2261/344* (2013.01); *C08G 2261/46* (2013.01); *C08G 2261/51* (2013.01); *C08G 2261/512* (2013.01); *C08G 2261/76* (2013.01); *C08G 2261/95* (2013.01); *H01L 51/0003* (2013.01); *H01L 51/5012* (2013.01); *H01L 51/5056* (2013.01); *H01L 51/5072* (2013.01); *H01L 51/5088* (2013.01)

(58) Field of Classification Search
USPC ........................................................ 528/392
See application file for complete search history.

(56) References Cited

U.S. PATENT DOCUMENTS

| 8,283,002 | B2 | 10/2012 | Brown et al. |
|---|---|---|---|
| 8,343,636 | B2 | 1/2013 | Jen et al. |
| 8,455,042 | B2 | 6/2013 | Liu et al. |
| 8,475,938 | B2 | 7/2013 | Yasukawa et al. |
| 9,293,709 | B2 | 3/2016 | Pillow |
| 2004/0004433 | A1 | 1/2004 | Lamansky et al. |
| 2007/0096082 | A1 | 5/2007 | Gaynor et al. |
| 2007/0181874 | A1 | 8/2007 | Prakash et al. |
| 2008/0153019 | A1 | 6/2008 | Wang et al. |
| 2008/0309229 | A1 | 12/2008 | Steudel et al. |
| 2008/0315757 | A1 | 12/2008 | McKiernan et al. |
| 2009/0321723 | A1 | 12/2009 | Hoshi et al. |
| 2010/0133566 | A1 | 6/2010 | Towns et al. |
| 2011/0042661 | A1 | 2/2011 | Endo et al. |
| 2011/0065222 | A1 | 3/2011 | Meyer et al. |
| 2011/0089411 | A1 | 4/2011 | Xia et al. |
| 2011/0095278 | A1 | 4/2011 | Sugita et al. |
| 2011/0114923 | A1 | 5/2011 | Liu et al. |
| 2011/0127516 | A1 | 6/2011 | Nakatani et al. |
| 2011/0198573 | A1 | 8/2011 | Iida et al. |
| 2012/0003790 | A1 | 1/2012 | Brown et al. |
| 2012/0049164 | A1 | 3/2012 | Inbasekaran et al. |

FOREIGN PATENT DOCUMENTS

| KP | 2012066149 A | 6/2012 |
|---|---|---|
| WO | WO-2011/133007 A2 | 10/2011 |
| WO | WO-2012/052704 A2 | 4/2012 |
| WO | WO-2012/175975 A2 | 12/2012 |
| WO | WO-2013/007966 A1 | 1/2013 |
| WO | WO-2016/005026 A1 | 1/2016 |

OTHER PUBLICATIONS

Naoya Aizawa, et al., Organic Electronics, 2013, pp. 1614-1620, vol. 14.
Georgios Liaptsis and Klaus Meerholz, Advanced Functional Materials, 2013, pp. 359-365, vol. 23.
Julia N. Dobish, et al., Polymer Chemistry, 2012, pp. 857-860, vol. 3.
R.A. Kirchhoff and K.J. Bruza, Progress in Polymer Science, 1993, pp. 85-185, vol. 18.
PCT/CN2015/087658, International Preliminary Report on Patentability dated Feb. 21, 2017.
PCT/CN2015/087658, Written Opinion of the International Searching Authority dated Feb. 25, 2016.
PCT/CN2015/087658, International Search Report dated Feb. 25, 2016.
PCT/CN2014/084918, Search Report and Written Opinion dated Apr. 29, 2015.
U.S. Co-pending Application No. PCT/CN14/084915 filed Aug. 21, 2014.
U.S. Co-pending U.S. Appl. No. 62/039,935, filed Aug. 21, 2014.
International search report for International Application No. PCT/CN2014/084918 dated Apr. 8, 2015.
International search report for International ApplicationNo. PCT/CN2015/087658 dated Oct. 22, 2015.

COMPOSITIONS COMPRISING OXYGEN SUBSTITUTED BENZOCYCLOBUTENES AND DIENOPHILES, AND ELECTRONIC DEVICES CONTAINING THE SAME

REFERENCE TO RELATED APPLICATIONS

The present application claims priority to International Application No. PCT/CN14/084918, filed Aug. 21, 2014, and incorporated herein by reference.

BACKGROUND

Organic light emitting diodes (OLEDs) are display devices that employ stacks of films containing organic aromatic compounds as electron transport layers (ETLs) and hole transport layers (HTLs). New material discovery for electron transport layer (ETL) and hole transport layers (HTL) in organic light emitting diodes (OLEDs) have been targeted to improve device performance and lifetimes. In the case of the HTL layer, the process by which the layer is deposited is critical for its end-use application. Methods for depositing the HTL layer, in small display applications, involve evaporation of a small organic compound with a fine metal mask to direct the deposition. In the case of large displays, this approach is not practical from a material usage and high throughput perspective. With these findings in mind, new processes are needed to deposit HTLs that satisfy these challenges, and which can be directly applied to large display applications.

One approach that appears promising is a solution process which involves the deposition of a small molecule followed by crosslinking or polymerization chemistry. There have been extensive efforts in this area, along these lines; however these approaches have their own shortcomings. In particular, the mobility of the charges in the HTL layer becomes reduced, as a result of crosslinking or polymerization chemistry. This reduced hole mobility leads to poor device lifetime and difficulty in maintaining a charge balanced device. This imbalance can also lead to device efficiency issues.

Benzocyclobutene (BCB) chemistries and their use in OLEDs are described in the following: US20040004433, US20080315757, US20080309229, US20100133566, US20110095278, US20110065222, US20110198573, US20110042661, JP2010062120, U.S. Pat. No. 7,893,160, US20110089411, US20070181874, US20070096082, CN102329411, US20120003790, WO2012052776, WO2012175975, WO2013007966, International Application PCT/CN14/084915 (filed Aug. 21, 2014), U.S. Prov. 62/039,935 (filed Aug. 21, 2014).

In the case of styrene-based chemistries, the use of the styrene moiety has been described in the following: U.S. Pat. No. 8,283,002B2; US20120049164A1; KR2012066149A (Abstract); US20090321723A1; WO2011133007A2; JP2004303488A (Abstract); US20080153019A1; WO2011062802A1; WO2009133753A1; U.S. Pat. No. 8,343,636B2; Jen et al., *Chem. Mater.* 2008, 20, 413-422; Kido et al., *Organic Electronics*, 2013, 14, 1614-1620; Meerholz et al., *Adv. Funct. Mater.* 2013, 23, 359-365.

However, there remains a need for new compositions for improved hole-transporting materials, and for improved processing of the same. These needs have been met by the following invention.

SUMMARY OF INVENTION

The invention provides a light emitting device comprising a polymeric charge transfer layer, wherein the polymeric charge transfer layer is formed from a composition comprising a polymer, said polymer comprising one or more polymerized units derived from Structure A, and one or more polymerized units derived from Structure B, each as follows:

A) a monomer having the Structure A:

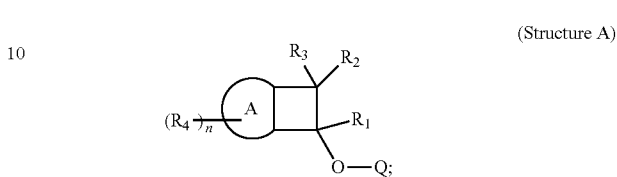

(Structure A)

wherein, for Structure A, A is a substituted or unsubstituted aromatic moiety or a substituted or unsubstituted heteroaromatic moiety; and wherein R1 through R3 are each independently selected from the following: hydrogen, deuterium, a hydrocarbyl, a substituted hydrocarbyl, a heterohydrocarbyl, a substituted heterohydrocarbyl, a halogen, a cyano, an aryl, a substituted aryl, a heteroaryl, a substituted heteroaryl; and wherein n is from 1 to 10; and each R4 is independently selected from the following: hydrogen, deuterium, a hydrocarbyl, a substituted hydrocarbyl, a heterohydrocarbyl, a substituted heterohydrocarbyl, a halogen, a cyano, an aryl, a substituted aryl, a heteroaryl, a substituted heteroaryl; and wherein each R4 group is independently bonded to A; and wherein O is oxygen; and wherein Q is selected from the following: hydrogen, deuterium, a hydrocarbyl, a substituted hydrocarbyl, a heterohydrocarbyl, a substituted heterohydrocarbyl, a halogen, a cyano, an aryl, an substituted aryl, a heteroaryl, a substituted heteroaryl; and wherein two or more of R1 through R4 may optionally form one or more ring structures; and B) a monomer that comprises one or more dienophile moieties.

DETAILED DESCRIPTION

Figure 1:
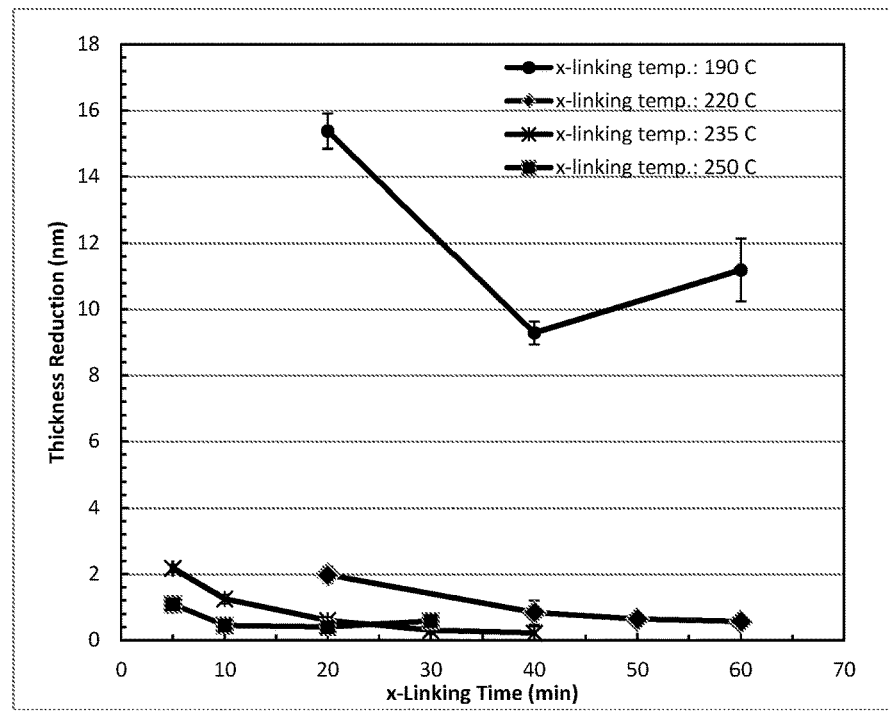
FIG. 1 depicts strip data on films formed from inventive compositions.

It has been discovered inventive composition for use for hole transporting materials that mitigate these drawbacks of the art. It has been discovered that by using one attachment point on the molecule, we can minimize the energy required for rearrangement during oxidation. Furthermore, this flexibility will also lead to more efficient chain stacking which can bring the molecular cores into close proximity to each other. This approach will improve hole transport in the HTL layer via thru-space interactions. Furthermore, the chemistry described in this invention can also satisfy temperature and time considerations relating to desirable process conditions. See, for example, schematic 1 below.

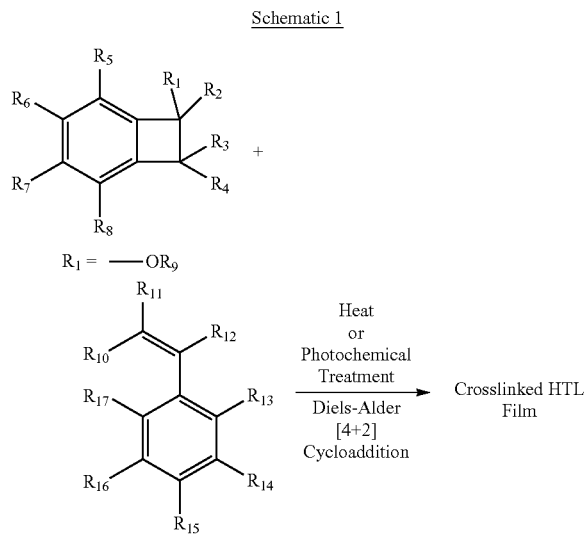

Schematic 1

In comparison to other prior art that utilizes BCB chemistry, it has been discovered invention describes chemistry that would occur at substantially lower temperatures. It is been documented in the open literature that the substitution of oxygen-based donors at the $R_1$-$R_4$ positions above has a dramatic effect on the ring-opening temperature of the BCB (Dobish, J. N.; Hamilton, S. K.; Harth, E. *Polymer Chemistry* 2012, 3, 857-860); this phenomenon has yet to be utilized for OLED-based applications. With unsubstituted BCB derivatives, the ring opening temperatures has been noted to occur at temperatures of approximately 250° C. (Kirchhoff, R. A.; Bruza, K. J. *Progress in Polymer Science* 1993, 18, 85-185). In this invention, the substitution of an oxygen donor results in a significant reduction in the ring opening temperatures to values between 100-120° C. which has significant process advantages over previous inventions. Once a reactive o-quinodimethane moiety has been formed, Diels-Alder reactions can occur to generate new C—C bonds in either a 1- or 2-component approach. Furthermore, the two-component approach with a reactive o-quinodimethane moiety and polydienophile has yet to be reported.

It has been discovered that the inventive composition can be used as hole transporting materials in OLEDs and achieves high efficiency without second organic charge transport compound.

It has been discovered that the inventive composition can be used be used as hole transporting layers in solution-processed OLEDs.

It has been discovered that the inventive composition can be used as hole transporting materials in OLED devices.

It has been discovered that an inventive film can be cross linked thermally and/or with radiation, and further without a crosslinking agent.

As discussed above, the invention provides a light emitting device comprising a polymeric charge transfer layer, wherein the polymeric charge transfer layer is formed from a composition comprising a polymer, said polymer comprising one or more polymerized units derived from Structure A, and one or more polymerized units derived from Structure B, each as follows:

A) a monomer having the Structure A:

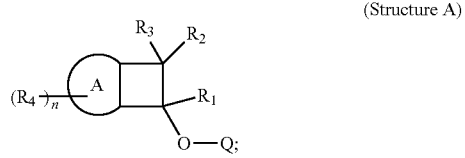

(Structure A)

wherein, for Structure A, A is a substituted or unsubstituted aromatic moiety or a substituted or unsubstituted heteroaromatic moiety; and wherein R1 through R3 are each independently selected from the following: hydrogen; deuterium; a hydrocarbyl, further a $C_1$-$C_{100}$ hydrocarbyl, further a $C_3$-$C_{100}$ hydrocarbyl, further a $C_{10}$-$C_{100}$ hydrocarbyl, further a $C_{20}$-$C_{100}$ hydrocarbyl, further a $C_{30}$-$C_{100}$ hydrocarbyl; a substituted hydrocarbyl, further a $C_1$-$C_{100}$ substituted hydrocarbyl, further a $C_3$-$C_{100}$ substituted hydrocarbyl, further a $C_{10}$-$C_{100}$ substituted hydrocarbyl, further a $C_{20}$-$C_{100}$ substituted hydrocarbyl, further a $C_{30}$-$C_{100}$ substituted hydrocarbyl; a heterohydrocarbyl, further a $C_1$-$C_{100}$ heterohydrocarbyl, further a $C_3$-$C_{100}$ heterohydrocarbyl, further a $C_{10}$-$C_{100}$ heterohydrocarbyl, further a $C_{20}$-$C_{100}$ heterohydrocarbyl, further a $C_{30}$-$C_{100}$ heterohydrocarbyl; a substituted heterocarbyl, further a $C_1$-$C_{100}$ substituted heterohydrocarbyl, further a $C_3$-$C_{100}$ substituted heterohydrocarbyl, further a $C_{10}$-$C_{100}$ substituted heterohydrocarbyl, further a $C_{20}$-$C_{100}$ substituted heterohydrocarbyl, further a $C_{30}$-$C_{100}$ substituted heterohydrocarbyl; a halogen; a cyano; an aryl, further a $C_5$-$C_{100}$ aryl, further a $C_6$-$C_{100}$ aryl, further a $C_{10}$-$C_{100}$ aryl, further a $C_{20}$-$C_{100}$ aryl, further a $C_{30}$-$C_{100}$ aryl; a substituted aryl, further a $C_5$-$C_{100}$ substituted aryl, further a $C_6$-$C_{100}$ substituted aryl, further a $C_{10}$-$C_{100}$ substituted aryl, further a $C_{20}$-$C_{100}$ substituted aryl, further a $C_{30}$-$C_{100}$ substituted aryl; a heteroaryl, further a $C_5$-$C_{100}$ heteroaryl, further a $C_6$-$C_{10}$ heteroaryl further a $C_{10}$-$C_{100}$ heteroaryl, further a $C_{20}$-$C_{100}$ heteroaryl, further a $C_{30}$-$C_{100}$ heteroaryl; a substituted heteroaryl, further a $C_5$-$C_{100}$ substituted heteroaryl, further a $C_6$-$C_{100}$ substituted heteroaryl, further a $C_{10}$-$C_{100}$ substituted heteroaryl, further a $C_{20}$-$C_{100}$ substituted heteroaryl, further a $C_{30}$-$C_{100}$ substituted heteroaryl; and wherein n is from 1 to 10; and each R4 is independently selected from the following: hydrogen; deuterium; a hydrocarbyl, further a $C_1$-$C_{100}$ hydrocarbyl, further a $C_3$-$C_{100}$ hydrocarbyl, further a $C_{10}$-$C_{100}$ hydrocarbyl, further a $C_{20}$-$C_{100}$ hydrocarbyl, further a $C_{30}$-$C_{100}$ hydrocarbyl; a substituted hydrocarbyl, further a $C_1$-$C_{100}$ substituted hydrocarbyl, further a $C_3$-$C_{100}$ substituted hydrocarbyl, further a $C_{10}$-$C_{100}$ substituted hydrocarbyl, further a $C_{20}$-$C_{100}$ substituted hydrocarbyl, further a $C_{30}$-$C_{100}$ substituted hydrocarbyl; a heterohydrocarbyl, further a $C_1$-$C_{100}$ heterohydrocarbyl, further a $C_3$-$C_{100}$ heterohydrocarbyl, further a $C_{10}$-$C_{100}$ heterohydrocarbyl, further a $C_{20}$-$C_{100}$ heterohydrocarbyl, further a $C_{30}$-$C_{100}$ heterohydrocarbyl; a substituted heterohydrocarbyl, further a $C_1$-$C_{100}$ substituted heterohydrocarbyl, further a $C_3$-$C_{100}$ substituted heterohydrocarbyl, further a $C_{10}$-$C_{100}$ substituted heterohydrocarbyl, further a $C_{20}$-$C_{100}$ substituted heterohydrocarbyl, further a $C_{30}$-$C_{100}$ substituted heterohydrocarbyl; a halogen; a cyano; an aryl, further a $C_5$-$C_{100}$ aryl, further a $C_6$-$C_{100}$ aryl, further a $C_{10}$-$C_{100}$ aryl, further a $C_{20}$-$C_{100}$ aryl, further a $C_{30}$-$C_{100}$ aryl; a substituted aryl, further a $C_5$-$C_{100}$ substituted aryl, further a $C_6$-$C_{100}$ substituted aryl, further a $C_{10}$-$C_{100}$ substituted aryl, further a $C_{20}$-$C_{100}$ substituted aryl, further a $C_{30}$-$C_{100}$ substituted aryl; a heteroaryl, further a $C_5$-$C_{100}$ heteroaryl, further a $C_6$-$C_{10}$ heteroaryl further a $C_{10}$-$C_{100}$ heteroaryl, further a $C_{20}$-$C_{100}$ heteroaryl, further a $C_{30}$-$C_{100}$ heteroaryl; a substituted heteroaryl, further a $C_5$-$C_{100}$ substituted heteroaryl, further a $C_6$-$C_{100}$ substituted heteroaryl, further a $C_{10}$-$C_{100}$ substituted heteroaryl, further a $C_{20}$-$C_{100}$ substituted heteroaryl, further a $C_{30}$-$C_{100}$ substituted heteroaryl; and wherein each R4 group is independently bonded to A; and wherein O is oxygen; and wherein Q is selected from the following: hydrogen; deuterium; a hydrocarbyl, further a $C_1$-$C_{100}$ hydrocarbyl, further a $C_3$-$C_{100}$ hydrocarbyl, further a $C_{10}$-$C_{100}$ hydrocarbyl, further a $C_{20}$-$C_{100}$ hydrocarbyl, further a $C_{30}$-$C_{100}$ hydrocarbyl; a substituted hydrocarbyl, further a $C_1$-$C_{100}$ substituted hydrocarbyl, further a $C_3$-$C_{100}$ substituted hydrocarbyl, further a $C_{10}$-$C_{100}$ substituted hydrocarbyl, further a $C_{20}$-$C_{100}$ substituted hydrocarbyl, further a $C_{30}$-$C_{100}$ substituted hydrocarbyl; a heterocarbyl, further a $C_1$-$C_{100}$ heterohydrocarbyl, further a $C_3$-$C_{100}$ heterohydrocarbyl, further a $C_{10}$-$C_{100}$ heterohydrocarbyl, further a $C_{20}$-$C_{100}$ heterohydrocarbyl, further a $C_{30}$-$C_{100}$ heterohydrocarbyl; a substituted heterohydrocarbyl, further a $C_1$-$C_{100}$ substituted heterohydrocarbyl, further a $C_3$-$C_{100}$ substituted heterohydrocarbyl, further a $C_{10}$-$C_{100}$ substituted heterohydrocarbyl, further a $C_{20}$-$C_{100}$ substituted heterohydrocarbyl, further a $C_{30}$-$C_{100}$ substituted heterohydrocarbyl; a halogen; a cyano; a aryl, further a $C_5$-$C_{100}$ aryl, further a $C_6$-$C_{100}$ aryl, further a $C_{10}$-$C_{100}$ aryl, further a $C_{20}$-$C_{100}$ aryl, further a $C_{30}$-$C_{100}$ aryl; a substituted aryl, a $C_5$-$C_{100}$ substituted aryl, further a $C_6$-$C_{100}$ substituted aryl, further a $C_{10}$-$C_{100}$ substituted aryl, further a $C_{20}$-$C_{100}$ substituted aryl, further a $C_{30}$-$C_{100}$ substituted aryl; a heteroaryl, further a $C_5$-$C_{100}$ heteroaryl, further a $C_6$-$C_{10}$ heteroaryl further a $C_{10}$-$C_{100}$ heteroaryl, further a $C_{20}$-$C_{100}$ heteroaryl, further a $C_{30}$-$C_{100}$ heteroaryl; a substituted heteroaryl, further a $C_5$-$C_{100}$ substituted heteroaryl, further a $C_6$-$C_{100}$ substituted heteroaryl, further a $C_{10}$-$C_{100}$ substituted heteroaryl, further a $C_{20}$-$C_{100}$ substituted heteroaryl, further a $C_{30}$-$C_{100}$ substituted heteroaryl; and wherein two or more of R1 through R4 may optionally form one or more ring structures; and B) a monomer that comprises one or more dienophile moieties An inventive device may comprise a combination of two or more embodiments as described herein.

As used herein, $R1=R_1$, $R2=R_2$, $R3=R_3$, and so forth.

Substituents include, but are not limited to, OR', NR'$_2$, PR'$_2$, P(=O)R'$_2$, SiR'$_3$; where each R' is a $C_{30}$-$C_{100}$ hydrocarbyl group.

In one embodiment, monomer of component B is selected from a structure of Structure B:

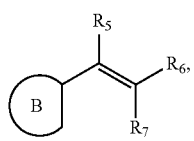

(Structure B)

wherein, for Structure B, B is a substituted or unsubstituted aromatic moiety or a substituted or unsubstituted heteroaromatic moiety; and wherein R5 through R7 are each independently selected from the following: hydrogen, deuterium, a $C_6$-$C_{100}$ hydrocarbon, a substituted $C_6$-$C_{100}$ hydrocarbon, a halogen, a cyano, an unsubstituted $C_6$-$C_{100}$ aryl, a substituted $C_6$-$C_{100}$ aryl, an unsubstituted $C_6$-$C_{100}$ heteroaryl, a substituted $C_6$-$C_{100}$ substituted aryl, OR', NR'$_2$, PR'$_2$, P(=O)R'$_2$, SiR'$_3$ where each R' is a $C_1$-$C_{20}$ hydrocarbyl group, and wherein two or more of R5, R6 and/or R7 may optionally form one or more ring structures.

In one embodiment, for Structure B, R5 through R7 are each independently selected from the following: hydrogen, deuterium, a $C_6$-$C_{100}$ hydrocarbon, a substituted $C_6$-$C_{100}$ hydrocarbon, a halogen, a cyano, an unsubstituted $C_6$-$C_{100}$ aryl, a substituted $C_6$-$C_{100}$ aryl, an unsubstituted $C_6$-$C_{100}$ heteroaryl, a substituted $C_6$-$C_{100}$ substituted aryl, OR', NR'$_2$, PR'$_2$, P(=O)R'$_2$, SiR'$_3$ where each R' is a $C_1$-$C_{20}$ hydrocarbyl group.

In one embodiment, the polymer further comprises one or more polymerized units derived from a cross-linking agent having Structure C:

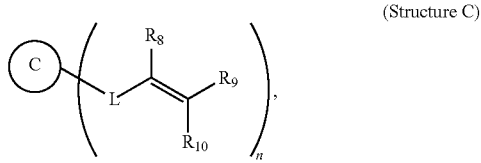

(Structure C)

wherein, for Structure C, C is an aromatic moiety, a heteroaromatic moiety, a $C_1$-$C_{50}$ hydrocarbyl, a $C_1$-$C_{50}$ substituted hydrocarbyl, a $C_1$-$C_{50}$ heterohydrocarbyl, or a $C_1$-$C_{50}$ substituted heterohydrocarbyl; and wherein R8 through R10 are each independently selected from the following: hydrogen, deuterium, a $C_1$-$C_{50}$ hydrocarbyl, a $C_1$-$C_{50}$ substituted hydrocarbyl, a $C_1$-$C_{50}$ heterohydrocarbyl, a $C_1$-$C_{50}$ substituted heterohydrocarbyl, halogen, cyano, a $C_5$-$C_{50}$ aryl, a $C_5$-$C_{50}$ substituted aryl, a $C_5$-$C_{50}$ heteroaryl, a $C_5$-$C_{50}$ substituted heteroaryl; and wherein n is from 1 to 25; and wherein each "chemical group comprising L, R8, R9 and R10" is independently boned to C;

wherein L is selected from an aromatic moiety, a heteroaromatic moiety, a $C_1$-$C_{100}$ hydrocarbyl, a $C_1$-$C_{100}$ substituted hydrocarbyl, a $C_1$-$C_{100}$ heterohydrocarbyl, or a $C_1$-$C_{100}$ substituted heterohydrocarbyl, or wherein L is not present; and further L is selected from an aromatic moiety, a heteroaromatic moiety, a $C_1$-$C_{100}$ hydrocarbyl, a $C_1$-$C_{100}$ substituted hydrocarbyl, a $C_1$-$C_{100}$ heterohydrocarbyl, or a $C_1$-$C_{100}$ substituted heterohydrocarbyl;

wherein two or more of R8 through R10 may optionally form one or more ring structures.

In one embodiment, the cross-linking agent selected from the following C1-C8:

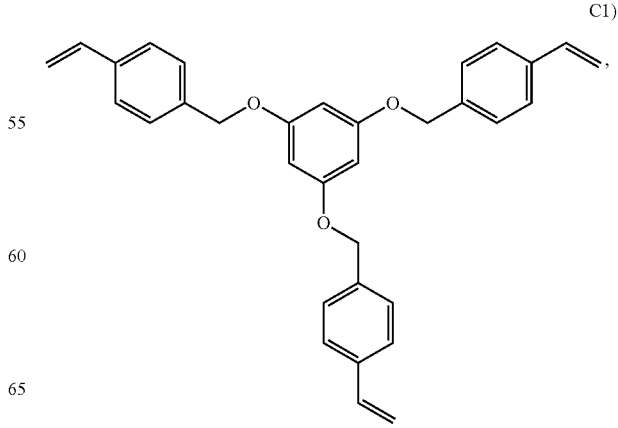

C1)

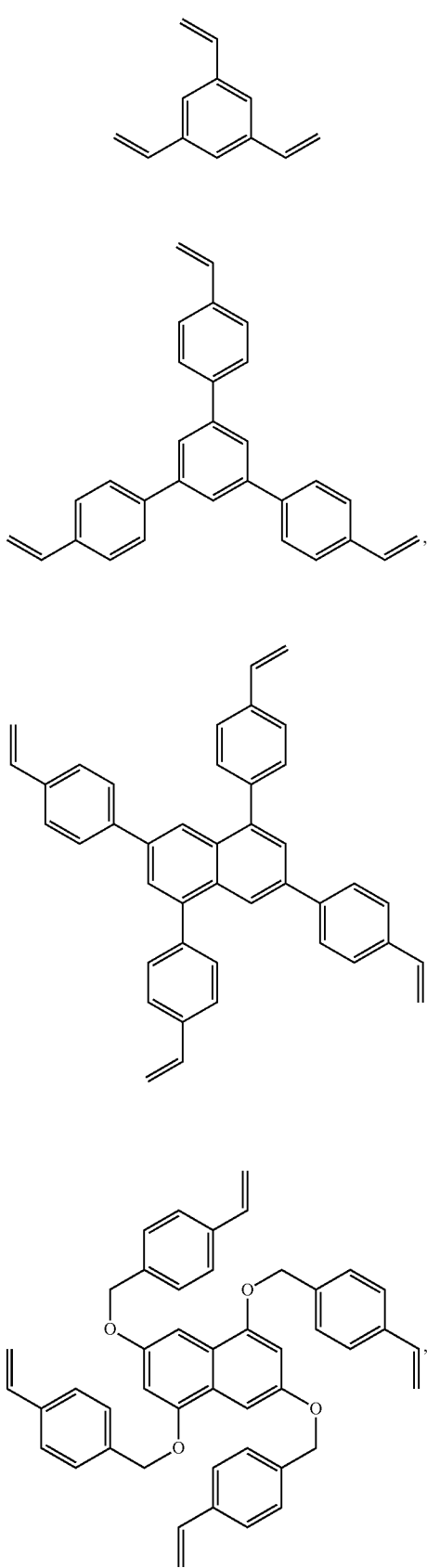

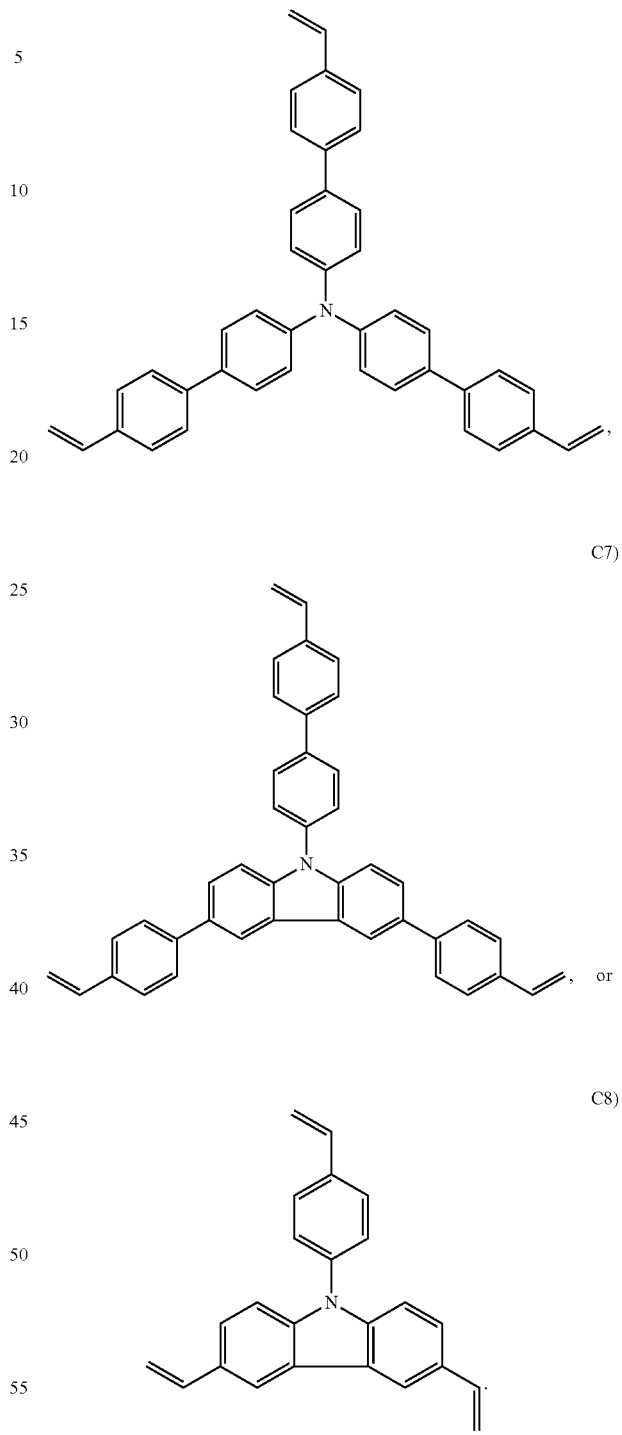

In one embodiment, the crosslinking agent is present in an amount from greater than 0 to 20 mole %, further from greater than 0 to 10 mole %, based on the sum moles of Structure A, Structure B and cross-linking agent (Structure C).

In one embodiment, the molar ratio of Structure A to Structure B is from 0.8 to 1.2, further from 0.9 to 1.1.

In one embodiment, the monomer of component B is selected from the following B1 through B4:

B1)
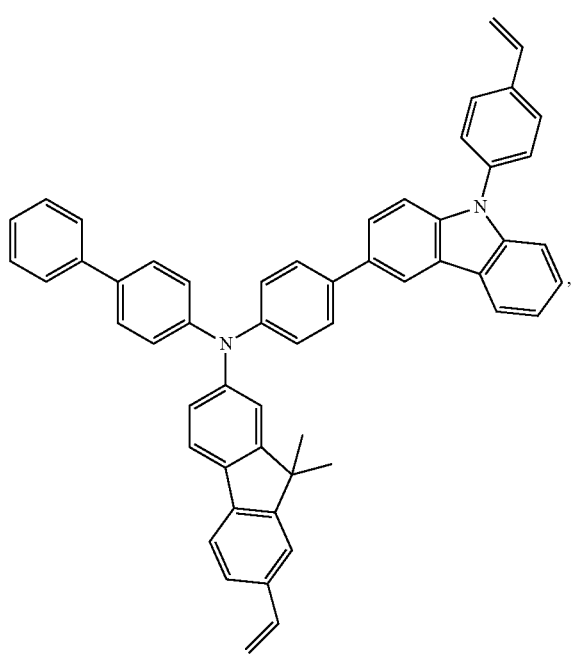
B2)
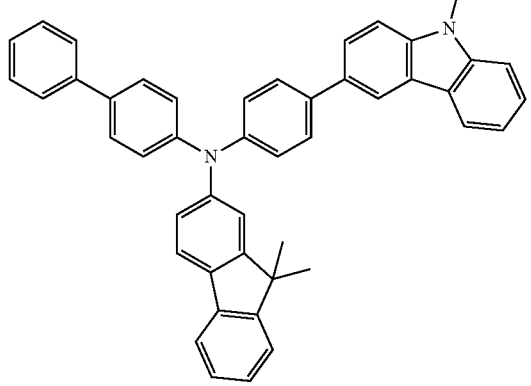
B3)
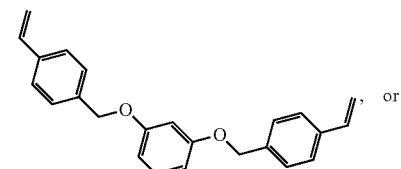
B4)
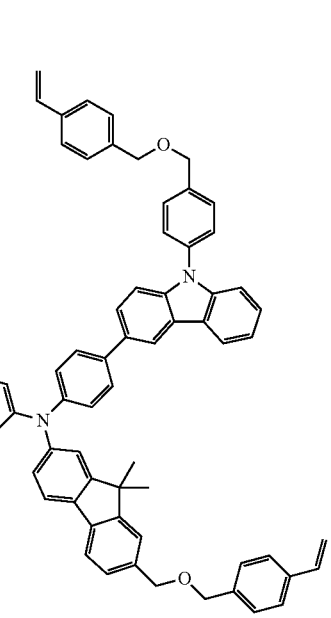
In one embodiment, Structure A is selected from the following A1 through A8:
A1)
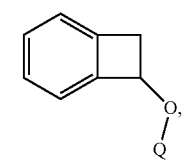
A2)
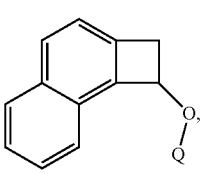

-continued

A3) 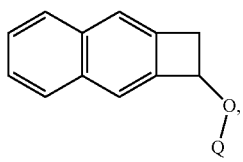

A4) 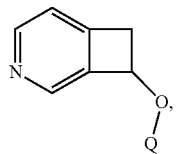

A5) 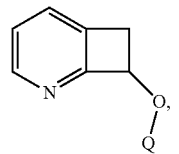

A6) 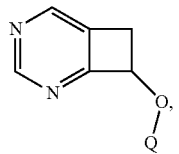

A7) 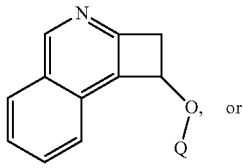

A8) 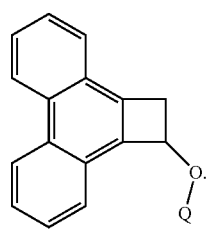

In one embodiment, Structure A is selected from the following A9 through A14:

A9) 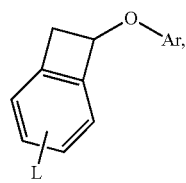

A10) 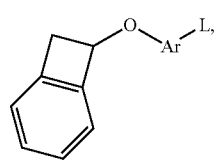

-continued

A11) 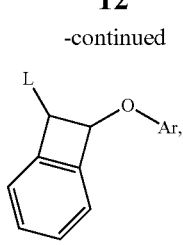

A12) 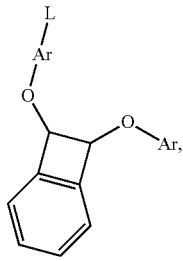

A13) 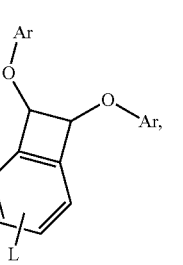

A14) 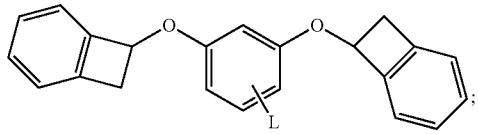

and wherein for each structure A9 through A14, L is independently selected from hydrogen, a hydrocarbon, or a substituted hydrocarbon. Each Ar is, independently, a substituted or unsubstituted aromatic moiety or a substituted or unsubstituted heteroaromatic moiety, and further a substituted or unsubstituted aromatic moiety In one embodiment, Structure A is selected from the following A15 through A20:

A15) 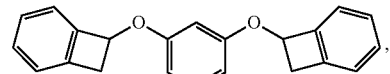
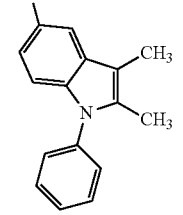

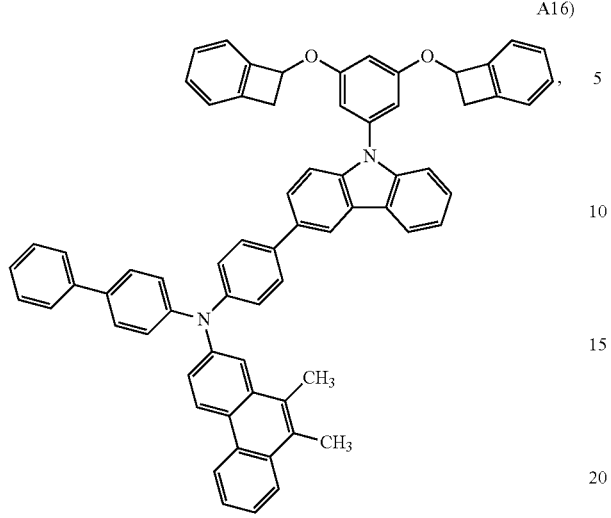
A16)
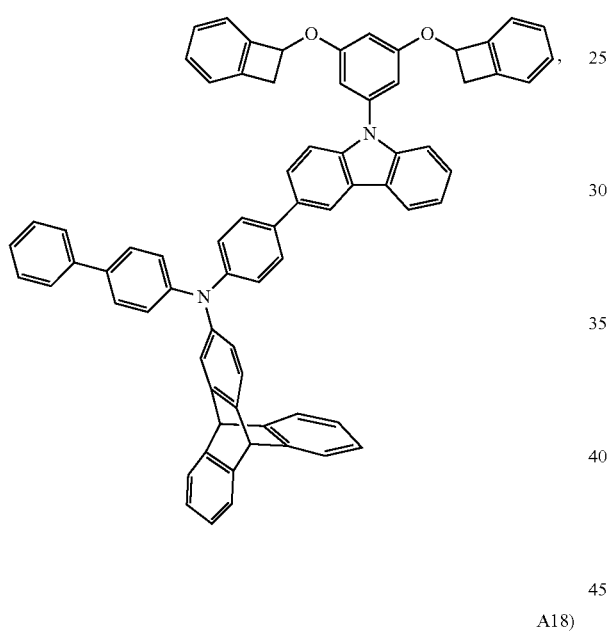
A17)
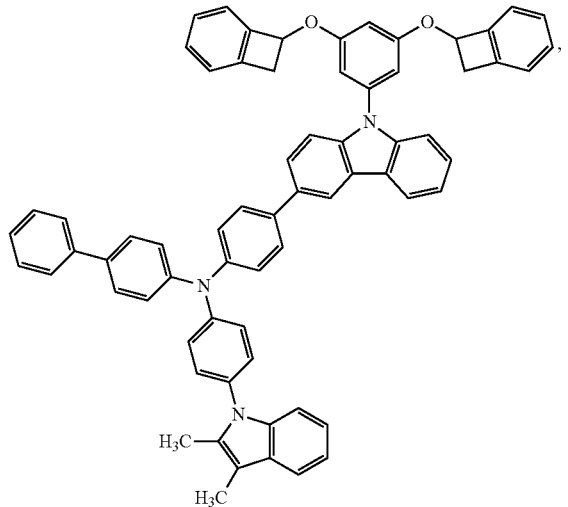
A18)
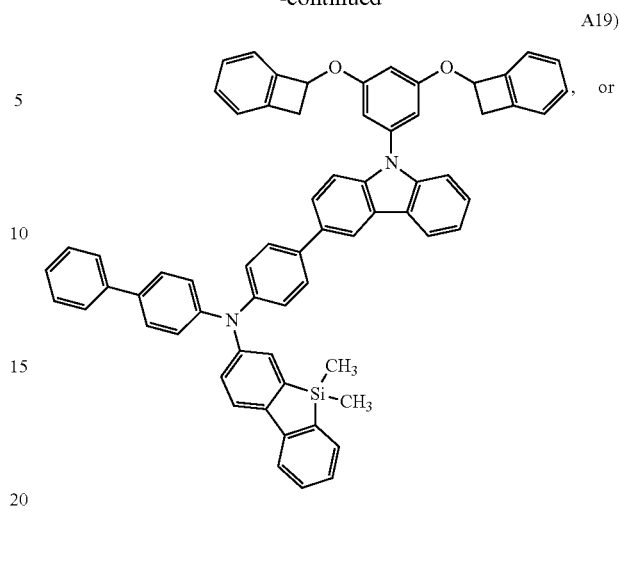
A19)
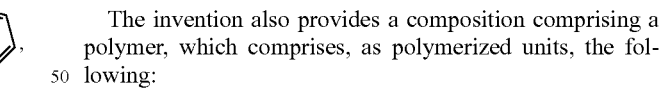
A20)
The invention also provides a composition comprising a polymer, which comprises, as polymerized units, the following:
A) a monomer having the Structure A:
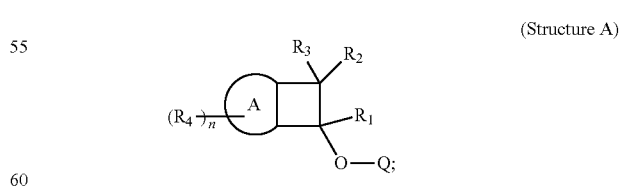
(Structure A)
wherein Structure A is defined above; and
B) a monomer that comprises one or more dienophile moieties.
In one embodiment, monomer of component B is selected from a structure of Structure B:

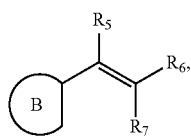
(Structure B)

wherein, for Structure B, B is a substituted or unsubstituted aromatic moiety or a substituted or unsubstituted heteroaromatic moiety; and wherein R5 through R7 are each independently selected from the following: hydrogen, deuterium, a $C_6$-$C_{100}$ hydrocarbon, a substituted $C_6$-$C_{100}$ hydrocarbon, a halogen, a cyano, an unsubstituted $C_6$-$C_{100}$ aryl, a substituted $C_6$-$C_{100}$ aryl, an unsubstituted $C_6$-$C_{100}$ heteroaryl, a substituted $C_6$-$C_{100}$ substituted aryl, OR', NR'$_2$, PR'$_2$, P(=O)R'$_2$, SiR'$_3$ where each R' is a $C_6$-$C_{100}$ hydrocarbyl group, and wherein two or more of R5, R6 and/or R7 may optionally form one or more ring structures.

In one embodiment, the polymer further comprises one or more polymerized units derived from a cross-linking agent having the Structure C:

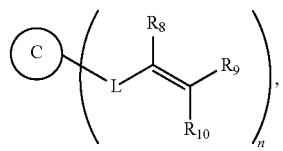
(Structure C)

wherein, for Structure C, C is an aromatic moiety, a heteroaromatic moiety, a $C_1$-$C_{50}$ hydrocarbyl, a $C_1$-$C_{50}$ substituted hydrocarbyl, a $C_1$-$C_{50}$ heterohydrocarbyl, or a $C_1$-$C_{50}$ substituted heterohydrocarbyl; and wherein R8 through R10 are each independently selected from the following:

hydrogen, deuterium, a $C_1$-$C_{50}$ hydrocarbyl, a $C_1$-$C_{50}$ substituted hydrocarbyl, a $C_1$-$C_{50}$ heterohydrocarbyl, a $C_1$-$C_{50}$ substituted heterohydrocarbyl, halogen, cyano, a $C_5$-$C_{50}$ aryl, a $C_5$-$C_{50}$ substituted aryl, a $C_5$-$C_{50}$ heteroaryl, a $C_5$-$C_{50}$ substituted heteroaryl; and wherein n is from 1 to 25; and wherein each "chemical group comprising L, R8, R9 and R10" is independently boned to C;

wherein L is selected from an aromatic moiety, a heteroaromatic moiety, a $C_1$-$C_{100}$ hydrocarbyl, a $C_1$-$C_{100}$ substituted hydrocarbyl, a $C_1$-$C_{100}$ heterohydrocarbyl, or a $C_1$-$C_{100}$ substituted heterohydrocarbyl, or wherein L is not present; and further L is selected from an aromatic moiety, a heteroaromatic moiety, a $C_1$-$C_{100}$ hydrocarbyl, a $C_1$-$C_{100}$ substituted hydrocarbyl, a $C_1$-$C_{100}$ heterohydrocarbyl, or a $C_1$-$C_{100}$ substituted heterohydrocarbyl;

wherein two or more of R8 through R10 may optionally form one or more ring structures.

In one embodiment, the cross-linking agent selected from the following C1-C8:

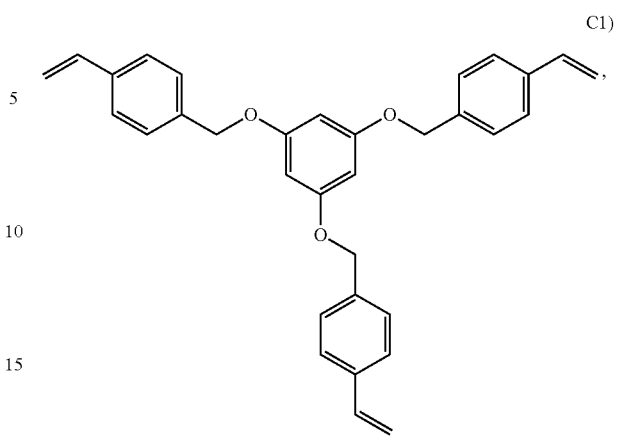
C1)

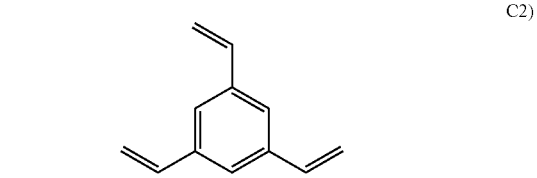
C2)

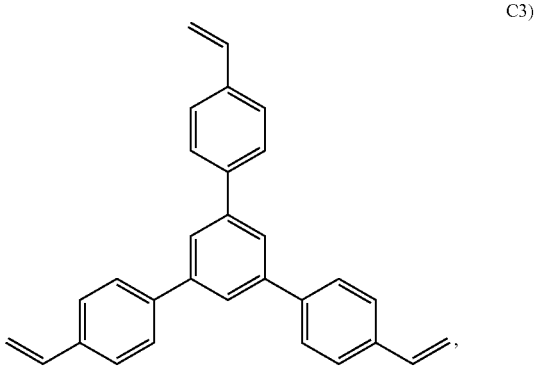
C3)

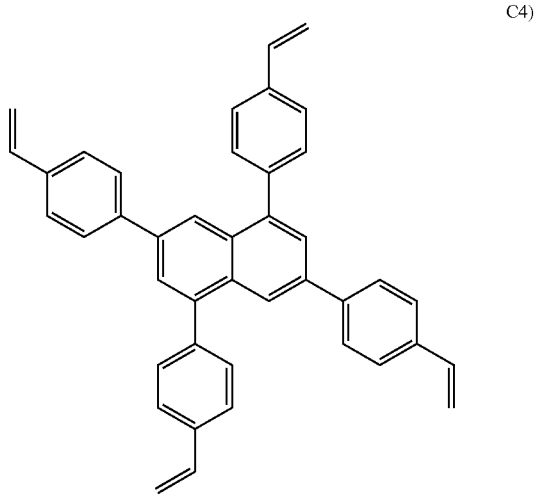
C4)

C5)

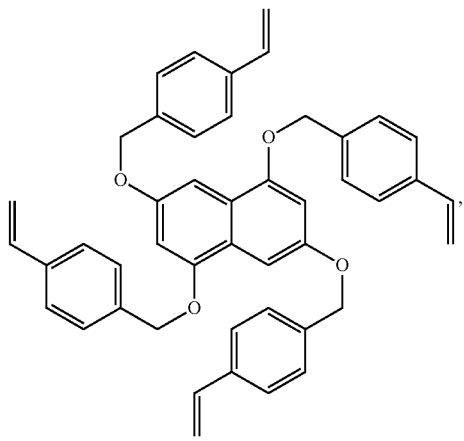

C6)

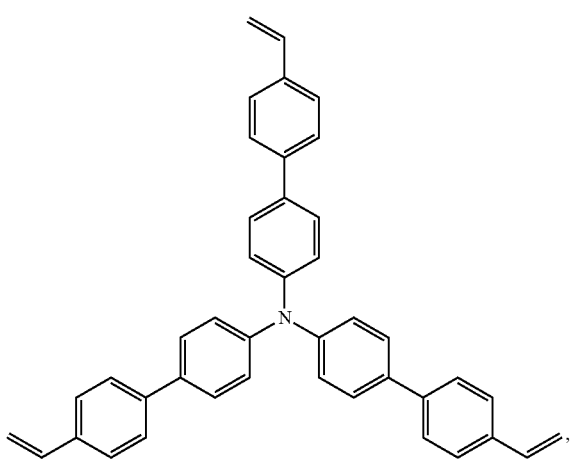

C7)

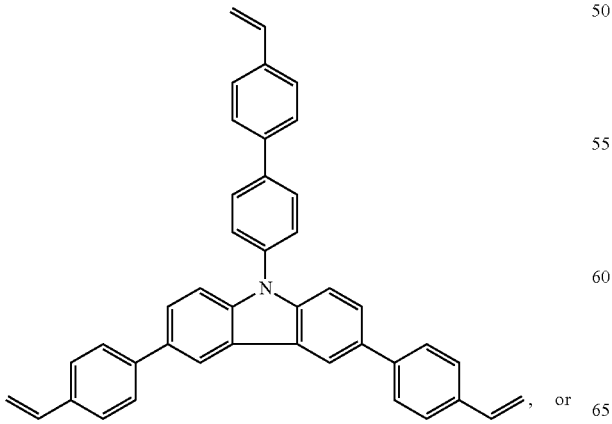

, or

C8)

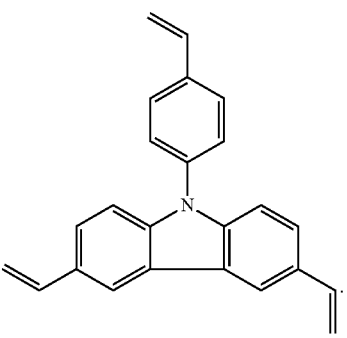

In one embodiment, the crosslinking agent is present in an amount from greater than 0 to 20 mole %, further from greater than 0 to 10 mole %, based on the sum moles of Structure A, Structure B and cross-linking agent.

In one embodiment, the molar ratio of Structure A to Component B is from 0.8 to 1.2, further from 0.9 to 1.1.

In one embodiment, the monomer of component B is selected from the following B1 through B4:

B1)

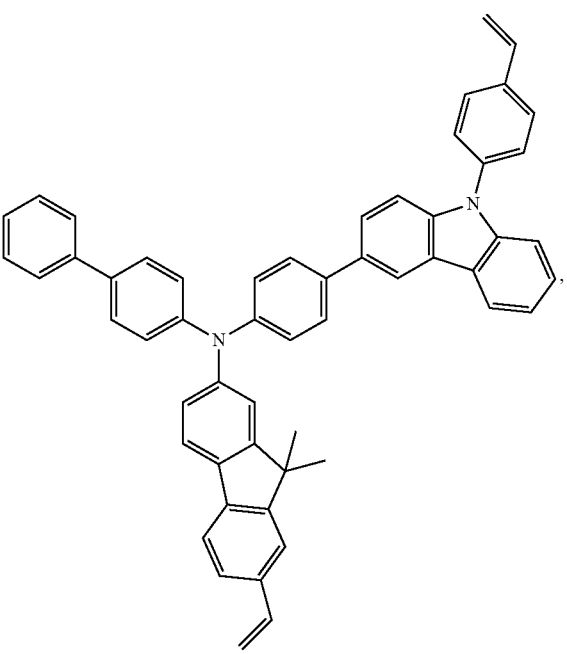

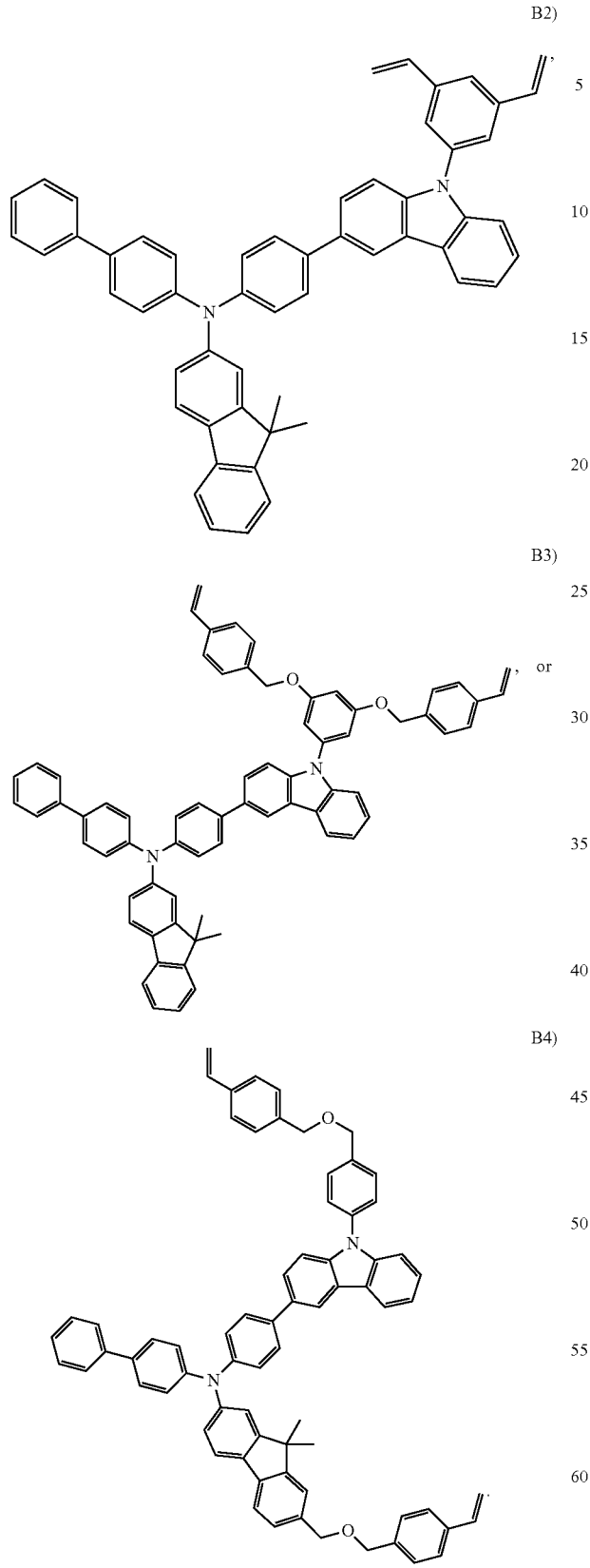
In one embodiment, Structure A is selected from the following A1 through A8:
In one embodiment, Structure A is selected from the following A9 through A14:

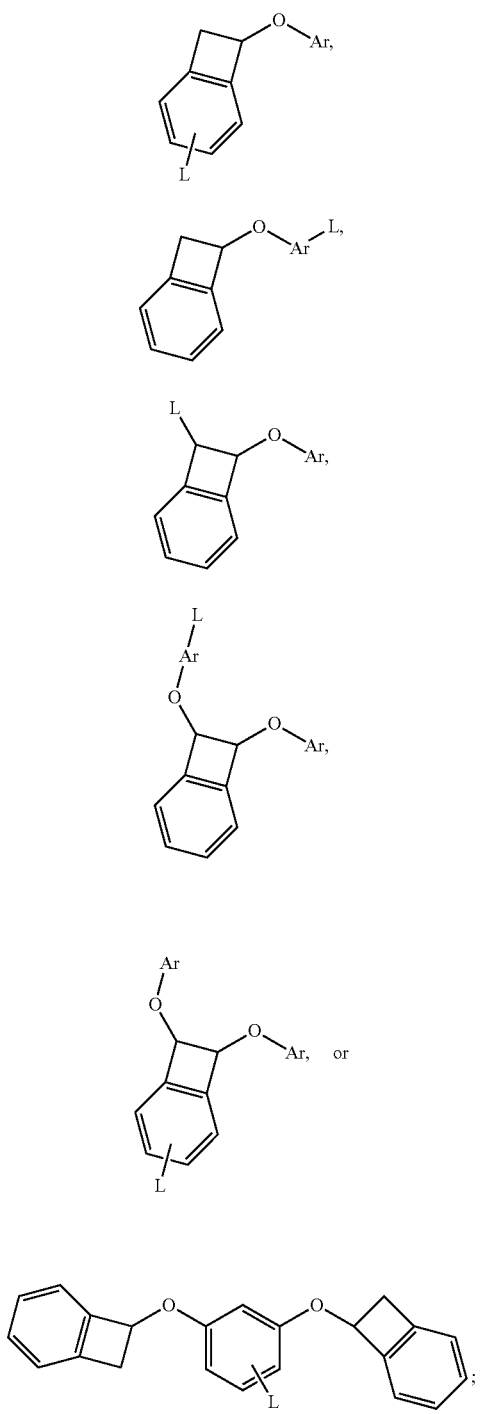
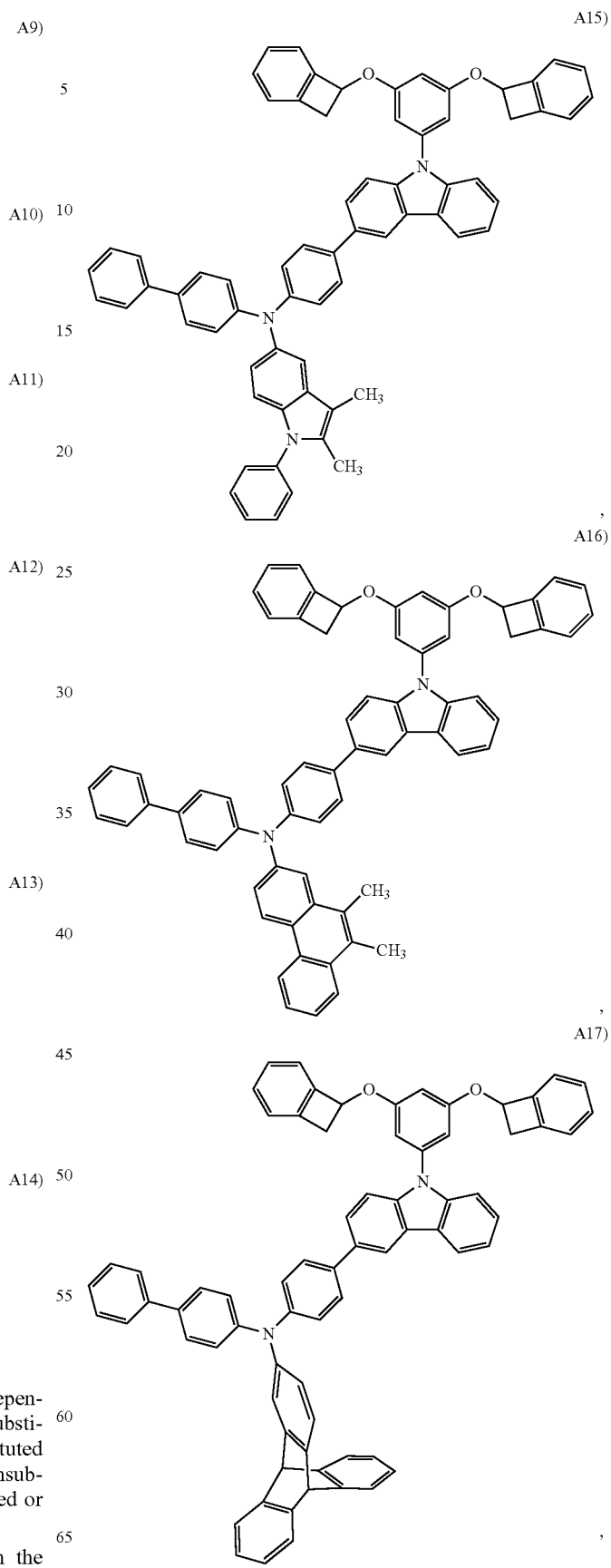

and wherein for each structure A9 through A14, L is independently selected from hydrogen, a hydrocarbon, or a substituted hydrocarbon. Each Ar is, independently, a substituted or unsubstituted aromatic moiety or a substituted or unsubstituted heteroaromatic moiety, and further a substituted or unsubstituted aromatic moiety.

In one embodiment, Structure A is selected from the following A15 through A20:

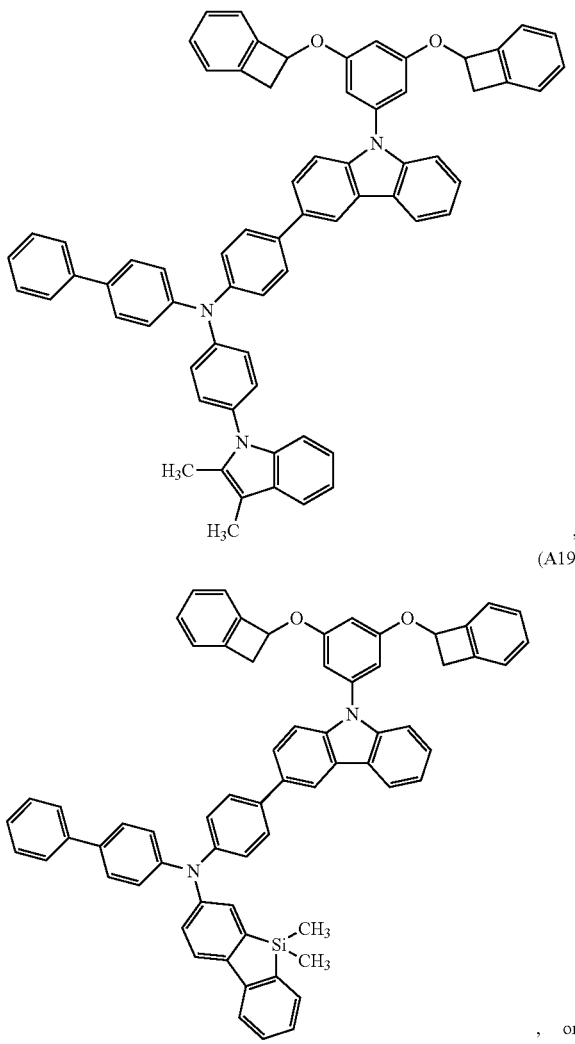

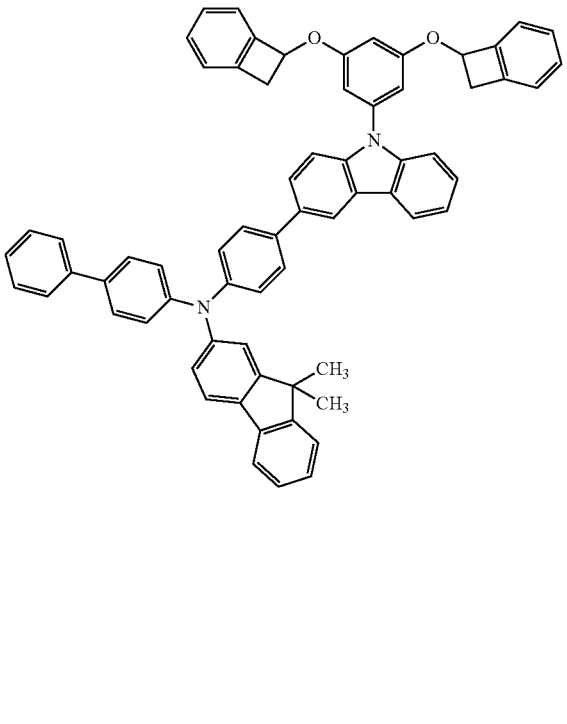

In one embodiment, Structure A has a molecular weight from 200 g/mole to 5,000 g/mole, further from 300 g/mole to 4,000 g/mole.

In one embodiment, the Structure B has a molecular weight from 400 g/mole to 2,000 g/mole, further from 500 g/mole to 1,000 g/mole.

In one embodiment, the polymer, comprising one or more polymerized units derived from Structure A, and one or more polymerized units derived from Structure B, comprises at least one structural unit as follows:

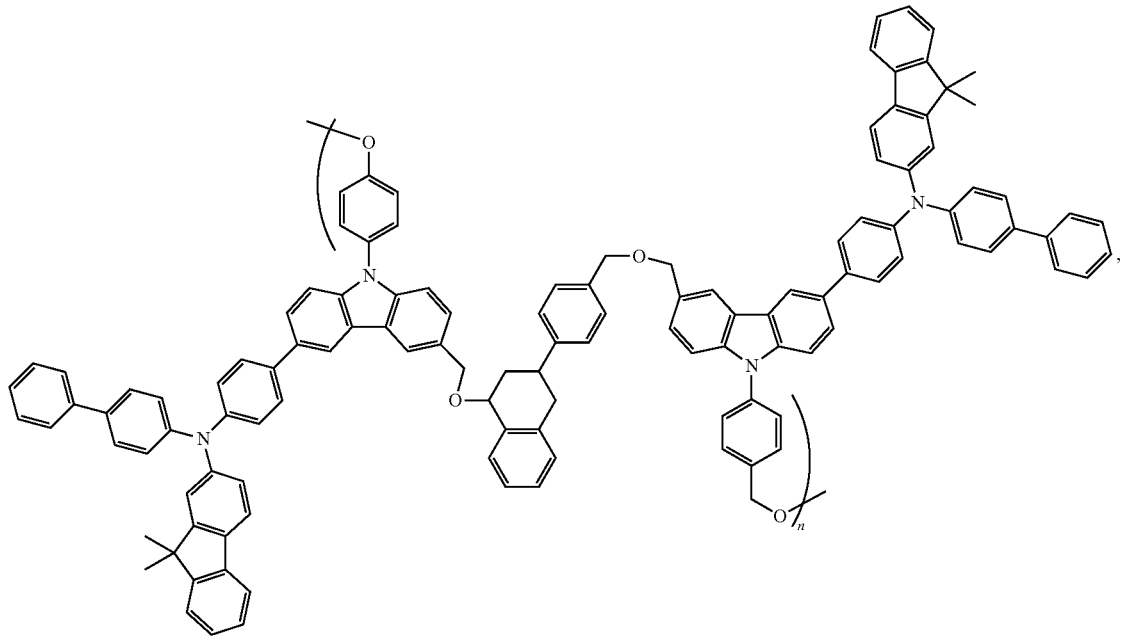

wherein n≥1, further n=1 to 1000, or n=2 to 800, or n=3 to 600, or n=4 to 400.

The invention also provides a hole transporting solution-processed layer formed from an inventive composition as described herein, including a composition of one or more embodiments as described herein.

In one embodiment, the hole transporting solution-processed layer is prepared in an inert atmosphere with less than 50 ppm of 02, based on total weight of components in atmosphere.

In one embodiment, the hole transporting solution-processed layer is formed from a solution coating onto a substrate, and wherein the coating is baked (thermally treated) at a temperature greater than, or equal to, 75 degrees Celsius. In a further embodiment, the coating is baked at a temperature from 75 to 300 degrees Celsius. In a further embodiment, the coating is contacted with a heat source to facilitate chemical reactions which lead to an increase in the molecular weight of the molecules of the polymer.

In one embodiment, the hole transporting solution-processed layer is insoluble in anisole.

In one embodiment, the hole transporting solution-processed layer shows less than 1 nm removal, following contact with anisole at 23 degrees Celsius, for 60 seconds.

In one embodiment, the hole transporting solution-processed layer is overcoated with another solvent-borne organic material, to form two layers with an intermixed interface between these layers, and wherein the thickness of the intermixed interface is less than 1 nm.

The hole transporting solution-processed layer may comprise a combination of two or more embodiments as described herein.

The invention also provides a hole injection solution-processed layer formed from an inventive composition as described herein, including a composition of one or more embodiments as described herein.

The hole injection solution-processed layer may comprise a combination of two or more embodiments as described herein.

The invention also provides an emissive solution-processed layer formed from an inventive composition as described herein, including a composition of one or more embodiments as described herein.

The emissive solution-processed layer may comprise a combination of two or more embodiments as described herein.

The invention also provides an electron transporting solution-processed layer formed from an inventive composition as described herein, including a composition of one or more embodiments as described herein.

The electron transporting solution-processed layer may comprise a combination of two or more embodiments as described herein.

The invention also provides an electronic device comprising an inventive hole transporting solution-processed layer, as described herein, or an inventive hole transporting solution-processed layer of one or more embodiments described herein.

The invention also provides an electronic device comprising an inventive hole injection solution-processed layer, as described herein, or an inventive hole injection solution-processed layer of one or more embodiments described herein.

The invention also provides an electronic device comprising an inventive emissive solution-processed layer, as described herein, or an inventive emissive solution-processed layer of one or more embodiments described herein.

The invention also provides an electronic device comprising an inventive electron transport solution-processed layer, as described herein, or an inventive electron transport solution-processed layer of one or more embodiments described herein.

The invention also provides a film comprising at least one Layer A formed from an inventive composition.

The invention also provides an article comprising at least one component formed from an inventive composition.

In one embodiment, the article is an electroluminescent device.

The invention also provides an article comprising at least one component formed from an inventive film.

In one embodiment, the article is an electroluminescent device.

An inventive article may comprise a combination of two or more embodiments described herein.

An inventive composition may comprise a combination of two or more embodiments described herein.

Definitions

The term "dienophile," as used herein, refers to a molecule that possesses 2 π-electrons, and which can participate in Diels-Alder cycloaddition reactions. Examples of this include, but are not limited to, alkenes, alkynes, nitriles, enol ethers, and enamines.

The term "dienophile moiety," as used herein, refers to a chemical group that possesses 2 π-electrons, and which can participate in Diels-Alder cycloaddition reactions. Examples include, but are not limited to, alkenes, alkynes, nitriles, enol ethers, and enamines.

As used herein, the term "light emitting device," as used herein, refers to a device that emits light when an electrical current is applied across two electrodes.

As used herein, the term "polymeric charge transfer layer," as used herein, refers to a polymeric material that can transport charge carrying moieties, either holes or electrons.

As used herein, the term "cross-linking monomer," as used herein, refers to an organic or inorganic molecule that can join adjacent chains of a polymer by creating covalent bonds.

As used herein, the term "hole transporting solution-processed layer," as used herein, refers to a hole transporting layer which can be processed by solution-based methods, such as spin-coating, inkjet printing, and screen printing.

As used herein, the term "hole injection solution-processed layer," as used herein, refers to a hole injection layer which can be processed by solution-based methods, such as spin-coating, inkjet printing, and screen printing.

As used herein, the term "emissive solution-processed layer," as used herein, refers to an emissive layer which can be processed by solution-based methods, such as spin-coating, inkjet printing, and screen printing.

As used herein, the term "electron transporting solution-processed layer," as used herein, refers to an electron transporting layer which can be processed by solution-based methods, such as spin-coating, inkjet printing, and screen printing.

As used herein, the term "solvent-borne organic material," as used herein, refers to an organic compound that is dissolved or suspended in a solvent, whereby the solvent can be made volatile and evaporated.

As used herein, the term "electronic device," as used herein, refers to a device which depends on the principles of electronics, and uses the manipulation of electron flow for its operation.

As used herein, the term "charge transporting film," as used herein, refers to a film whereby charge is transported, either intra- or inter-molecularly, between one or more molecules.

The term "hydrocarbyl," as used herein, refers to a chemical group containing only hydrogen and carbon atoms. As used herein, hydrocarbyl includes monovalent, divalent, or higher valent groups. The valency of a hydrocarbyl can be determined by the chemical structure of the molecule comprising the hydrocarbyl.

The term "substituted hydrocarbyl," as used herein, refers to a hydrocarbyl in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P(=O)R'$_2$, SiR'$_3$; where each R' is a $C_{30}$-$C_{100}$ hydrocarbyl group.

The term "heterohydrocarbyl," as used herein, refers to a chemical group containing hydrogen and carbon atoms, and wherein at least one carbon atom or CH group or CH2 group is substituted with a heteroatom or a chemical group containing at least one heteroatom. Heteroatoms include, but are not limited to, O, N, P and S. As used herein, heterohydrocarbyl includes monovalent, divalent or higher valent groups. The valency of the heterohydrocarbyl can be determined by the chemical structure of the molecule comprising the heterohydrocarbyl.

The term "substituted heterohydrocarbyl," as used herein, refers to a heterohydrocarbyl in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P(=O)R'$_2$, SiR'$_3$; where each R' is a $C_{30}$-$C_{100}$ hydrocarbyl group.

The term "aromatic moiety," as described herein, refers to an organic moiety derived from aromatic hydrocarbon by deleting at least one hydrogen atom therefrom. An aromatic moiety may be a monocyclic and/or fused ring system, each ring of which suitably contains from 4 to 7, preferably from 5 or 6 atoms. Structures wherein two or more aromatic moieties are combined through single bond(s) are also included. Specific examples include, but are not limited to, phenyl, naphthyl, biphenyl, anthryl, indenyl, fluorenyl, benzofluorenyl, phenanthryl, triphenylenyl, pyrenyl, perylenyl, chrysenyl, naphtacenyl, fluoranthenyl and the like, but are not restricted thereto. The naphthyl may be 1-naphthyl or 2-naphthyl, the anthryl may be 1-anthryl, 2-anthryl or 9-anthryl, and the fluorenyl may be any one of 1-fluorenyl, 2-fluorenyl, 3-fluorenyl, 4-fluorenyl and 9-fluorenyl. The valency of the aromatic moiety can be determined by the chemical structure of the molecule comprising the aromatic moiety.

The term "substituted aromatic moiety," as used herein, refers to an aromatic moiety in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P(=O)R'$_2$, SiR'$_3$; where each R' is a $C_{30}$-$C_{100}$ hydrocarbyl group.

The term "heteroaromatic moiety," as described herein, refers to an aromatic moiety, in which at least one carbon atom or CH group or CH$_2$ group is substituted with a heteroatom (for example, B, N, O, S, P(=O), Si and P) or a chemical group containing at least one heteroatom. The heteroaromatic moiety may be a 5- or 6-membered monocyclic heteroaryl, or a polycyclic heteroaryl which is fused with one or more benzene ring(s), and may be partially saturated. The structures having one or more heteroaromatic moieties bonded through a single bond are also included. Specific examples include, but are not limited to, monocyclic heteroaryl groups, such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl; polycyclic heteroaryl groups, such as benzofuranyl, fluoreno[4,3-b]benzofuranyl, benzothiophenyl, fluoreno[4,3-b]benzothiophenyl, isobenzofuranyl, benzimidazolyl, benzothiazolyl, benzisothiazolyl, benzisoxazolyl, benzoxazolyl, isoindolyl, indolyl, indazolyl, benzothiadiazolyl, quinolyl, isoquinolyl, cinnolinyl, quinazolinyl, quinoxalinyl, carbazolyl, phenanthridinyl and benzodioxolyl. The valency of the heteroaromatic moiety can be determined by the chemical structure of the molecule comprising the heteroaromatic moiety.

The term "substituted heteroaromatic moiety," as used herein, refers to a heteroaromatic moiety in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P(=O)R'$_2$, SiR'$_3$; where each R' is a $C_{30}$-$C_{100}$ hydrocarbyl group.

The term "aryl" as described herein, refers to an organic radical derived from aromatic hydrocarbon by deleting one hydrogen atom therefrom. An aryl group may be a monocyclic and/or fused ring system, each ring of which suitably contains from 4 to 7, preferably from 5 or 6 atoms. Structures wherein two or more aryl groups are combined through single bond(s) are also included. Specific examples include, but are not limited to, phenyl, naphthyl, biphenyl, anthryl, indenyl, fluorenyl, benzofluorenyl, phenanthryl, triphenylenyl, pyrenyl, perylenyl, chrysenyl, naphtacenyl, fluoranthenyl and the like, but are not restricted thereto. The naphthyl may be 1-naphthyl or 2-naphthyl, the anthryl may be 1-anthryl, 2-anthryl or 9-anthryl, and the fluorenyl may be any one of 1-fluorenyl, 2-fluorenyl, 3-fluorenyl, 4-fluorenyl and 9-fluorenyl.

The term "substituted aryl," as used herein, refers to an aryl in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P(=O)R'$_2$, SiR'$_3$; where each R' is a $C_1$-$C_{20}$ hydrocarbyl group.

The terms "heteroaryl" as described herein, refers to an aryl group, in which at least one carbon atom or CH group or CH$_2$ group is substituted with a heteroatom (for example, B, N, O, S, P(=O), Si and P) or a chemical group containing at least one heteroatom. The heteroaryl may be a 5- or 6-membered monocyclic heteroaryl or a polycyclic heteroaryl which is fused with one or more benzene ring(s), and may be partially saturated. The structures having one or more heteroaryl group(s) bonded through a single bond are also included. The heteroaryl groups may include divalent aryl groups of which the heteroatoms are oxidized or quarternized to form N-oxides, quaternary salts, or the like. Specific examples include, but are not limited to, monocyclic heteroaryl groups, such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl; polycyclic heteroaryl groups, such as benzofuranyl, fluoreno[4,3-b]benzofuranyl, benzothiophenyl, fluoreno[4,3-b]benzothiophenyl, isobenzofuranyl, benzimidazolyl, benzothiazolyl, benzisothiazolyl, benzisoxazolyl, benzoxazolyl, isoindolyl, indolyl, indazolyl, benzothia-diazolyl, quinolyl, isoquinolyl, cinnolinyl, quinazolinyl, quinoxalinyl, carbazolyl, phenanthridinyl and benzodioxolyl; and corresponding N-oxides (for example, pyridyl N-oxide, quinolyl N-oxide) and quaternary salts thereof.

The term "substituted heteroaryl," as used herein, refers to a heteroaryl in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P($=$O)R'$_2$, SiR'$_3$; where each R' is a $C_1$-$C_{20}$ hydrocarbyl group.

The term "polymer," as used herein, refers to a polymeric compound prepared by polymerizing monomers, whether of the same or a different type. The generic term polymer thus embraces the term homopolymer (employed to refer to polymers prepared from only one type of monomer, with the understanding that trace amounts of impurities can be incorporated into and/or within the polymer structure) and the term interpolymer as defined hereinafter.

The term "interpolymer," as used herein, refers to polymers prepared by the polymerization of at least two different types of monomers. The generic term interpolymer thus includes copolymers (employed to refer to polymers prepared from two different types of monomers), and polymers prepared from more than two different types of monomers.

EXPERIMENTAL

Reagents and Test Methods

All solvents and reagents were obtained from commercial vendors (for example, Sigma-Aldrich, TCI, and Alfa Aesar) and were used in the highest available purities, and/or when necessary, recrystallized before use. Dry solvents were obtained from in-house purification/dispensing system (hexane, toluene, and tetrahydrofuran), or purchased from Sigma-Aldrich. All experiments involving "water sensitive compounds" were conducted in "oven dried" glassware, under nitrogen atmosphere, or in a glovebox. Reactions were monitored by analytical, thin-layer chromatography (TLC) on precoated aluminum plates (VWR 60 F254), and visualized by UV light and/or potassium permanganate staining. Flash chromatography was performed on an ISCO COMBIFLASH system with GRACERESOLV cartridges.

$^1$H-NMR-spectra (500 MHz or 400 MHz) were obtained on a Varian VNMRS-500 or VNMRS-400 spectrometer, at 30° C., unless otherwise noted. The chemical shifts were referenced to TMS ($\delta$=0.00) in CDCl$_3$.

$^{13}$C-NMR spectra (125 MHz or 100 MHz) were obtained on a Varian VNMRS-500 or VNRMS-400 spectrometer, and referenced to TMS ($\delta$=0.00) in CDCl$_3$.

Routine LC/MS studies were carried out as follows. Five microliter aliquots of the sample, as "3 mg/ml solution in THF," were injected on an AGILENT 1200SL binary gradient, liquid chromatography, coupled to an AGILENT 6520 QTof, quadruple-time of flight MS system, via a dual spray electrospray (ESI) interface, operating in the PI mode. The following analysis conditions were used: column: 150×4.6 mm ID, 3.5 μm ZORBAX SB-C8; column temperature: 40° C.; mobile phase: 75/25 A/B to 15/85 A/B at 40 minutes; solvent A=0.1 v % formic acid in water; solvent B=THF; flow 1.0 mL/min; UV detection: diode array 210 to 600 nm (extracted wavelength 250,280 nm); ESI conditions: gas temperature 365° C.; gas flow—8 ml/min; capillary—3.5 kV; nebulizer—40 PSI; fragmentor—145V.

DSC was done using a 2000 instrument at a scan rate of 10° C./min, and in a nitrogen atmosphere for all cycles. The sample (about 7-10 mg) was scanned from room temperature to 300° C., cooled to −60° C., and reheated to 300° C. The glass transition temperature ($T_g$) was measured on the second heating scan. Data analysis was performed using TA Universal Analysis software. The $T_g$ was calculated using the "mid-point of inflection" methodology.

MALDI-TOF Measurements: All samples were analyzed using a Bruker UltrafleXtreme MALDI-TOF/TOF MS (Bruker Daltronics Inc., Billerica, Mass.), equipped with a 355-nm Nd:YAG laser. Spectra were obtained in the positive ion reflection mode, with a mass resolution greater than 20,000 full-width, at half-maximum height (fwhm). The isotopic resolution was observed throughout the entire mass range detected; and the laser intensity was set approximately 10% greater than threshold. Instrument voltages were optimized for each spectrum to achieve the best signal-to-noise ratio. External mass calibration was performed using protein standards (Peptide Mix II) from a Peptide Mass Standard Kit (Bruker Daltronics), and a seven-point calibration method using Bradykinin (clip 1-7) (m=757.40 Da), Angiotensin II (m=1046.54 Da), Angiotensin I (m=1296.68 Da), Substance P (m=1347.74 Da), ACTH (clip 1-17) (m=2093.09 Da), ACTH (clip 18-39) (m=2465.20 Da), and Somatostatin 28 (m=3147.47 Da), to yield monoisotopic mass accuracy better than Δm=+0.05 Da. The instrument was calibrated before each measurement to ensure constant experimental conditions.

Polymer samples were prepared using the evaporation-grinding method, in which a 2 mg sample of polymer was ground to a fine powder with 60 μL of distilled tetrahydrofuran (THF, Fisher), in an agate mortar and pestle. The molar ratios of matrix:NaTFA:polymer were 25:1:1. The mixture was then ground a second time to ensure homogeneity. A sample of the mixture was then pressed into a sample well, by spatula, on the MALDI sample plate. MS and MS/MS data were processed using Polymerix 2.0 software supplied by Sierra Analytics (Modesto, Calif.).

Synthesis of 1,3-bis(bicyclo[4.2.0]octa-1(6),2,4-trien-7-yloxy)-5-iodobenzene

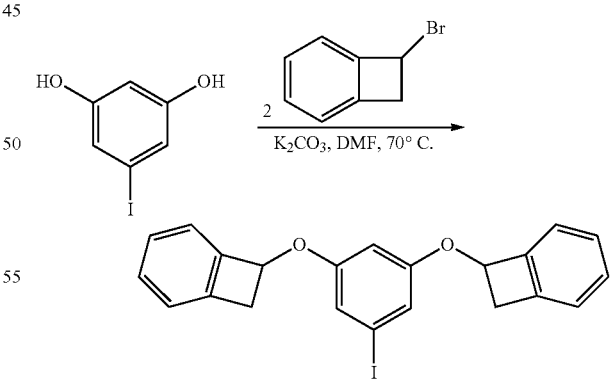

To a flask, charged with 3-iodoresorcinol (1 equiv) and K$_2$CO$_3$ (4 equiv), was added DMF. The solution was stirred at room temperature and 7-bromobicyclo[4.2.0]octa-1,3,5-triene (2.5 equiv) was added dropwise as a DMF solution. The mixture was heated to 70° C. for two days. After cooling to room temperature, the mixture was poured into water (100 mL), and extracted several times with diethyl ether. The organic fractions were collected, washed with brine, and dried with MgSO₄. The organic fraction was filtered, and the solvent removed to provide a yellow oil. After recrystallization from methanol, a pale yellow solid was recovered; this was identified by NMR spectroscopy and consistent with the formation of the product.

Synthesis of N-([1,1'-biphenyl]-4-yl)-N-(4-bromophenyl)-9,9-dimethyl-9H-fluoren-2-amine

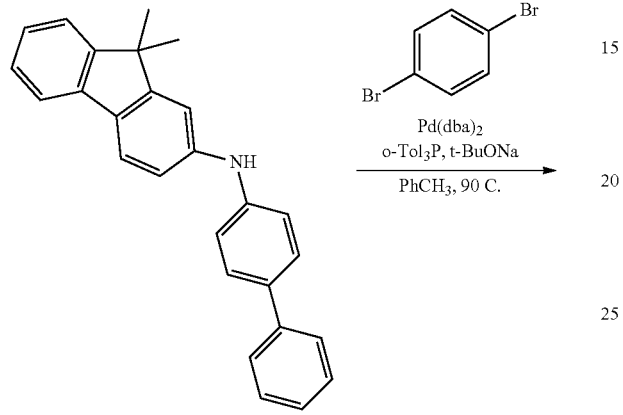

To a flask, charged with N-([1,1'-biphenyl]-4-yl)-9,9-dimethyl-9H-fluoren-2-amine (1.0 equiv), 1,4-dibromobenzene (2.0 equiv), Pd2dba3 (0.02 equiv), tri-ortho-toluyl phosphine (0.06 equiv) and sodium tert-butoxide (2.0 equiv), was added toluene. The mixture was heated to reflux for 18 hours. The reaction was cooled to 25° C., and washed with water and brine. The organic phase was dried over MgSO₄, and concentrated. The resulting residue was purified via silica gel column, to afford the desired product as a white solid.

Synthesis of 3-bromo-9H-carbazole

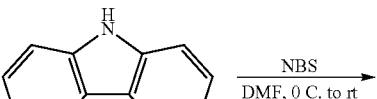

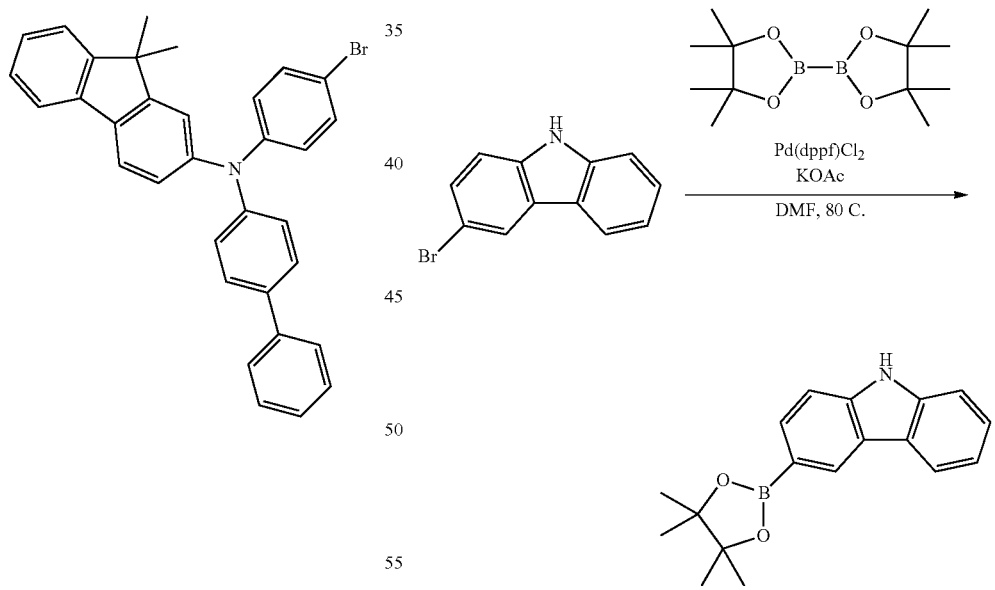

The compound was synthesized using a previously published procedure described in Midya et al. *Chem. Commun.* 2010, 46, 2091, incorporated herein by reference.

Synthesis of 3-(4,4,5,5-tetramethyl-1,3,2-dioxaborolan-2-yl)-9H-carbazole

The compound was synthesized using a previously published procedure described in U.S. Patent Publication US2005/0137204 A1, incorporated herein by reference.

Synthesis of N-(4-(9H-carbazol-3-yl)phenyl)-N-([1,1'-biphenyl]-4-yl)-9,9-dimethyl-9H-fluoren-2-amine

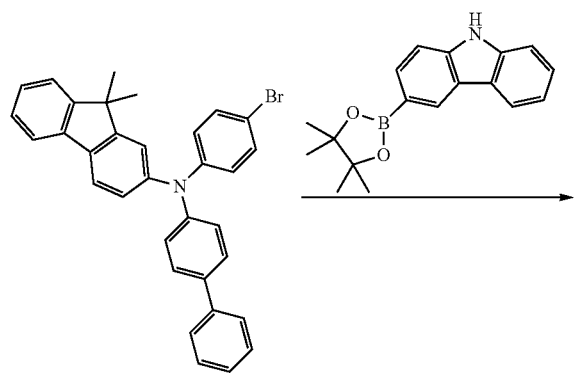

To a flask charged with N-([1,1'-biphenyl]-4-yl)-N-(4-bromophenyl)-9,9-dimethyl-9H-fluoren-2-amine (1.2 equiv) and palladium tetrakis(triphenylphsophine) (0.03 equiv), in toluene (0.2 M), under $N_2$, was added 3-(4,4,5,5-tetramethyl-1,3,2-dioxaborolan-2-yl)-9H-carbazole (1.0 equiv), in ethanol (0.17 M), and an aqueous potassium carbonate solution (4.0 equiv, 2.0 M). The mixture was heated to 90° C. for 12 hours. The reaction was cooled to 25° C., and concentrated under vacuum. The resulting residue was diluted into methylene chloride, and washed with water. The organic phase was dried over $Na_2SO_4$, and concentrated. The resulting residue was purified via silica gel chromatography to afford the desired product as a white solid.

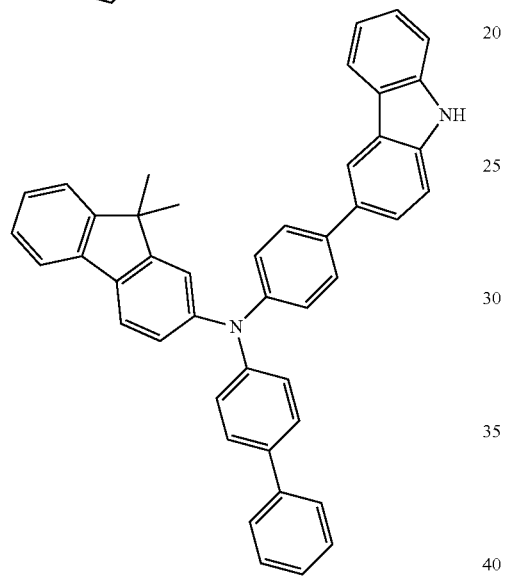

Synthesis of N-([1,1'-biphenyl]-4-yl)-N-(4-(9-(3,5-bis(bicyclo[4.2.0]octa-1(6),2,4-trien-7-yloxy)phenyl)-9H-carbazol-3-yl)phenyl)-9,9-dimethyl-9H-fluoren-2-amine

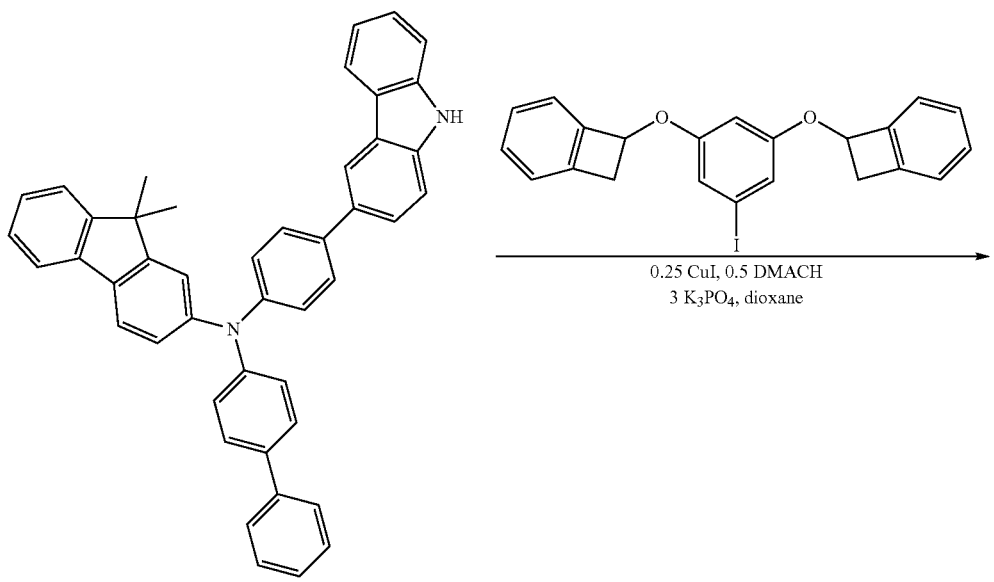

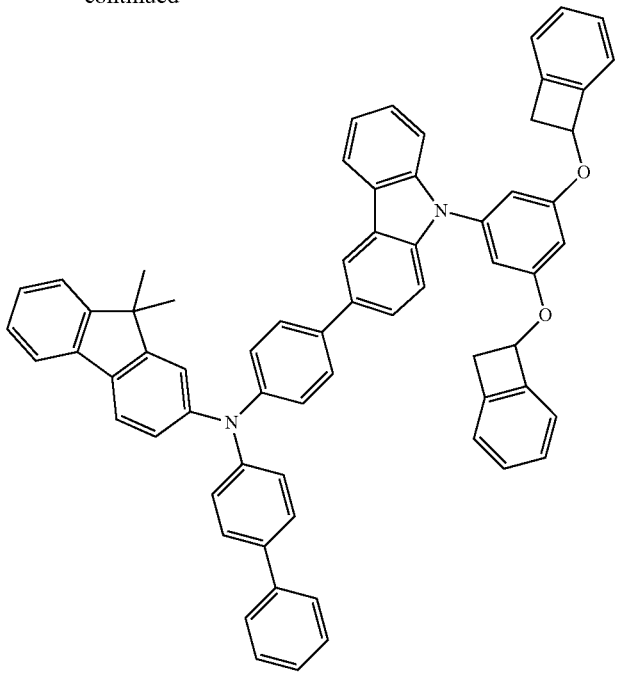

To a flask charged with N-(4-(9H-carbazol-3-yl)phenyl)-N-([1,1'-biphenyl]-4-yl)-9,9-dimethyl-9H-fluoren-2-amine (1 equiv), 1,3-bis(bicyclo[4.2.0]octa-1(6),2,4-trien-7-yloxy)-5-iodobenzene (1.1 equiv), copper iodide (0.25 equiv), and $K_3PO_4$ (3 equiv) was added dioxane. The mixture was stirred for five minutes, and N,N'-dimethylcyclohexane-1,2-diamine (0.5 equiv) added dropwise to the stirring mixture. The mixture was heated to 70° C. for two days. After cooling to room temperature, the solvent was removed by rotary evaporation and extracted with $CH_2Cl_2$ and water. The aqueous volume was further extracted with $CH_2Cl_2$ twice. The organic fractions were combined, washed with brine, and dried with $MgSO_4$. The organic fractions were filtered, and the solvent removed to yield the crude product. The resulting residue was purified via silica gel chromatography to afford the desired product as a white solid HTL-SP-8.

Synthesis of N-([1,1'-biphenyl]-4-yl)-9,9-dimethyl-N-phenyl-9H-fluoren-2-amine

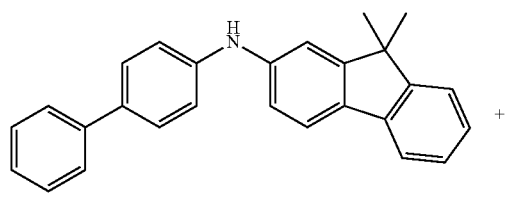

+

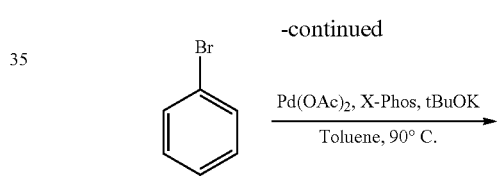

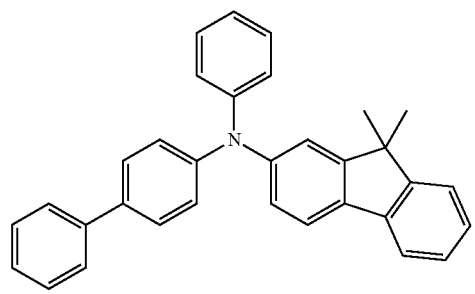

N-([1,1'-biphenyl]-4-yl)-9,9-dimethyl-9H-fluoren-2-amine (40.0 g, 110 mmol), bromobenzene (23.4 g, 150 mmol), $Pd(OAc)_2$ (616 mg, 2.75 mmol), X-Phos (1.57 g, 3.3 mmol), tBuOK (24.6 g, 220 mmol) were added into a 250 mL, three-necked round-bottom flask, equipped with a reflux condenser. After addition of 250 mL dry toluene under $N_2$ atmosphere, the suspension was heated to 90° C., and stirred overnight under a flow of $N_2$.

After cooling to room temperature, water was added, and the organic layer was separated. The solvent was evaporated under vacuum, and the residue was used for the next step without further purification (yield: 95%). MS (ESI): 437.02 $[M+H]^+$.

Synthesis of N-([1,1'-biphenyl]-4-yl)-N-(4-bromophenyl)-9,9-dimethyl-9H-fluoren-2-amine

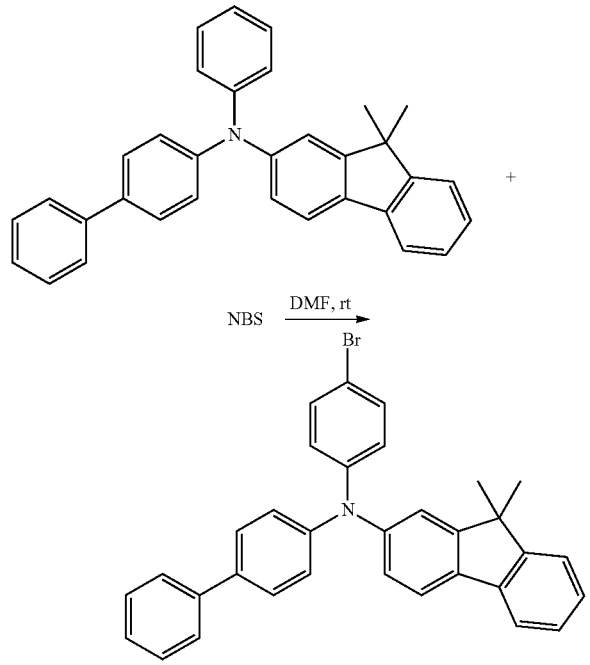

To a solution of N-([1,1'-biphenyl]-4-yl)-9,9-dimethyl-N-phenyl-9H-fluoren-2-amine (1) (35.0 g, 80 mmol) in 150 mL DMF, N-bromosuccinimide (NBS) (16.02 g, 90 mmol), in 100 mL, DMF was added dropwise in 30 minutes. After this addition, the mixture was stirred at room temperature for 12 hours, and then poured into water to precipitate a solid. The solid was filtered, and recrystallized from dichloromethane and ethanol to give white solid (yield: 92%). MS (ESI): 516.12 [M+H]$^+$.

Synthesis of 7-([1,1'-biphenyl]-4-yl(4-bromophenyl)amino)-9,9-dimethyl-9H-fluorene-2-carbaldehyde

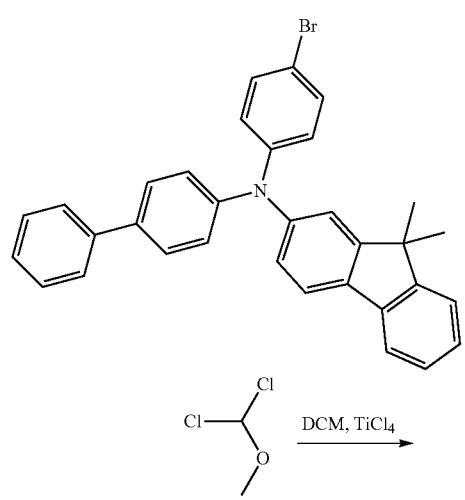

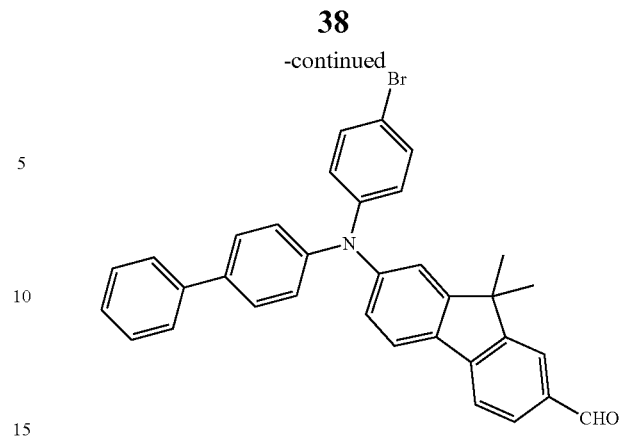

To a solution of 7-([1,1'-biphenyl]-4-yl(4-bromophenyl)amino)-9,9-dimethyl-9H-fluorene-2-carbaldehyde (25.8 g, 50 mmol) in 100 mL CH$_2$Cl$_2$ at 0° C., TiCl$_4$ (54.6 mL, 500 mmol) diluted with 100 mL CH$_2$Cl$_2$, was added in 30 minutes. The mixture was stirred for an additional 30 minutes at 0° C. Then, CH$_3$OCHCl$_2$ (27.0 mL, 300 mmol) in 200 mL of CH$_2$Cl$_2$ was added dropwise in 30 minutes. The dark-green solution was stirred for another one hour at 0° C. After completion, water, with crushed ice, was slowly added to quench the reaction. The organic layer was separated, and washed consecutively with saturated sodium bicarbonate solution, brine, and dried over anhydrous sodium sulphate. After filtration, the solvent was removed under vacuum, and the residue was purified through column chromatography to give crude product (yield: 55%). MS (ESI): 544.12 [M+H]+.

Synthesis of 4-(9H-carbazol-9-yl)benzaldehyde

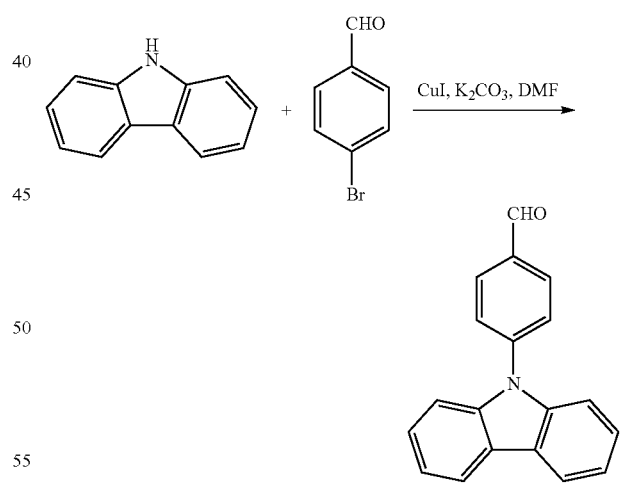

A mixture of 9H-carbazole (9.53 g, 57 mmol), 4-bromobenzaldehyde (21.1 g, 114 mmol), copper(I) iodide (1.80 g, 9.4 mmol), K$_2$CO$_3$ (11.8 g, 86 mmol) in 60 mL dry DMF, was heated to 140° C., under nitrogen atmosphere, for 12 hours. After cooling to room temperature, the inorganic solid was filtered, and the residue was poured into ice water to precipitate. The so-formed solid was collected, and washed by water, ethanol several times, then crystallized from CH$_2$Cl$_2$ and ethanol, to give light-yellow solid (yield: 95%). MS (ESI): 272.10 [M+H]$^+$.

Synthesis of 4-(3-bromo-9H-carbazol-9-yl)benzaldehyde

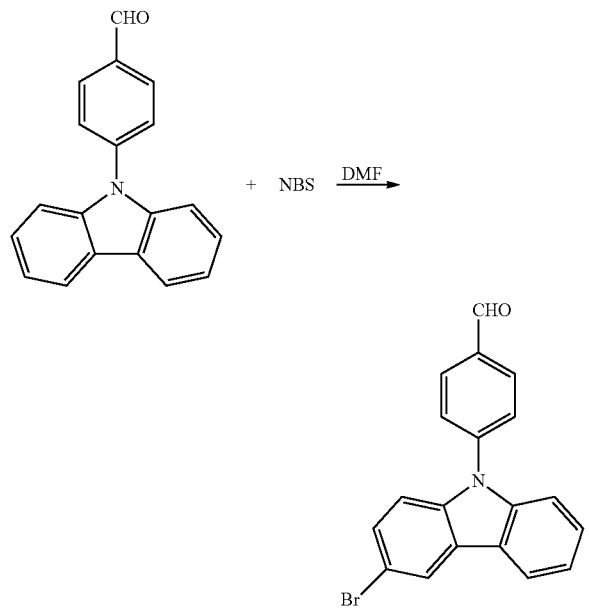

To a solution of 4-(9H-carbazol-9-yl)benzaldehyde (26.6 g, 98 mmol) in 100 mL DMF, NBS (17.4 g, 98 mmol), in 100 mL DMF, was added dropwise in 30 minutes. After addition, the mixture was stirred at room temperature for 12 hours. The solution was poured into ice water to precipitate the product. After filtration, the solid was collected, and washed by water, ethanol several times, then dried under vacuum, and used for the next step without further purification (yield: 96%). MS (ESI): 350.01 [M+H]$^+$.

Synthesis of 4-(3-(4,4,5,5-tetramethyl-1,3,2-dioxaborolan-2-yl)-9H-carbazol-9-yl)benzaldehyde

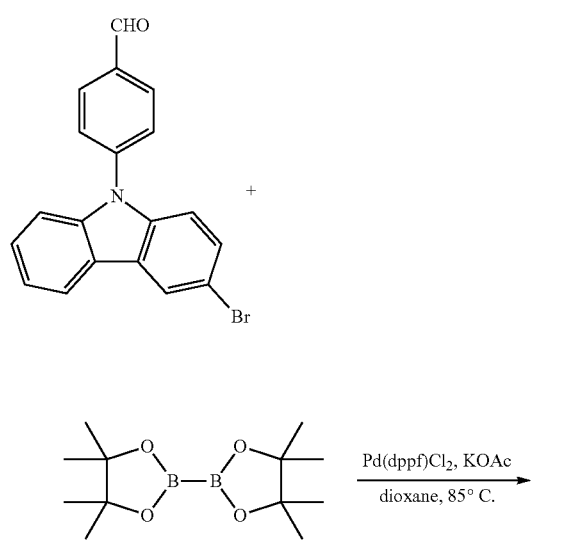

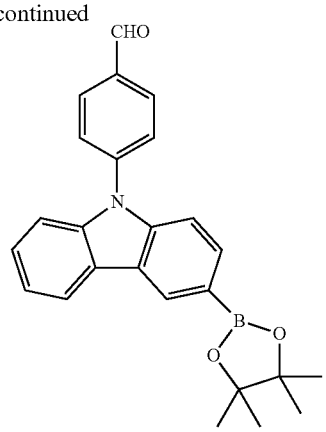

A mixture of 3-bromo-9-(4-formylphenyl)-9H-carbazole (10.51 g, 30 mmol), 4,4,4',4',5,5,5',5'-octamethyl-2,2'-bi(1,3,2-dioxaborolane) (9.14 g, 36 mmol, 253), Pd(dppf)$_2$Cl$_2$ (571 mg, 0.75 mmol), CH$_3$COOK (4.41 g, 45 mmol), and 60 mL of dry dioxane, was heated at 85° C., under nitrogen atmosphere, for 12 hours. After cooling to room temperature, the solvent was removed under vacuum, and then water was added. The mixture was extracted with CH$_2$Cl$_2$. The organic layer was collected, and dried over anhydrous sodium sulphate. After filtration, the filtrate was evaporated to remove solvent, and the residue was purified through column chromatography on silica gel, to give white solid (yield: 84%). MS (ESI): 398.16 [M+H]$^+$.

Synthesis of 7-([1,1'-biphenyl]-4-yl(4-(9-(4-formylphenyl)-9H-carbazol-3-yl)phenyl)amino)-9,9-dimethyl-9H-fluorene-2-carbaldehyde

42

Synthesis of N-([1,1'-biphenyl]-4-yl)-9,9-dimethyl-6-vinyl-N-(4-(9-(4-vinylphenyl)-9H-carbazol-3-yl)phenyl)-9H-fluoren-2-amine

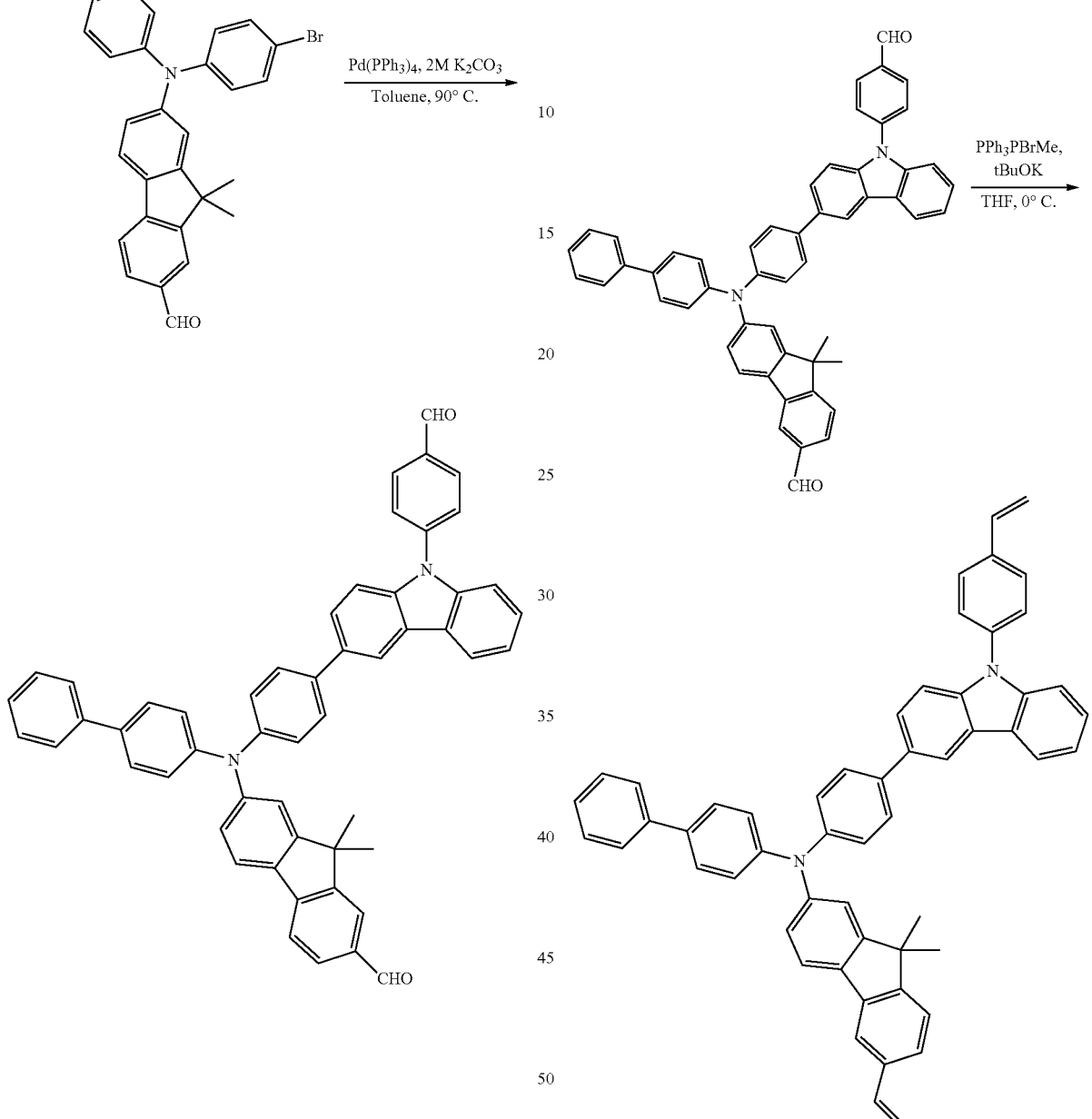

A mixture of 4-(3-(4,4,5,5-tetramethyl-1,3,2-dioxaborolan-2-yl)-9H-carbazol-9-yl)benzaldehyde (0.7 g, 1.76 mmol), 7-([1,1'-biphenyl]-4-yl(4-bromophenyl)amino)-9,9-dimethyl-9H-fluorene-2-carbaldehyde (0.8 g, 1.47 mmol), Pd(PPh₃)₄ (76 mg, 0.064 mmol), 2M K₂CO₃ (0.8 g, 6 mmol, 3 mL H₂O), 3 mL ethanol and 3 mL of toluene, was heated at 90° C., under nitrogen atmosphere, for 12 hours. After cooling to room temperature, the solvent was removed under vacuum, and the residue was dissolved with CH₂Cl₂. The organic layer was washed with water, and then dried over anhydrous sodium sulphate. After filtration, the filtrate was evaporated to remove solvent, and the residue was purified through column chromatography on silica gel, to give white solid (yield: 85%). MS (ESI): 735.29 [M+H]⁺.

To a solution of Ph₃PBrMe (1.428 g, 4 mmol) in 10 mL THF at 0° C., tBuOK (672 mg, 6 mmol) was added, under nitrogen atmosphere. After stirring for 30 minutes, a solution of the dialdehyde compound 7-([1,1'-biphenyl]-4-yl(4-(9-(4-formylphenyl)-9H-carbazol-3-yl)phenyl)amino)-9,9-dimethyl-9H-fluorene-3-carbaldehyde (734 mg, 1 mmol) in 10 mL THF, was added to the above mixture. Then, the solution was allowed to stir at room temperature for 12 hours. After quenching with water, the solvent was removed under vacuum, and the residue was dissolved with CH₂Cl₂. The organic layer was washed with water, and then dried over anhydrous sodium sulphate. After filtration, the filtrate was evaporated to remove solvent, and the residue was purified through column chromatography on silica gel, to give white solid HTL-SP-3 (yield: 85%). MS (ESI): 731.34 [M+H]+.

Synthesis of (7-([1,1'-biphenyl]-4-yl(4-(9-(4-(hydroxymethyl)phenyl)-9H-carbazol-3-yl)phenyl)amino)-9,9-dimethyl-9H-fluoren-3-yl)methanol Synthesis of N-([1,1'-biphenyl]-4-yl)-9,9-dimethyl-6-4(4-vinylbenzyl)oxy)methyl)-N-(4-(9-(4-4(4-vinylbenzyl)oxy)methyl)phenyl)-9H-carbazol-3-yl)phenyl)-9H-fluoren-2-amine

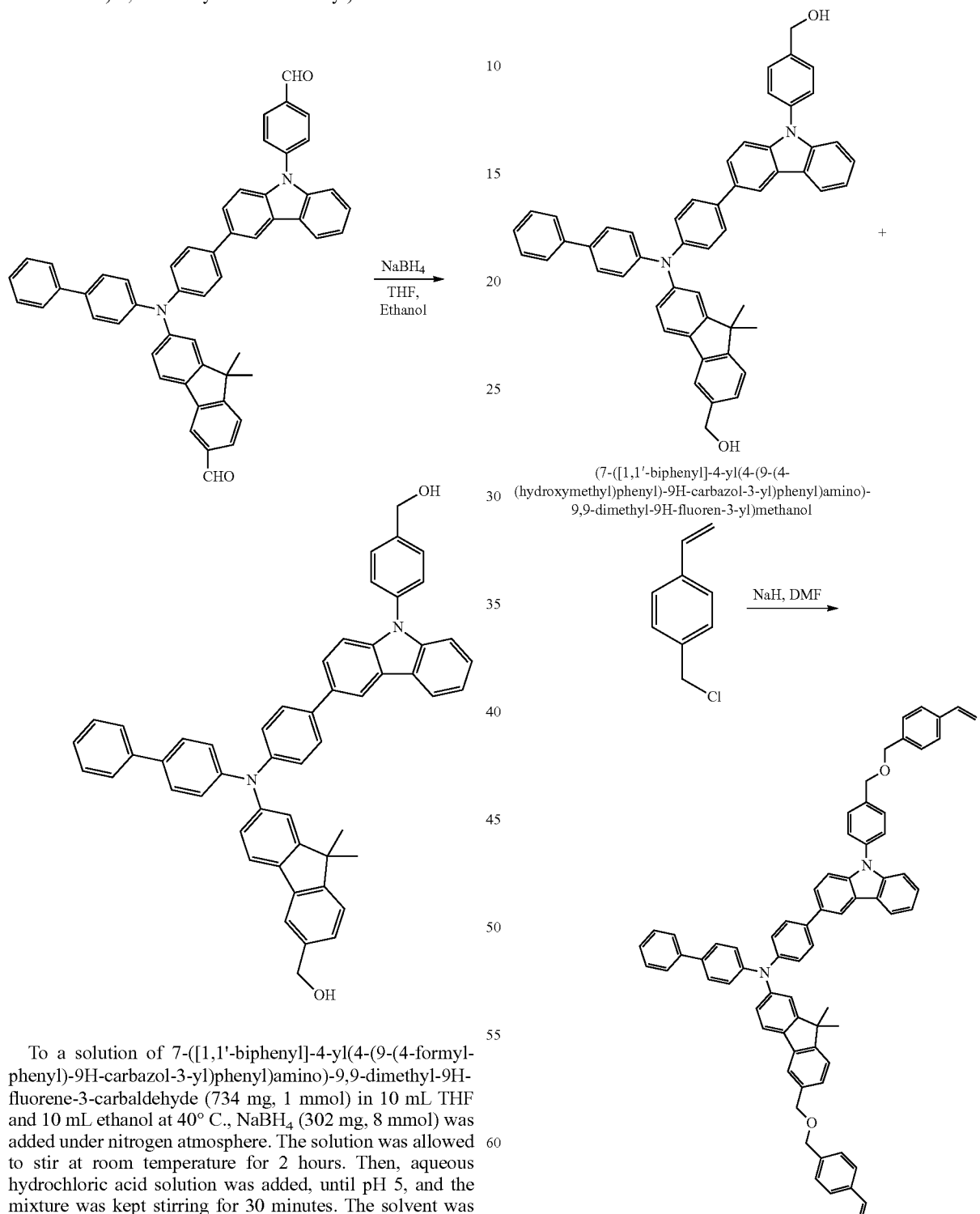

To a solution of 7-([1,1'-biphenyl]-4-yl(4-(9-(4-formylphenyl)-9H-carbazol-3-yl)phenyl)amino)-9,9-dimethyl-9H-fluorene-3-carbaldehyde (734 mg, 1 mmol) in 10 mL THF and 10 mL ethanol at 40° C., NaBH4 (302 mg, 8 mmol) was added under nitrogen atmosphere. The solution was allowed to stir at room temperature for 2 hours. Then, aqueous hydrochloric acid solution was added, until pH 5, and the mixture was kept stirring for 30 minutes. The solvent was removed under vacuum, and the residue was extracted with dichloromethane. The product was then dried under vacuum, and used for the next step, without further purification. MS (ESI): 739.32 [M+H]+.

To a solution of (7-([1,1'-biphenyl]-4-yl(4-(9-(4-(hydroxymethyl)phenyl)-9H-carbazol-3-yl)phenyl)amino)-9,9- dimethyl-9H-fluoren-3-yl)methanol (3.69 g, 5 mmol), in 50 mL dry DMF, was added, NaH (432 mg, 18 mmol), then the mixture was stirred at room temperature for 1 hour. Then, 4-vinylbenzyl chloride (2.11 mL, 2.29 g, 15 mmol) was added to above solution, via a syringe. The mixture was heated to 60° C. for 24 hours. After a quench with water, the mixture was poured into water to remove DMF. The residue was filtered, and the resulting solid was dissolved with dichloromethane, which was then washed with water. The solvent was removed under vacuum, and the residue was extracted with dichloromethane. The product was then obtained by column chromatography on silica gel, to give light-yellow solid HTL-SP-4 (yield: 75%). MS (ESI): 971.45 [M+H]$^+$.

Synthesis of 7-([1,1'-biphenyl]-4-yl(4-bromophenyl)amino)-9,9-dimethyl-9H-fluorene-2-carbaldehyde

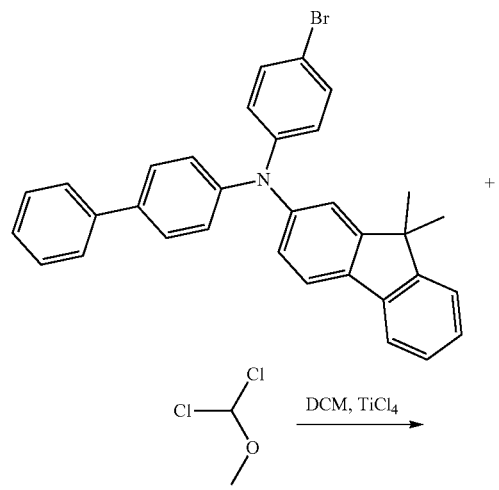

To a solution of 7-([1,1'-biphenyl]-4-yl(4-bromophenyl)amino)-9,9-dimethyl-9H-fluorene-2-carbaldehyde (25.8 g, 50 mmol) in 100 mL CH$_2$Cl$_2$ at 0° C., TiCl$_4$ (54.6 mL, 500 mmol), diluted with 100 mL CH$_2$Cl$_2$, was added in 30 minutes. The mixture was stirred for an additional 30 minutes at 0° C. Then, CH$_3$OCHCl$_2$ (27.0 mL, 300 mmol), in 200 mL of CH$_2$Cl$_2$, was added dropwise in 30 minutes. The dark-green solution was stirred for another one hour at 0° C. After completion, water, with crushed ice, was slowly added, to quench the reaction. The organic layer was separated, and washed consecutively with saturated sodium bicarbonate solution, brine, and dried over anhydrous sodium sulphate. After filtration, the solvent was removed under vacuum, and the residue was purified through column chromatography, to give crude product (yield: 55%). MS (ESI): 544.12 [M+H]$^+$.

Synthesis of 4-(9H-carbazol-9-yl)benzaldehyde

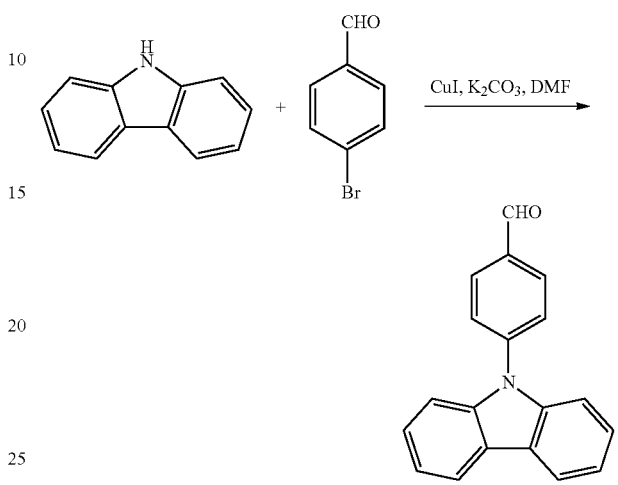

A mixture of 9H-carbazole (9.53 g, 57 mmol), 4-bromobenzaldehyde (21.1 g, 114 mmol), copper(I) iodide (1.80 g, 9.4 mmol), K$_2$CO$_3$ (11.8 g, 86 mmol) in 60 mL dry DMF was heated to 140° C., under nitrogen atmosphere, for 12 hours. After cooling to room temperature, the inorganic solid was filtered, and the residue was poured into ice water to precipitate. The so-formed solid was collected, and washed by water, ethanol several times, then crystallized from CH$_2$Cl$_2$ and ethanol to give light-yellow solid (yield: 95%). MS (ESI): 272.10 [M+H]$^+$.

Synthesis of 4-(3-bromo-9H-carbazol-9-yl)benzaldehyde

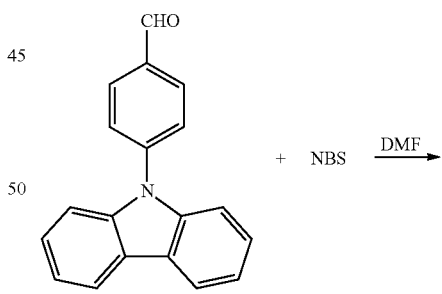

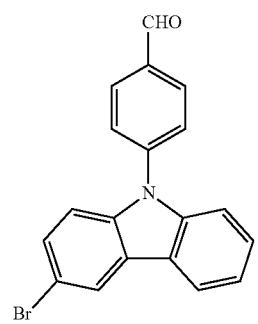

To a solution of 4-(9H-carbazol-9-yl)benzaldehyde (26.6 g, 98 mmol) in 100 mL DMF, NBS (17.4 g, 98 mmol) in 100 mL DMF, was added dropwise in 30 minutes. After addition, the mixture was stirred at room temperature for 12 hours. The solution was poured into ice water to precipitate the product. After filtration, the solid was collected, and washed by water, ethanol several times, then dried under vacuum, and used for the next step without further purification (yield: 96%). MS (ESI): 350.01 [M+H]$^+$.

Synthesis of 4-(3-(4,4,5,5-tetramethyl-1,3,2-dioxaborolan-2-yl)-9H-carbazol-9-yl)benzaldehyde A mixture of 3-bromo-9-(4-formylphenyl)-9H-carbazole (10.51 g, 30 mmol), 4,4,4',4',5,5,5',5'-octamethyl-2,2'-bi(1,3,2-dioxaborolane) (9.14 g, 36 mmol, 253), Pd(dppf)$_2$Cl$_2$ (571 mg, 0.75 mmol), CH$_3$COOK (4.41 g, 45 mmol), and 60 mL of dry dioxane was heated at 85° C., under nitrogen atmosphere, for 12 hours. After cooling to room temperature, the solvent was removed under vacuum, and then water was added. The mixture was extracted with CH$_2$Cl$_2$. The organic layer was collected, and dried over anhydrous sodium sulphate. After filtration, the filtrate was evaporated to remove solvent, and the residue was purified through column chromatography on silica gel, to give white solid (yield: 84%). MS (ESI): 398.16 [M+H]$^+$.

Synthesis of 7-([1,1'-biphenyl]-4-yl(4-(9-(4-formylphenyl)-9H-carbazol-3-yl)phenyl)amino)-9,9-dimethyl-9H-fluorene-2-carbaldehyde

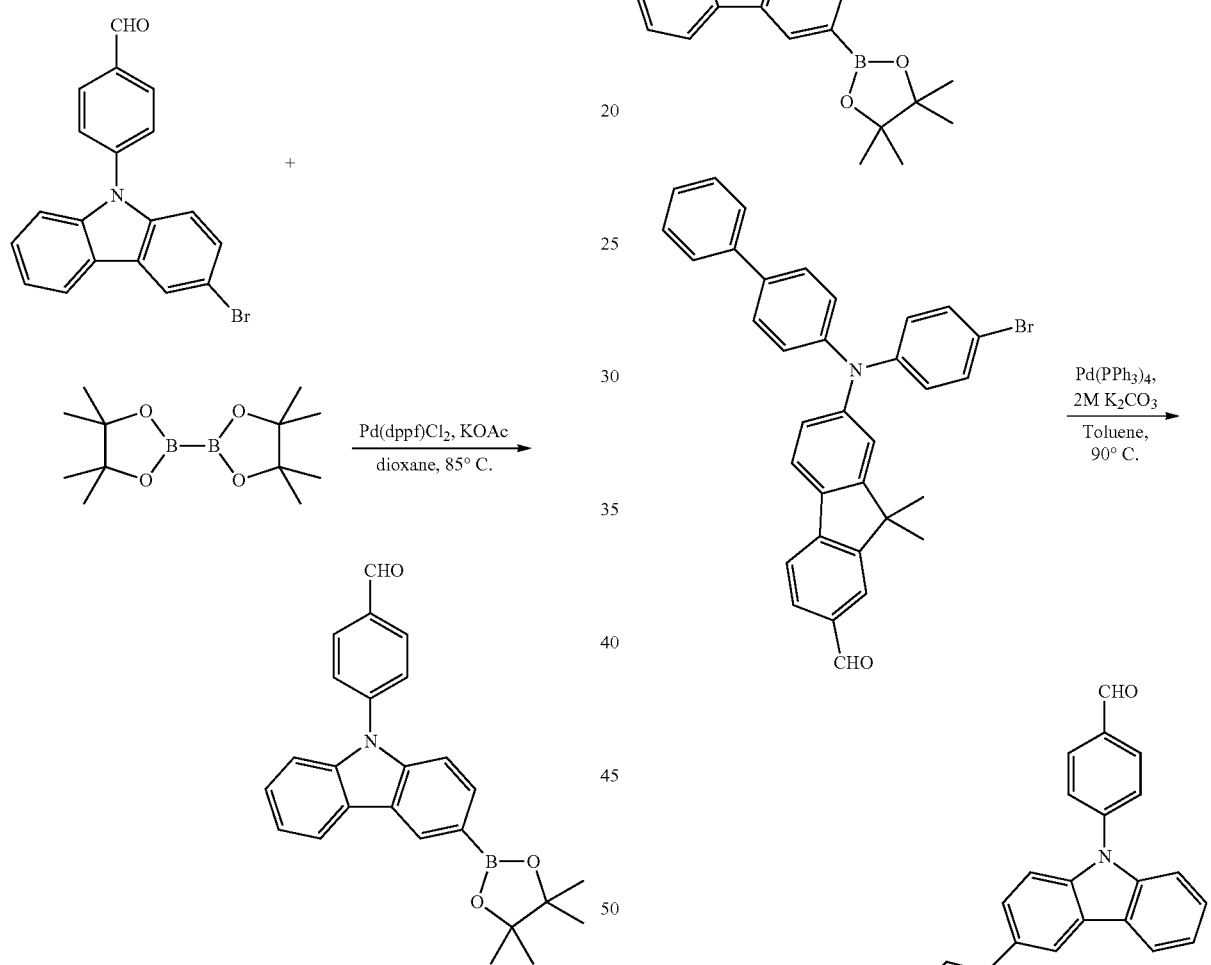

A mixture of 4-(3-(4,4,5,5-tetramethyl-1,3,2-dioxaborolan-2-yl)-9H-carbazol-9-yl)benzaldehyde (0.7 g, 1.76 mmol), 7-([1,1'-biphenyl]-4-yl(4-bromophenyl)amino)-9,9-dimethyl-9H-fluorene-2-carbaldehyde (0.8 g, 1.47 mmol), Pd(PPh$_3$)$_4$ (76 mg, 0.064 mmol), 2M K$_2$CO$_3$ (0.8 g, 6 mmol, 3 mL H$_2$O), 3 mL ethanol and 3 mL of toluene was heated at 90° C., under nitrogen atmosphere, for 12 hours. After cooling to room temperature, the solvent was removed under vacuum, and the residue was dissolved with CH$_2$Cl$_2$. The organic layer was washed with water, and then dried over anhydrous sodium sulphate. After filtration, the filtrate was evaporated to remove solvent, and the residue was purified through column chromatography on silica gel, to give white solid (yield: 85%). MS (ESI): 735.29 [M+H]$^+$.

Synthesis of N-([1,1'-biphenyl]-4-yl)-9,9-dimethyl-6-vinyl-N-(4-(9-(4-vinylphenyl)-9H-carbazol-3-yl)phenyl)-9H-fluoren-2-amine To a solution of Ph$_3$PBrMe (1.428 g, 4 mmol) in 10 mL THF at 0° C., tBuOK (672 mg, 6 mmol) was added, under nitrogen atmosphere. After stirring for 30 minutes, a solution of the dialdehyde compound 7-([1,1'-biphenyl]-4-yl(4-(9-(4-formylphenyl)-9H-carbazol-3-yl)phenyl)amino)-9,9-dimethyl-9H-fluorene-3-carbaldehyde (734 mg, 1 mmol) in 10 mL THF, was added to the above mixture. Then, the solution was allowed to stir at room temperature for 12 hours. After quenching with water, the solvent was removed under vacuum, and the residue was dissolved with CH$_2$Cl$_2$. The organic layer was washed with water, and then dried over anhydrous sodium sulphate. After filtration, the filtrate was evaporated to remove solvent, and the residue was purified through column chromatography on silica gel, to give white solid HTL-SP-3 (yield: 85%). MS (ESI): 731.34 [M+H]$^+$.

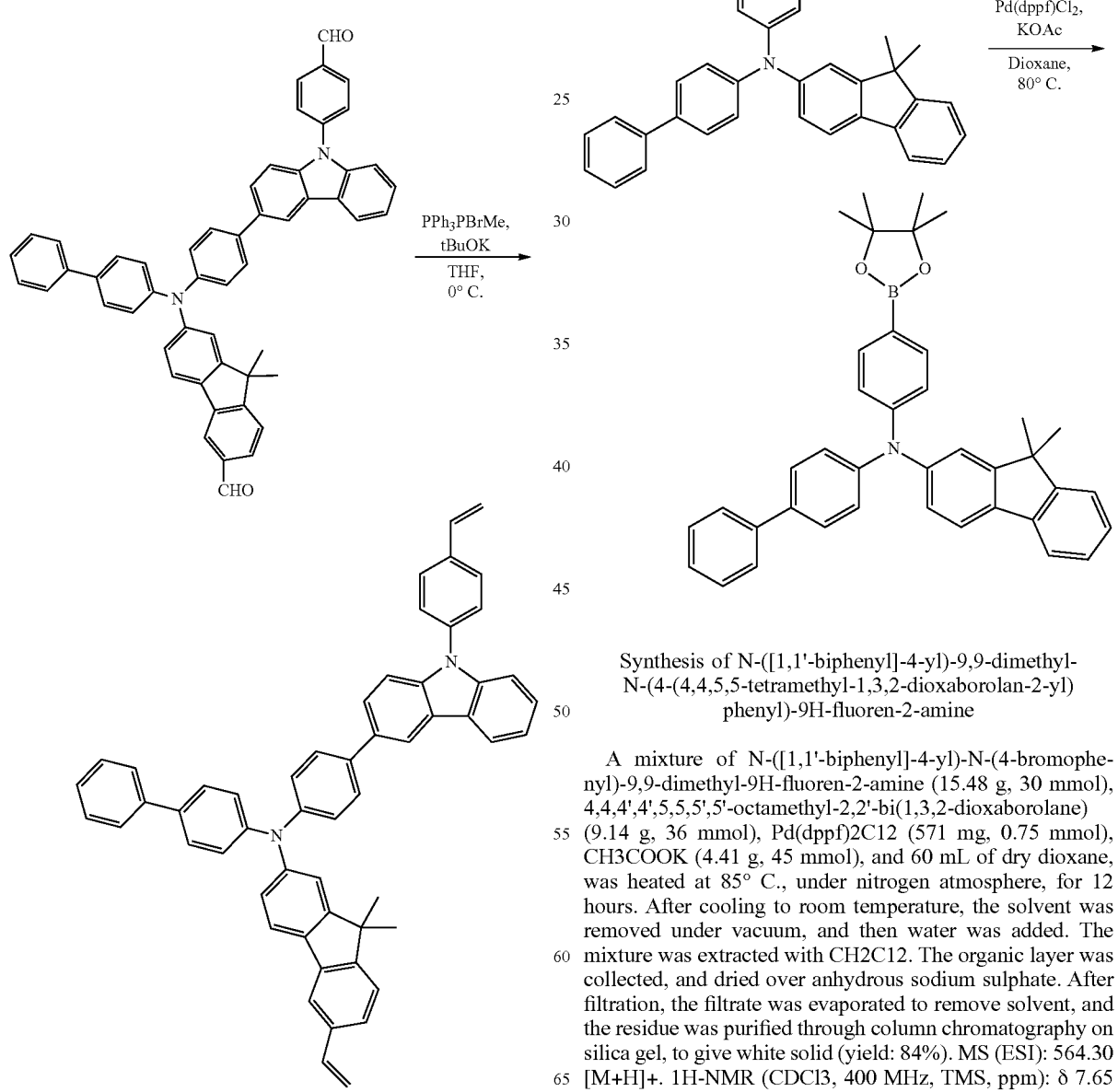

Synthesis of N-([1,1'-biphenyl]-4-yl)-9,9-dimethyl-N-(4-(4,4,5,5-tetramethyl-1,3,2-dioxaborolan-2-yl)phenyl)-9H-fluoren-2-amine A mixture of N-([1,1'-biphenyl]-4-yl)-N-(4-bromophenyl)-9,9-dimethyl-9H-fluoren-2-amine (15.48 g, 30 mmol), 4,4,4',4',5,5,5',5'-octamethyl-2,2'-bi(1,3,2-dioxaborolane) (9.14 g, 36 mmol), Pd(dppf)2C12 (571 mg, 0.75 mmol), CH3COOK (4.41 g, 45 mmol), and 60 mL of dry dioxane, was heated at 85° C., under nitrogen atmosphere, for 12 hours. After cooling to room temperature, the solvent was removed under vacuum, and then water was added. The mixture was extracted with CH2C12. The organic layer was collected, and dried over anhydrous sodium sulphate. After filtration, the filtrate was evaporated to remove solvent, and the residue was purified through column chromatography on silica gel, to give white solid (yield: 84%). MS (ESI): 564.30 [M+H]+. 1H-NMR (CDCl3, 400 MHz, TMS, ppm): δ 7.65 (d, 2H), 7.59 (d, 2H), 7.50 (d, 2H), 7.40 (m, 8H), 7.17 (m, 3H), 7.05 (m, 3H), 1.42 (s, 6H), 1.38 (s, 12H).

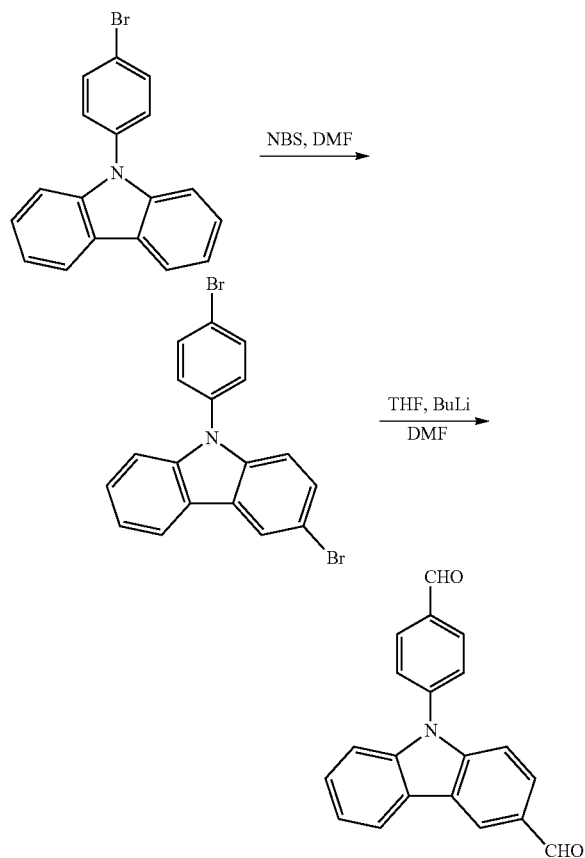

Synthesis of 9-(4-formylphenyl)-9H-carbazole-3-carbaldehyde

To a solution of 9-(4-bromophenyl)-9H-carbazole (32.2 g, 100 mmol) in 150 mL Dimethyl Formamide (DMF), N-bromosuccinimide (NBS) (17.8 g, 100 mmol), in 100 mL DMF, was added dropwise in 30 minutes. After addition, the mixture was stirred at room temperature for 12 hours, and then poured into water to precipitate a solid. The solid was filtered, and recrystallized from dichloromethane and ethanol, to give white solid (yield: 92%) and used for the next step. MS (ESI): 402.09 [M+H]+.

To a solution of 3-bromo-9-(4-bromophenyl)-9H-carbazole (8.02 g, 20 mmol) in THF (500 mL), n-BuLi (24 mL of a 2.5 M solution in hexanes, 60 mmol), was added, at a rate to keep the internal temperature below −78° C. The mixture was stirred at −78° C. for 1 hour, and 10 mL DMF with 10 mL THF, were added dropwise. After the addition, the reaction mixture was stirred at −45° C. for 30 minutes, and at 0° C. for an additional 30 minutes. Saturated aqueous NH4Cl (400 mL) was added, and the organic solvent was evaporated. The residue was extracted with CH2Cl2 (2×100 mL), and the combined organic layer was dried over anhydrous MgSO4. After removing solvent, the crude product was purified through column chromatography, to give crude product (yield: 65%). MS (ESI): 300.09 [M+H]+. 1H-NMR (CDCl3, 400 MHz, TMS, ppm): δ 10.15 (s, 1H), 10.13 (s, 1H), 8.67 (s, 1H), 8.23 (d, 1H), 8.17 (d, 2H), 7.99 (d, 1H), 7.80 (d, 2H), 7.54 (m, 3H), 7.40 (m, 1H).

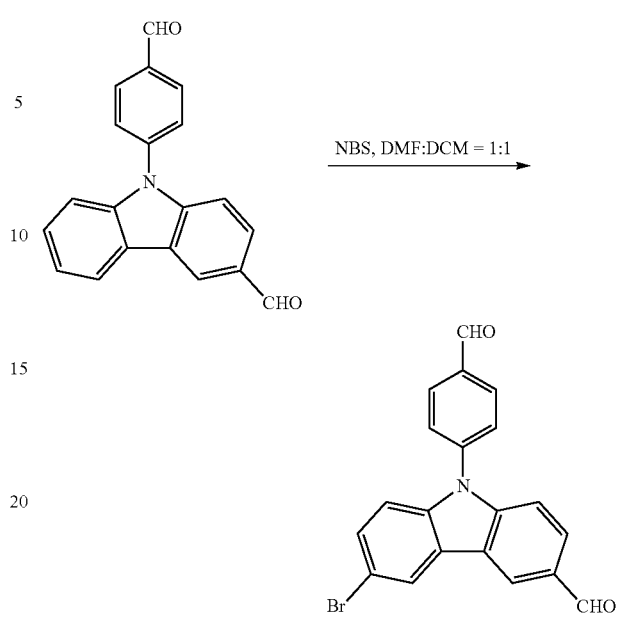

Synthesis of 6-bromo-9-(4-formylphenyl)-9H-carbazole-3-carbaldehyde

To a solution of 9-(4-formylphenyl)-9H-carbazole-3-carbaldehyde (0.898 g, 3 mmol, 1.00 equiv) in CH2Cl2 (20 mL) and DMF (20 mL), NBS (0.587 mg, 3.3 mmol) was added in portion. After stirred for 4 hours, the precipitate formed was filtered, and washed with DMF and CH2Cl2 for several times, to afford the crude product (yield: 84%). MS (ESI): 378.01 [M+H]+.

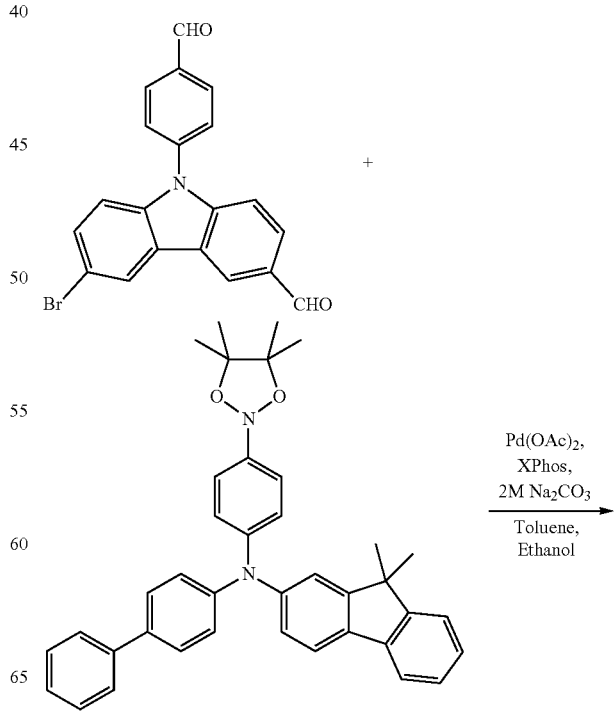

-continued

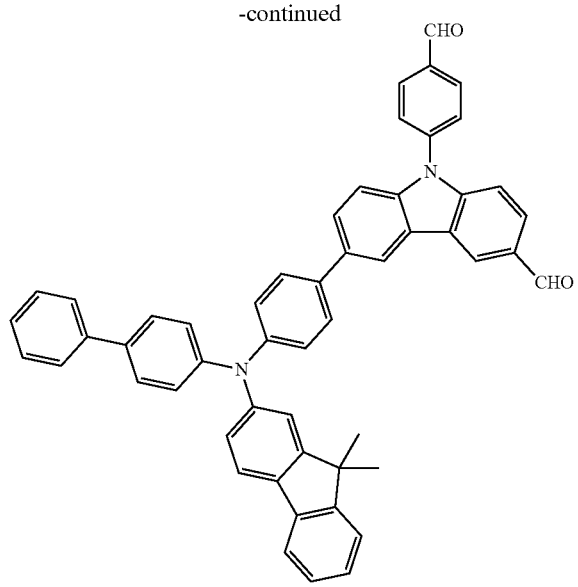

Synthesis of 6-(4-([1,1'-biphenyl]-4-yl(9,9-dimethyl-9H-fluoren-2-yl)amino)phenyl)-9-(4-formylphenyl)-9H-carbazole-3-carbaldehyde To a mixture of 6-bromo-9-(4-formylphenyl)-9H-carbazole-3-carbaldehyde (0.756 g, 2 mmol), N-([1,1'-biphenyl]-4-yl)-9,9-dimethyl-N-(4-(4,4,5,5-tetramethyl-1,3,2-dioxaborolan-2-yl)phenyl)-9H-fluoren-2-amine (1.24 g, 2.2 mmol), Pd(OAc)2 (12.8 mg, 0.06 mmol) and X-Phos (28.6 mg, 0.06 mmol), 20 mL mixed solvents with proportion of 1:1:2 mixture of 2.0 M Na2CO3:ethanol:toluene, were added, under a flow of nitrogen. The reaction mixture was stirred overnight, under nitrogen atmosphere, at 90° C. After evaporation of toluene and ethanol, water was added, and the mixture was extracted with CH2Cl2 (2×30 mL), and the combined organic layer was dried over MgSO4. The solvent was removed under reduced pressure, and the residue was purified through column chromatography on silica gel, to give yellow solid (yield: 64%). MS (ESI): 735.29 [M+H]+. 1H-NMR (CDCl3, 400 MHz, TMS, ppm): δ 10.12 (s, 1H), 10.09 (s, 1H), 8.36 (s, 1H), 8.20 (d, 1H), 7.64 (m, 12H), 7.53 (m, 2H), 7.42 (m, 6H), 7.32 (m, 7H), 7.15 (d, 1H), 4.88 (s, 2H), 4.85 (s, 2H), 1.45 (s, 6H).

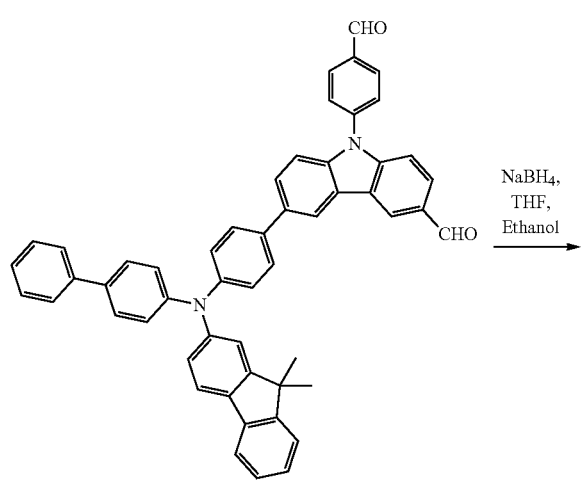

-continued

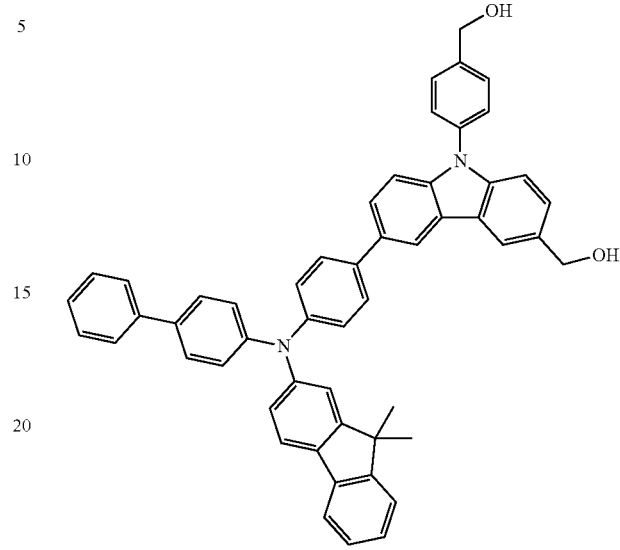

Synthesis of (4-(3-(4-([1,1'-biphenyl]-4-yl(9,9-dimethyl-9H-fluoren-2-yl)amino)phenyl)-6-(hydroxymethyl)-9H-carbazol-9-yl)phenyl)methanol To a solution of 6-(4-([1,1'-biphenyl]-4-yl(9,9-dimethyl-9H-fluoren-2-yl)amino)-phenyl)-9-(4-formylphenyl)-9H-carbazole-3-carbaldehyde (734 mg, 1 mmol) in 10 mL THF and 10 mL ethanol at 40° C., NaBH4 (302 mg, 8 mmol) was added under nitrogen atmosphere. The solution was allowed to stir at room temperature for 2 hours. Then, aqueous hydrochloric acid solution was added, until pH 5, and the mixture was kept stirring for 30 minutes. The solvent was removed under vacuum, and the residue was extracted with dichloromethane. The product was then dried under vacuum, and used for the next step, without further purification (yield: 95%). MS (ESI): 739.32 [M+H]+. 1H-NMR (CDCl3, 400 MHz, TMS, ppm): δ 8.36 (s, 1H), 8.20 (d, 1H), 7.64 (m, 12H), 7.53 (m, 2H), 7.42 (m, 6H), 7.32 (m, 7H), 7.15 (d, 1H), 4.88 (s, 2H), 4.85 (s, 2H), 3.74 (m, 2H), 1.45 (s, 6H).

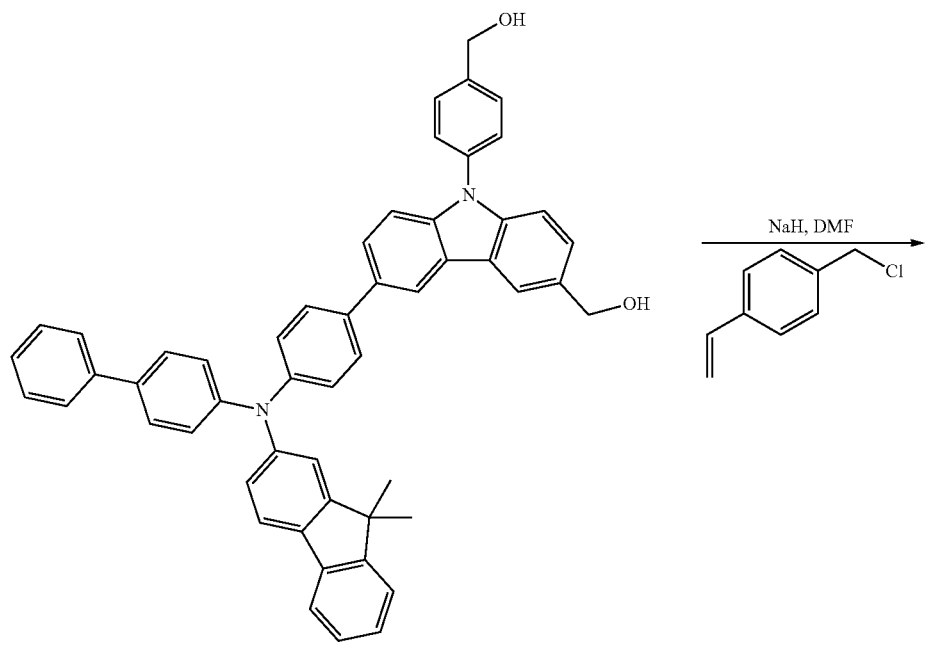

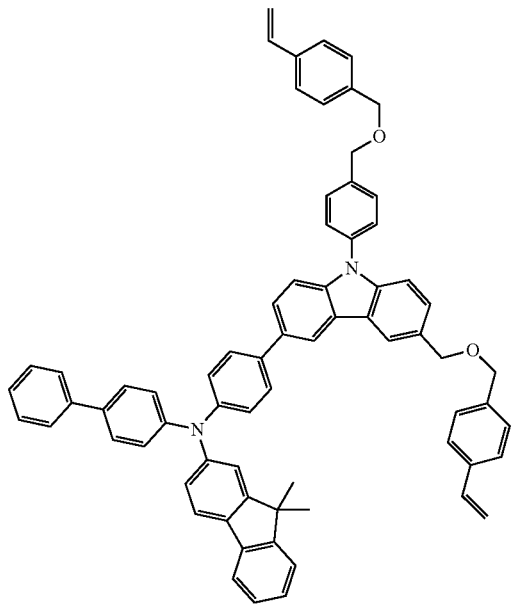

HTL-SP-004B

Synthesis of N-([1,1'-biphenyl]-4-yl)-9,9-dimethyl-N-(4-(6-(((4-vinylbenzyl)oxy)-methyl)-9-(4-(((4-vinylbenzyl)oxy)methyl)phenyl)-9H-carbazol-3-yl)phenyl)-9H-fluoren-2-amine (HTL-SP-004B)

To a solution of (4-(3-(4-([1,1'-biphenyl]-4-yl(9,9-dimethyl-9H-fluoren-2-yl)amino)phenyl)-6-(hydroxymethyl)-9H-carbazol-9-yl)phenyl)methanol (3.69 g, 5 mmol, 738) in 50 mL dry DMF, was added, NaH (432 mg, 18 mmol), the mixture was stirred at room temperature for 1 hour. Next, 1-(chloromethyl)-4-vinylbenzene (2.75 g, 15 mmol) was added to above solution via syringe. The mixture was heated to 60° C. overnight. After a quench with water, the mixture was poured into water to remove DMF. The residue was filtrated, and the resulting solid was dissolved with dichloromethane, which was then washed with water. The solvent was removed under vacuum, and the residue was extracted with dichloromethane. The product was then obtained by column chromatography on silica gel (yield: 55%). MS (ESI): 943.42 [M+H]+. 1H-NMR (CDCl3, 400 MHz, TMS, ppm): δ 8.35 (s, 1H), 8.17 (d, 1H), 7.62 (m, 12H), 7.42 (m, 14H), 7.29 (m, 10H), 6.72 (dd, 2H), 5.77 (d, 2H), 5.24 (d, 2H), 4.74 (s, 2H), 4.67 (s, 4H), 4.60 (s, 2H), 1.45 (s, 6H).

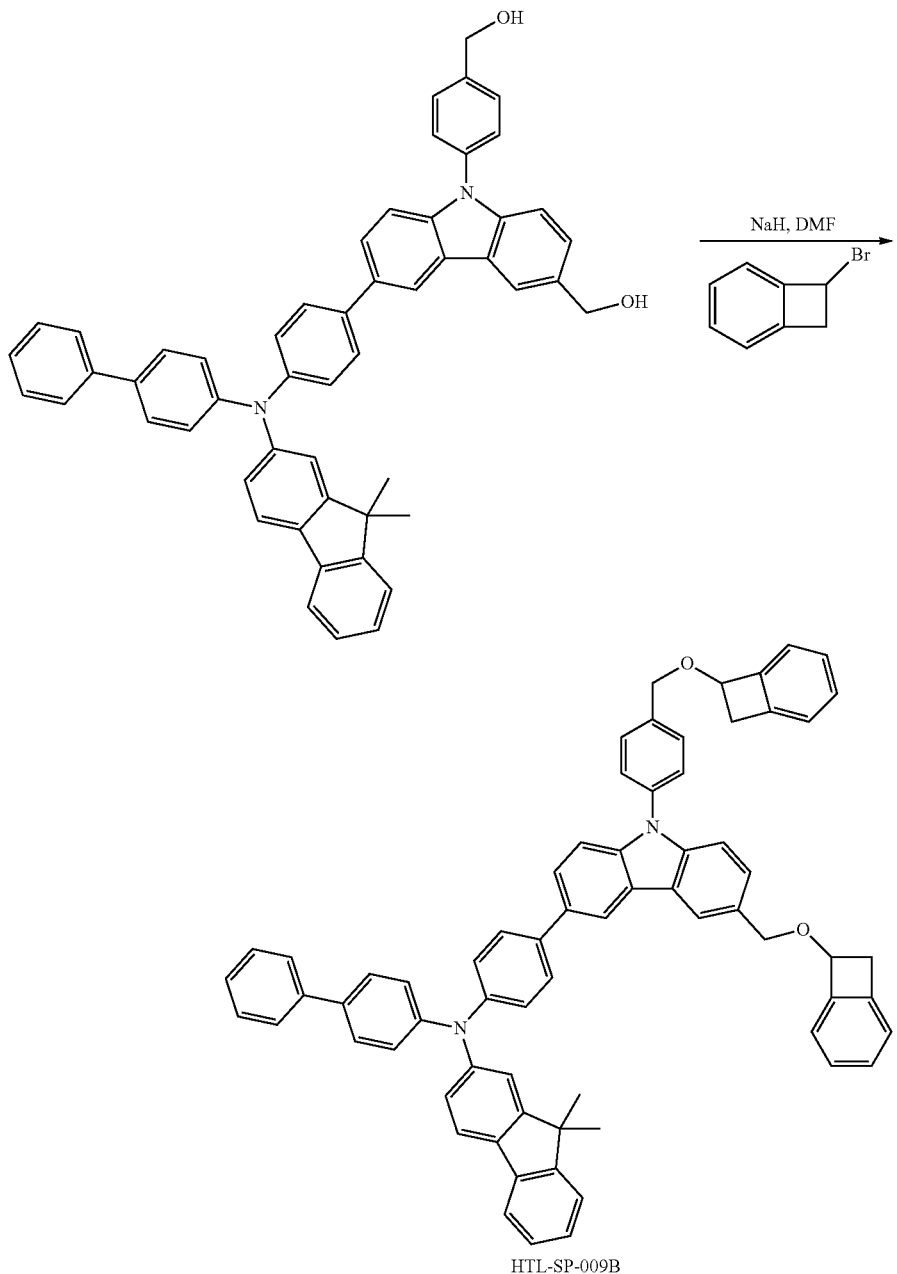

HTL-SP-009B

Synthesis of N-([1,1'-biphenyl]-4-yl)-N-(4-(6-((bicyclo[4.2.0]octa-1(6),2,4-trien-7-yloxy)methyl)-9-(4-((bicyclo[4.2.0]octa-1(6),2,4-trien-7-yloxy)methyl)phenyl)-9H-carbazol-3-yl)phenyl)-9,9-dimethyl-9H-fluoren-2-amine (HTL-SP-009B)

To a solution of (4-(3-(4-([1,1'-biphenyl]-4-yl(9,9-dimethyl-9H-fluoren-2-yl)amino)phenyl)-6-(hydroxymethyl)-9H-carbazol-9-yl)phenyl)methanol (3.69 g, 5 mmol, 738) in 50 mL dry DMF, was added, NaH (432 mg, 18 mmol), the mixture was stirred at room temperature for 1 hour. Next, 7-bromobicyclo[4.2.0]octa-1,3,5-triene (Br-BCB) (2.75 g, 15 mmol) was added to above solution via syringe. The mixture was heated to 60° C., and stirred overnight. After a quench with water, the mixture was poured into water, to remove DMF. The residue was filtrated, and the resulting solid was dissolved with dichloro-methane, which was then washed with water. The solvent was removed under vacuum, and the residue was extracted with dichloromethane. The product was then obtained by column chromatography on silica gel (yield: 65%). MS (ESI): 943.42 [M+H]+. 1H-NMR (CDCl3, 400 MHz, TMS, ppm): δ 8.35 (s, 1H), 8.22 (d, 1H), 7.65 (m, 12H), 7.47 (d, 2H), 7.43 (m, 6H), 7.29 (m, 10H), 7.15 (m, 6H), 5.27 (d, 2H), 4.89 (s, 2H), 4.82 (s, 2H), 3.55 (d, 2H), 3.22 (d, 2H), 1.45 (s, 6H).

B-Staging of HTL Monomers to Form Oligomers

Figure 7:
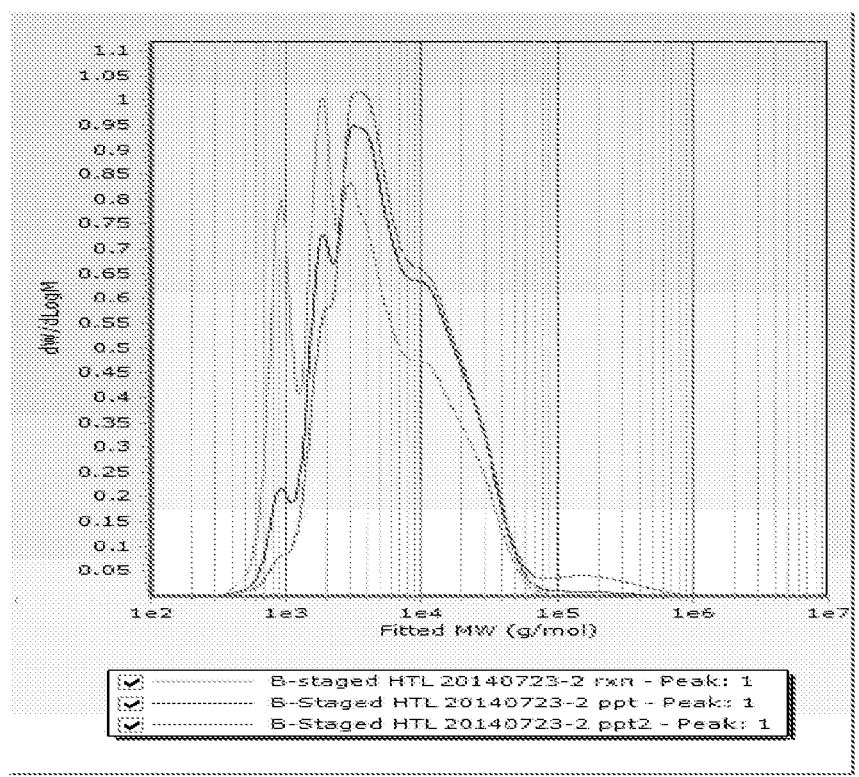
FIG. 7 depicts the GPC profiles of some B-Staged HTL Polymers.

A mixture of HTL-SP-009B (657.1 mg, 0.697 mmol), HTL-SP-004B (479.7 mg, 0.494 mmol), and tris(4'-vinyl-[1,1'-biphenyl]-4-yl)amine (TFX-2) (72.7 mg, 0.132 mmol) was dissolved in 1.2 mL electronic anisole, to make a 10 wt % solution. The B-staging of the above solution was carried out at 105° C., for 5 hours under nitrogen atmosphere. After cooling to room temperature, the B-staged HTL solution was diluted to 4 wt % with electronic solvent. Equal volume of electronic methanol was then added into the diluted B-staged HTL solution for precipitating the HTL polymer out of the solution. The B-staged HTL polymer was then collected via filtration, and dried in vacuum oven at 40° C. overnight. The resulting B-staged HTL polymer was re-dissolved in electronic anisole, to make a 4 wt % solution, and the above precipitation was repeated once more to completely remove residual HTL monomer. Finally, 0.71 g (Yield: 59%) B-staged HTL polymer product was collected in the form of yellow crystalline-like solid. Gel permeation chromatography was used to analyze the molecular weight distribution of the B-staged materials, and is shown in Table A. See also, FIG. 7 for the GPC profiles.

Gel permeation chromatography (GPC) studies were carried out as follows. The B-staged HTL polymer (2 mg) was dissolved in THF (1 ml). The solution was filtrated through a "0.20 μm" polytetrafluoroethylene (PTFE) syringe filter, and 50 μl of the filtrate was injected to the GPC system. The following analysis conditions were used: Pump: WATERS e2695 Separations Modules, at a nominal flow rate of 1.0, mL/min; Eluent: FISHER SCIENTIFIC HPLC grade THF (unstabilized); Injector: WATERS e2695 Separations Modules; Columns: two 5 μm mixed-C columns from Polymer Laboratories Inc., held at 40° C.; Detector: SHODEX RI-201 Differential Refractive Index (DRI) Detector; Calibration: 17 polystyrene standard materials from Polymer Laboratories Inc., fit to a 3rd order polynomial curve over the range of 3,742 kg/mol to 0.58 kg/mol. Molecular weights were determined using VISCOTEK TriSEC software Version 3.0, or similar software.

TABLE A

Molecular weights (g/mole) of B-staged HTL polymers

| Description | Mn | Mw | Mz | Mz + 1 | Mw/Mn |
|---|---|---|---|---|---|
| Initial B-staged polymer | 2,315 | 6,973 | 18,812 | 31,263 | 3.012 |
| 1st precipitation | 3,513 | 9,774 | 39,049 | 154,783 | 2.782 |
| 2nd precipitation | 4,243 | 16,001 | 155,113 | 437,472 | 3.771 |

Film Preparation

1. HTL-SP-8+HTL-SP-3 Solution Preparation

HTL-SP-8 (0.0369 g; MW=915.149 Da) and HTL-SP-3 (0.0277 g; MW=730.955 Da) were dissolved in anisole (3.1444 g), at room temperature, to make a "2 wt % HTL-SP-8+HTL-SP-3" solution (HTL-SP-8:HTL-SP-3=approximately a 1:1 molar ratio). Once the HTL-S-8 and HTL-SP-3 were completely dissolve in anisole, the solution was filter through a "0.2 μm PTFE membrane," prior to depositing the solution onto the Si wafer (see below). The silicon wafers were available from Virginia Semiconductor, Inc. (one inch, Single-Side-Polished (SSP) undoped Si wafers with 0.5 mm thickness).

2. HTL-SP-8+HTL-SP-3 Thin Film on Si Wafer Via Spin Coating and Thermal Cross-Linking The Si wafer was "UV-ozone pre-treated" for one minute. Next, 4-6 drops of the filtered "HTL-SP-8 and HTL-SP-3 solution" was deposited onto the Si wafer, and coated wafer was spin coated to form a thin film of the "HTL-SP-8+HTL-SP-3 solution" on Si wafer using two spinning steps: 1) 500 rpm for five seconds, and 2) 1500 rpm for 30 seconds. The spin-coated wafer was pre-baked at 100° C., for one minute, under a nitrogen atmosphere (N2 box) to remove most of the residual anisole.

Three or two film coated wafers were then heated, under nitrogen atmosphere, at 190, 220, 235, or 250° C., for 5, 10, 20, 30, 40, 50 or 60 minutes, under nitrogen atmosphere (N2 purge box), to form one data (temp./time) set. See Table 1 below.

3. HTL-SP-8+HTL-SP-3 Thin Film Strip Test

The "Initial" thickness of "HTL-SP-8+HTL-SP-3" each coated film of each data set were measured, and the average±standard deviation was recorded (see Table 1). An anisole was used to strip the "HTL-SP-8+HTL-SP-3 film"—a 90 second puddle time was used in this analysis. Each "HTL-SP-8+HTL-SP-3 film" coated wafer was immediately spin dried at 3500 rpm for 30 seconds, and the "stripped" film thickness of each film of each data set was immediately measured, and the average±standard deviation was recorded (see Table 1).

Each HTL-SP-8+HTL-SP-3 film of each data set was post-baked at 100° C. for one minute, under nitrogen atmosphere (N2 purge box), to bake off excess anisole. The "Final" film thickness was measured, and the average±standard deviation was recorded (see Table 1). Strip data is shown in Table 1. See also FIG. 1.

TABLE 1

Strip Test Summary of "HTL-SP-8 and HTL-SP-3" Films

| x-linking (° C./min) | Initial (nm) | Stripped (nm) | −Strip (nm) | Final (nm) | −PSB (nm) | −Total (nm) |
|---|---|---|---|---|---|---|
| 190/20 | 46.78 ± 0.18 | 31.87 ± 0.62 | −14.91 | 31.40 ± 0.53 | −0.47 | −15.38 |
| 190/40 | 46.33 ± 0.05 | 37.46 ± 0.34 | −8.87 | 37.04 ± 0.35 | −0.42 | −9.29 |
| 190/60 | 45.10 ± 0.09 | 34.17 ± 0.82 | −10.93 | 33.91 ± 0.95 | −0.26 | −11.19 |
| 220/20 | 45.68 ± 0.13 | 44.03 ± 0.31 | −1.65 | 43.70 ± 0.25 | −0.33 | −1.98 |
| 220/40 | 46.90 ± 0.35 | 46.35 ± 0.33 | −0.55 | 46.06 ± 0.37 | −0.29 | −0.84 |
| 220/50 | 46.15 ± 0.09 | 45.69 ± 0.17 | −0.46 | 45.51 ± 0.10 | −0.18 | −0.64 |
| 220/60 | 47.11 ± 0.08 | 46.72 ± 0.17 | −0.39 | 46.54 ± 0.07 | −0.18 | −0.57 |
| 235/5 | 47.17 ± 0.07 | 45.34 ± 0.29 | −1.83 | 44.99 ± 0.12 | −0.35 | −2.18 |
| 235/10 | 47.33 ± 0.13 | 46.23 ± 0.16 | −1.10 | 46.08 ± 0.12 | −0.15 | −1.25 |
| 235/20 | 47.48 ± 0.10 | 47.06 ± 0.09 | −0.42 | 46.88 ± 0.04 | −0.18 | −0.60 |
| 235/30 | 47.31 ± 0.07 | 47.21 ± 0.23 | −0.10 | 47.01 ± 0.10 | −0.20 | −0.30 |
| 235/40 | 47.99 ± 0.21 | 47.99 ± 0.17 | −0.00 | 47.77 ± 0.15 | −0.22 | −0.22 |
| 250/5 | 47.04 ± 0.20 | 46.21 ± 0.27 | −0.83 | 45.95 ± 0.12 | −0.26 | −1.09 |

TABLE 1-continued

Strip Test Summary of "HTL-SP-8 and HTL-SP-3" Films

| x-linking (° C./min) | Initial (nm) | Stripped (nm) | −Strip (nm) | Final (nm) | −PSB (nm) | −Total (nm) |
|---|---|---|---|---|---|---|
| 250/10 | 46.19 ± 0.04 | 46.03 ± 0.11 | −0.16 | 45.74 ± 0.05 | −0.29 | −0.45 |
| 250/20 | 46.43 ± 0.03 | 46.27 ± 0.08 | −0.16 | 46.03 ± 0.06 | −0.24 | −0.40 |
| 250/30 | 46.06 ± 0.10 | 45.64 ± 0.09 | −0.42 | 45.48 ± 0.08 | −0.16 | −0.58 |

Note:
"−Strip" = "Stripped" − "Initial"; "−PSB" = "Final" − "Stripped"; "−Total" = "−Strip" + "−PSB"
HTL-SP-3: N-([1,1'-biphenyl]-4-yl)-9,9-dimethyl-6-vinyl-N-(4-(9-(4-vinylphenyl)-9H-carbazol-3-yl)phenyl)-9H-fluoren-2-amine.
HTL-SP-8: N-([1,1'-biphenyl]-4-yl)-N-(4-(9-(3,5-bis(bicyclo[4.2.0]octa-1(6),2,4-trien-7-yloxy)phenyl)-9H-carbazol-3-yl)phenyl)-9,9-dimethyl-9H-fluoren-2-amine.

HTL-SP-8+HTL-SP-3 Blend Preparation and DSC Study

HTL-SP-8 (5.5 mg; MW=915.149 Da) and 4.4 mg HTL-SP-3 (4.4 mg; MW=730.955 Da) were dissolved in 500 mg THF, at room temperature, to form a "2 wt % HTL-SP-8+HTL-SP-3" solution (HTL-SP-8:HTL-Sp-3=approximately a 1:1 molar ratio). After the HTL-S-8 and HTL-SP-3 were completely dissolved in the THF, the solution was "air purge," to remove most THF, followed by vacuum dry, at room temperature, for two hours, to form a dried film for DSC analysis. DSC results are shown in Table 2. See also FIGS. 2-4.

TABLE 2

| Sample | Onset Temp (° C.) | 1$^{st}$ Peak Temp (° C.) |
|---|---|---|
| HTL-SP-8 (FIG. 3) | 167.0 | 197.0 |
| HTL-SP-3 (FIG. 4) | 166.0 | 189.2 |
| HTL-SP-8 + HTL-SP-3 (1:1) (FIG. 2) | 117.5 | 148.9 |

HTL-SP-3: N-([1,1'-biphenyl]-4-yl)-9,9-dimethyl-6-vinyl-N-(4-(9-(4-vinylphenyl)-9H-carbazol-3-yl)-9H-fluoren-2-amine.
HTL-SP-8: N-([1,1'-biphenyl]-4-yl)-N-(4-(9-(3,5-bis(bicyclo[4.2.0]octa-1(6),2,4-trien-7-yloxy)phenyl)-9H-carbazol-3-yl)phenyl)-9,9-dimethyl-9H-fluoren-2-amine.

Figure 2:
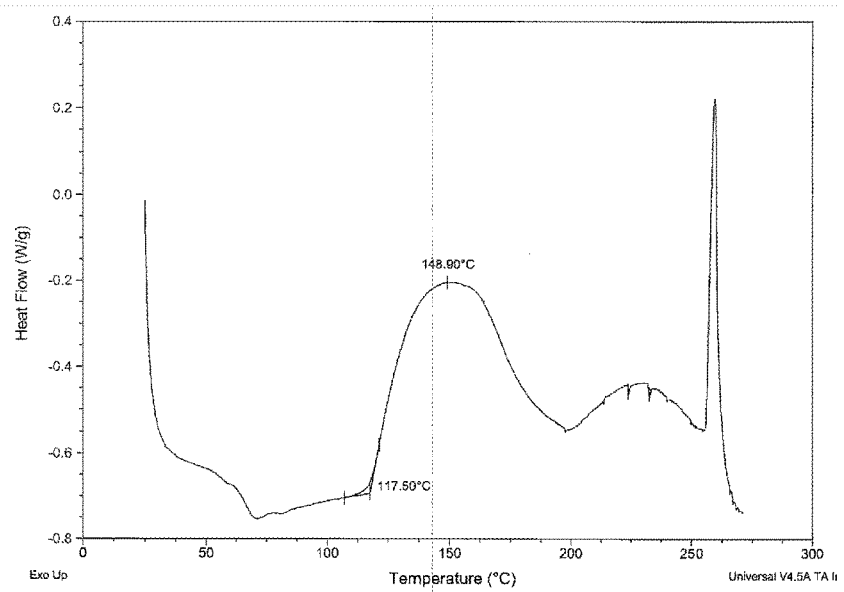
FIG. 2 depicts the DSC profile of HTL-SP-8.

FIG. 2 depicts the DSC profile of HTL-SP-8. The onset for the first exothermic event occurred at about 117° C. and ended at about 200° C., whereas the second exothermic event began at about 200° C. and ended at about 250° C. These exothermic events occur when new C—C bonds are formed, as a result of the Diels-Alder cycloaddition reaction.

Figure 3:
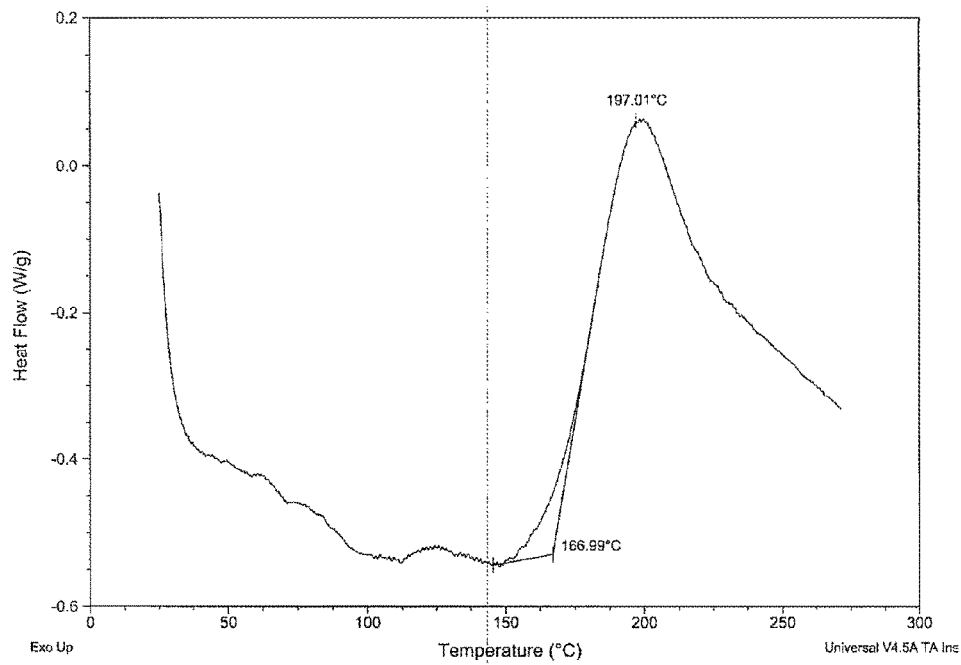
FIG. 3 depicts the DSC profile of HTL-SP-3.

FIG. 3 depicts the DSC profile of HTL-SP-3. The onset for the first exothermic event occurred at about 167° C. and ended at >250° C. These exothermic events occur when new C—C bonds are formed, as a result of the thermal styrene polymerization.

Figure 4:
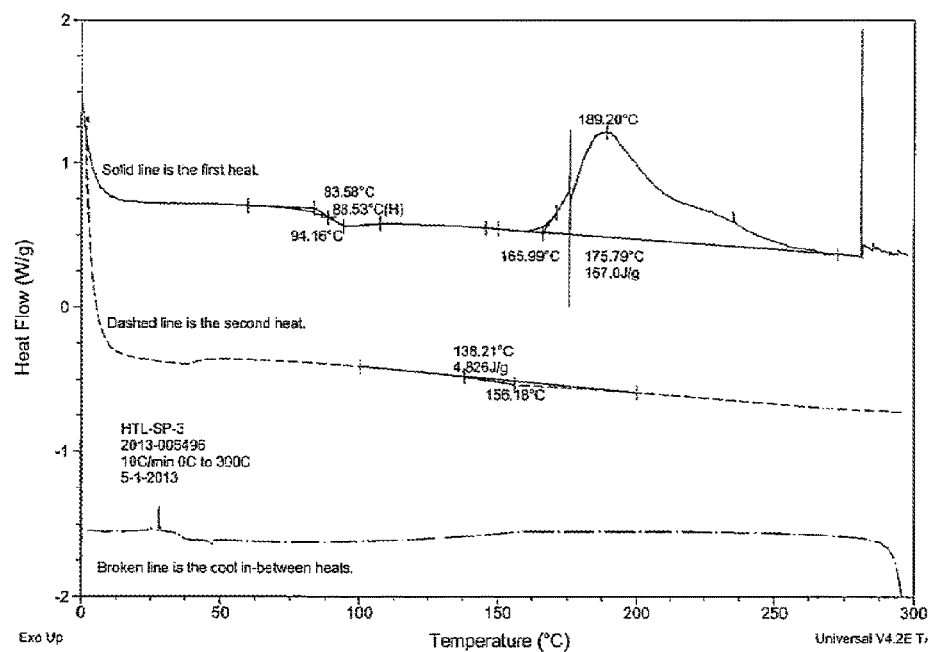
FIG. 4 depicts the DSC profile of HTL-SP-8 and HTL-SP-3.

FIG. 4 depicts the DSC profile of HTL-SP-8 and HTL-SP-3. The onset for the first exothermic event occurred at about 166° C. and ended at >250° C. These exothermic events occur when new C—C bonds are formed, as a result of the Diels-Alder [4+2] cycloaddition reaction.

Figure 5:
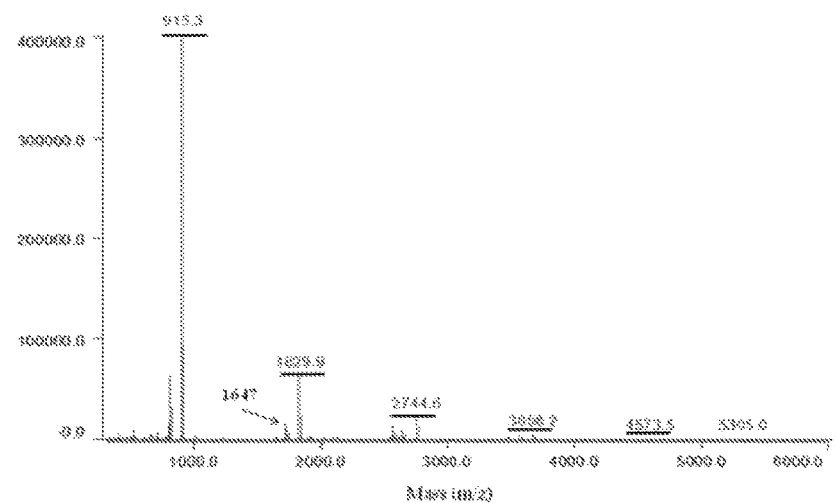
FIG. 5 depicts the MALDI-TOF profile of the film produced by heating HTL-SP-3 and HTL-SP-8 at 190° C.
Figure 6:
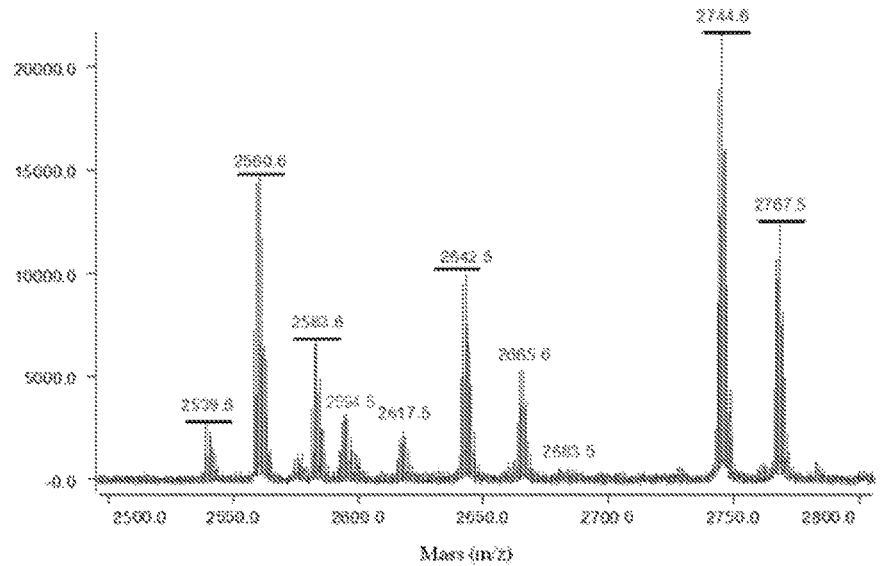
FIG. 6 depicts an expanded MALDI-TOF profile of the film produced by heating HTL-SP-3 and HTL-SP-8 at 190° C.

FIG. 5 depicts the MALDI-TOF profile of the film produced by heating HTL-SP-3 and HTL-SP-8 at 190° C. The product peaks are indicative of the product mass obtained from a [4+2] Diels-Alder cycloaddition reaction. FIG. 6 depicts an expanded MALDI-TOF profile of FIG. 5.

Device Results

The current-voltage-luminance (J-V-L) characterizations for the OLED devices, that is, driving voltage (V), luminance efficiency (Cd/A), international commission on illumination (CIE) data at 1000 nit and 50 mA/cm$^2$ luminance, and lifetime at 15000 nit for 10 hr, were performed with a KEITHLY™ 238 High Current Source-Measurement Unit and a CS-100A Color and Luminance Meter from Konica Minolta Company. These properties are listed in Table 3.

Electroluminescence (EL) spectra of the OLED devices were collected by a calibrated CCD spectrograph, and were fixed at 516 nm for all the four OLED device examples.

Device A was fabricated with evaporative Comparative HTL while Device B was deposited with the inventive HTL B-staged oligomer of HTL-SP-009B/HTL-SP-004B, described herein, through a solution process. Solution-processed Device B displayed comparable performance to the evaporative Device A.

Light Emitting Device Fabrication

Indium tin oxide (ITO) glass substrates (2*2 cm) were cleaned with solvents ethanol, acetone, and isopropanol by sequence, and then were treated with a UV Ozone cleaner for 15 minutes. A commercially available sulfonated polythiophene hole injection layer (HIL) was spin-coated, from a water solution, onto the ITO substrates in a glovebox, and annealed at 150° C. for 20 minutes. After that, for comparative evaporative HTL, N-([1,1'-biphenyl]-4-yl)-9,9-dimethyl-N-(4-(9-phenyl-9H-carbazol-3-yl)phenyl)-9H-fluoren-2-amine, the substrate was transferred into a thermal evaporator for the deposition of the HTL, emitting materials layer (EML), electron transfer layer (ETL) and cathode. For inventive HTL for solution process, the HTL materials (soluble copolymers) were deposited from anisole solution, and annealed at 150° C. for 10 minutes, to remove organic solvent. After that, the crosslinking of polymeric HTL was carried out on a hotplate in glovebox at 205° C. for 10 minutes. Then subsequent phosphorescent green (Ph-Green) EML, ETL and cathode were deposited in sequence. Finally these devices were hermetically sealed, prior to testing.

To evaluate electroluminescent (EL) performances of the B-staged polymer as hole-transporting layer material, OLED devices with the following structures were fabricated:

Device A: ITO/AQ-1200/Comparative HTL (evaporated, 800 Å)/EML/ETL/Al;

Device B: ITO/AQ-1200/B-staged HTL copolymer (400 Å)/EML/ETL/Al;

The thicknesses of HIL (AQ-1200), EML, ETL and cathode Al are 470, 400, 350 and 800 Å, respectively.

TABLE 3

| | OLED J-V-L characterizations | | | | |
|---|---|---|---|---|---|
| Devices | V (1000 nit) | Cd/A | CIE | Lifetime | EL |
| A (evaporative) | 3.6 | 51.9 | 303,644 | 92.8% | 516 nm |
| B (solution process) | 3.3 | 52.8 | 297,652 | 89.4% | 516 nm |

As shown in Table 3, the termed B-staged HTL and described in Device B, showed an improvement in device turn-on voltage and device efficiency. The represents an improvement over the evaporative HTL comparative example.

It has been discovered that the inventive compositions (using at least one attachment point on an hole transport layer molecules), the energy required for rearrangement during oxidation, and more efficiently chain stack the molecular cores into close proximity to each other, is minimized. This inventive approach enhances the transport of holes in the HTL layer via thru-space interactions, which is in contrast to prior art in this field. These properties result in increased device efficiency, good device lifetime, and lower device driving voltage. Furthermore, the chemistry described in this invention can also satisfy temperature and time considerations, and thus provide improved process conditions for film configurations for electronic devices.

The invention claimed is:

1. A light emitting device comprising a polymeric charge transfer layer, wherein the polymeric charge transfer layer is formed from a composition comprising a polymer, said polymer comprising one or more polymerized units derived from Structure A, and one or more polymerized units derived from Structure B, each as follows:

A) a monomer having the Structure A:

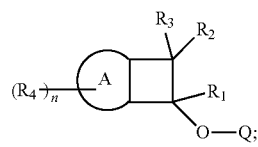

(Structuare A)

wherein, for Structure A, A is a substituted or unsubstituted aromatic moiety or a substituted or unsubstituted heteroaromatic moiety; and wherein $R_1$ through $R_3$ are each independently selected from the following: hydrogen, deuterium, a hydrocarbyl, a substituted hydrocarbyl, a heterohydrocarbyl, a substituted heterohydrocarbyl, a halogen, a cyano, an aryl, a substituted aryl, a heteroaryl, a substituted heteroaryl; and wherein n is from 1 to 10; and each $R_4$ s independently selected from the following: hydrogen, deuterium, a hydrocarbyl, a substituted hydrocarbyl, a heterohydrocarbyl, a substituted heterohydrocarbyl, a halogen, a cyano, an aryl, a substituted aryl, a heteroaryl, a substituted heteroaryl; and wherein each $R_4$ group is independently bonded to A; and wherein O is oxygen; and wherein Q is selected from the following: hydrogen, deuterium, a hydrocarbyl, a substituted hydrocarbyl, a heterohydrocarbyl, a substituted heterohydrocarbyl, a halogen, a cyano, an aryl, an substituted aryl, a heteroaryl, a substituted heteroaryl; and wherein two or more of $R_1$ through $R_4$ may optionally form one or more ring structures; and B) a monomer of Structure B comprising one or more dienophile moieties and selected from

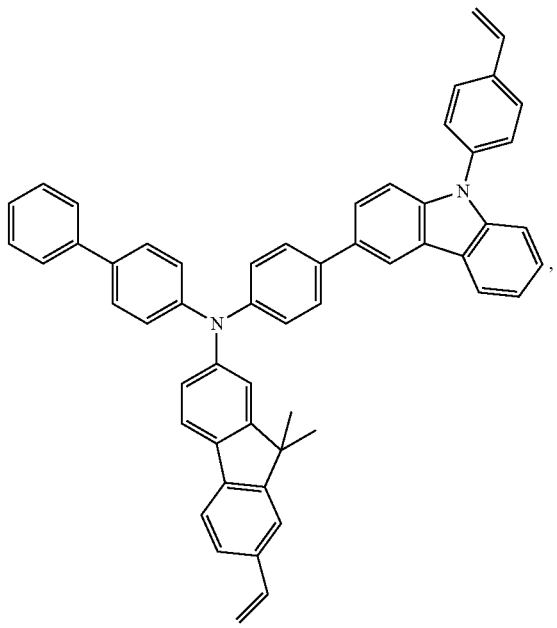

(B1)

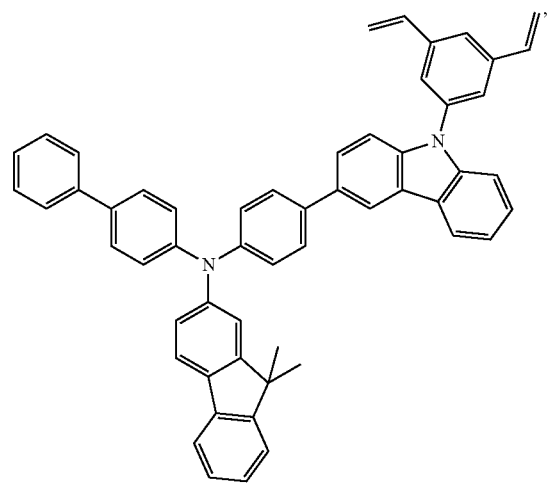

(B2)

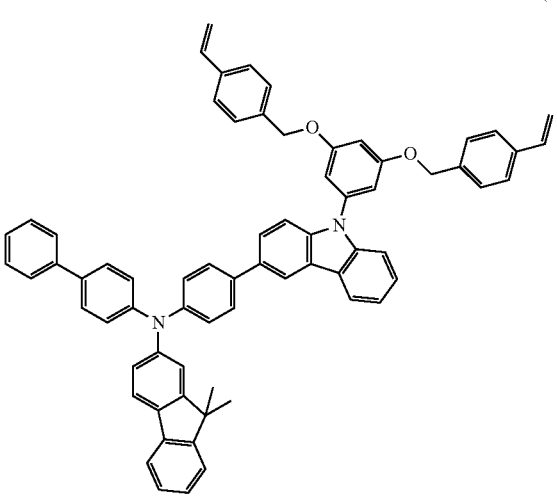

(B3)

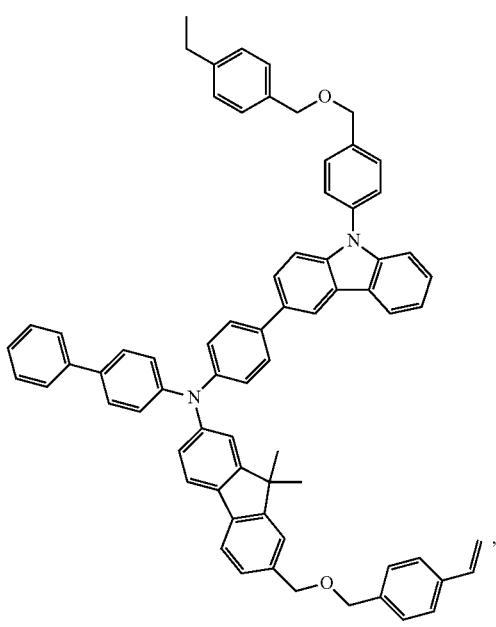
(B4)

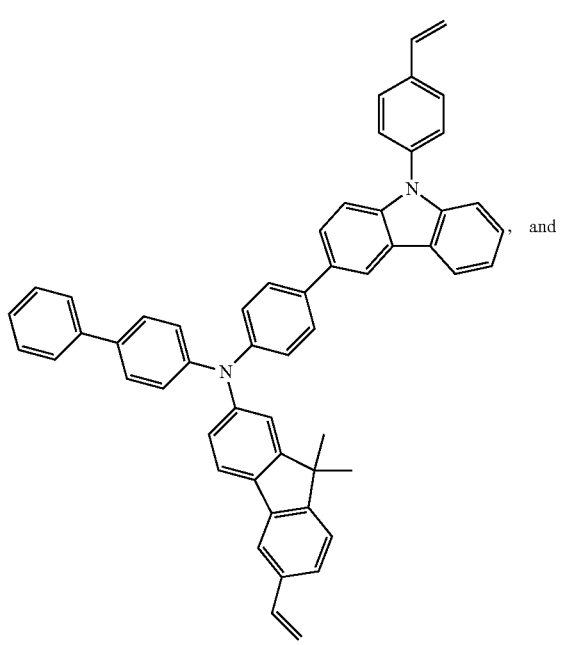
(B5) and

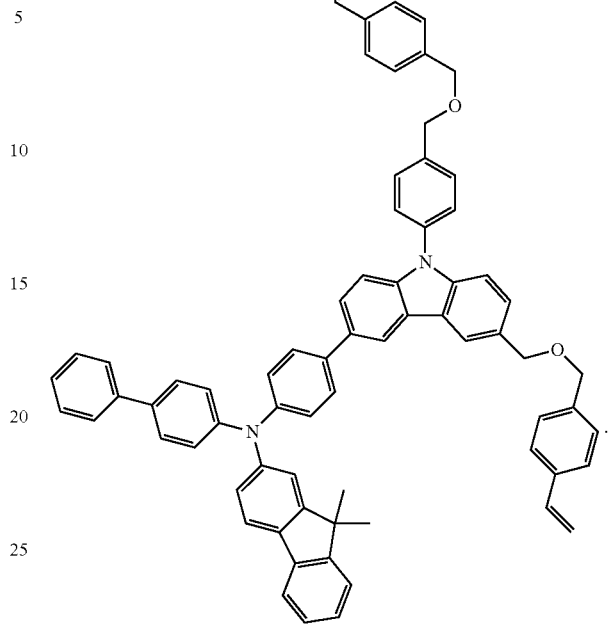
(B6)

2. The device of claim 1, wherein the polymer further comprises one or more polymerized units derived from a cross-linking agent having Structure C:

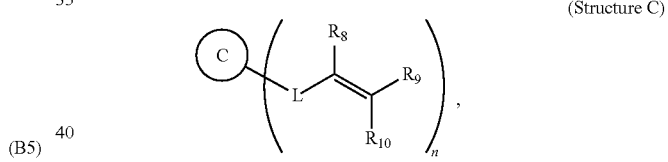
(Structure C)

wherein, for Structure C, C is an aromatic moiety, a heteroaromatic moiety, a $C_1$-$C_{50}$ hydrocarbyl, a $C_1$-$C_{50}$ substituted hydrocarbyl, a $C_1$-$C_{50}$ heterohydrocarbyl, or a $C_1$-$C_{50}$ substituted heterohydrocarbyl; and wherein $R_8$ through $R_{10}$ are each independently selected from the following: hydrogen, deuterium, a $C_1$-$C_{50}$ hydrocarbyl, a $C_1$-$C_{50}$ substituted hydrocarbyl, a $C_1$-$C_{50}$ heterohydrocarbyl, a $C_1$-$C_{50}$ substituted heterohydrocarbyl, halogen, cyano, a $C_5$-$C_{50}$ aryl, a $C_5$-$C_{50}$ substituted aryl, a $C_5$-$C_{50}$ heteroaryl, a $C_5$-$C_{50}$ substituted heteroaryl; and wherein n is from 1 to 25; and wherein each chemical group comprising L, $R_8$, $R_9$ and $R_{10}$" is independently boned to C;

wherein L is selected from an aromatic moiety, a heteroaromatic moiety, a $C_1$-$C_{100}$ hydrocarbyl, a $C_1$-$C_{100}$ substituted hydrocarbyl, a $C_1$-$C_{100}$ heterohydrocarbyl, or a $C_1$-$C_{100}$ substituted heterohydrocarbyl, or wherein L is not present; and wherein two or more of $R_8$ through $R_{10}$ may optionally form one or more ring structures.

3. The device of claim 2, wherein the cross-linking agent is selected from the following C1-C8:

C1) 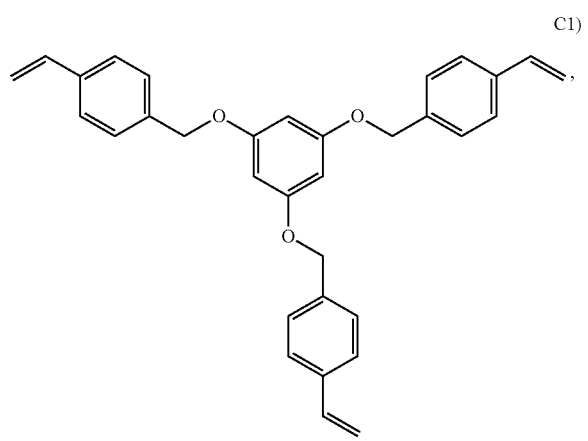
C2) 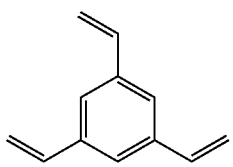
C3) 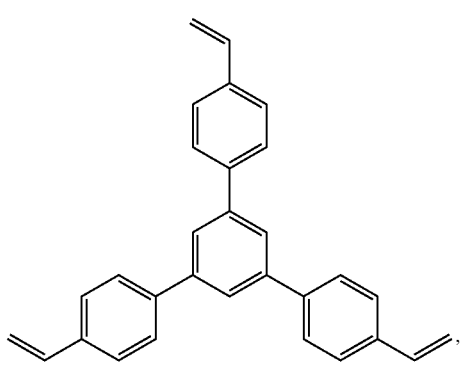
C4) 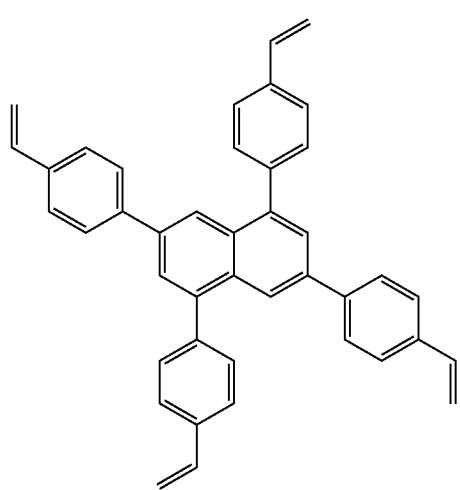
-continued
C5) 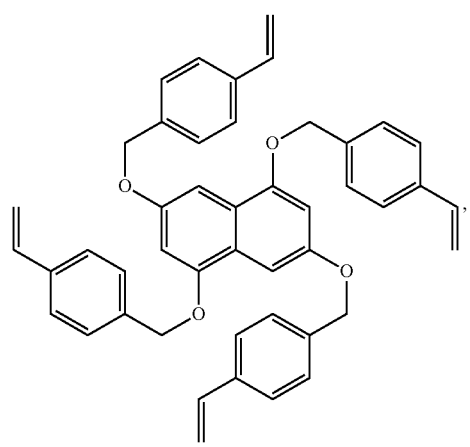
C6) 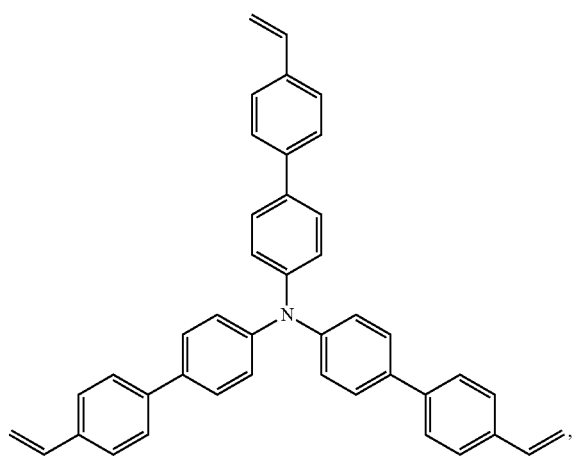
C7) 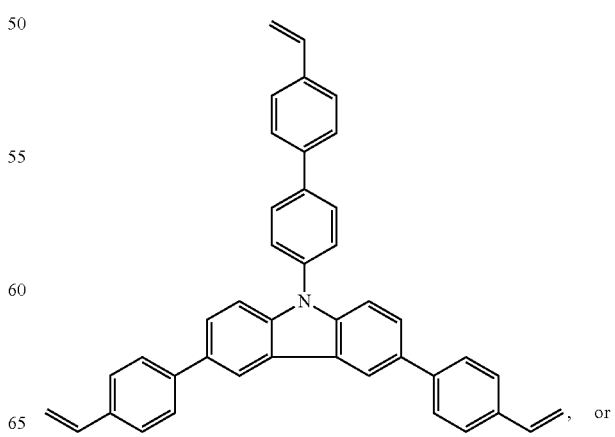, or -continued
C8)
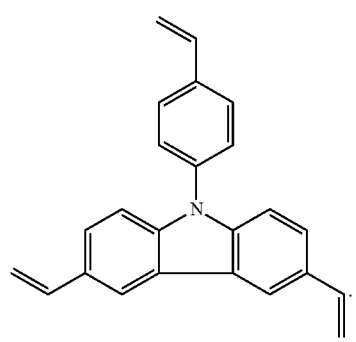
4. The device of claim 1, wherein Structure A is selected from the following A1 through A8:
A1) 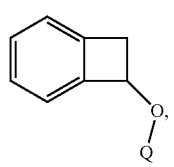
A2) 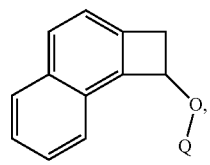
A3) 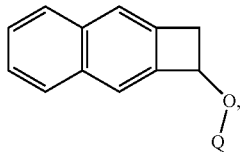
A4) 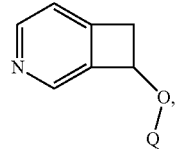
A5) 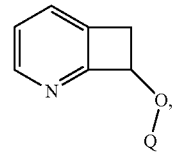
A6) 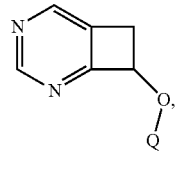
-continued
A7) 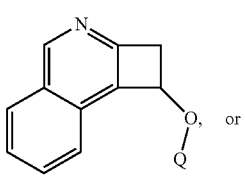  or
A8) 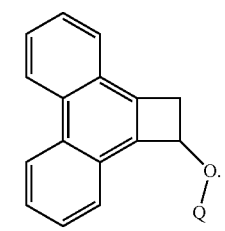
5. The device of claim 1, wherein Structure A is selected from the following A9 through A14:
A9) 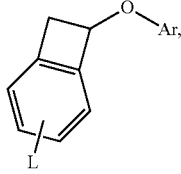
A10) 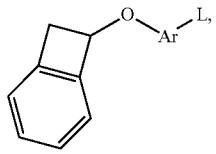
A11) 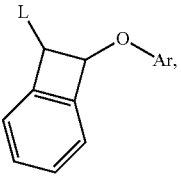
A12) 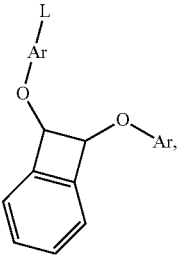
A13) 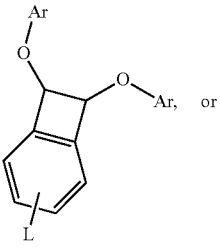  or -continued

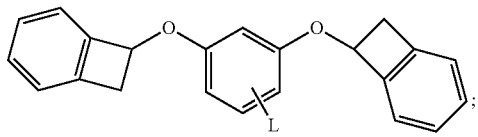
A14)

wherein for each structure A9 through A14, L is independently selected from hydrogen, a hydrocarbon, or a substituted hydrocarbon; and each Ar is independently a substituted or unsubstituted aromatic moiety or a substituted or unsubstituted heteroaromatic moiety.

6. The device of claim 1, wherein Structure A is selected from the following A15 through A20:

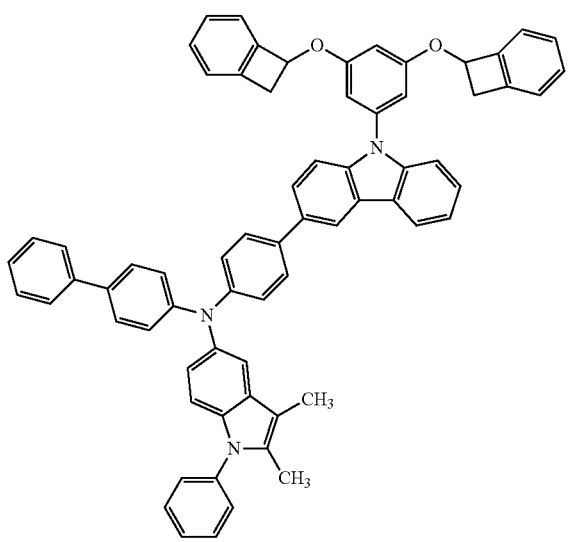
A15)

,

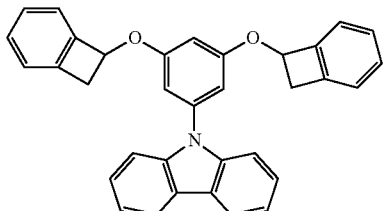
A17)

,

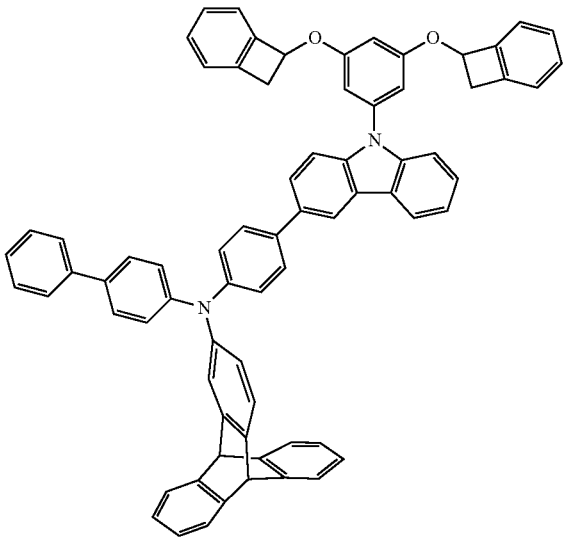
A18)

,

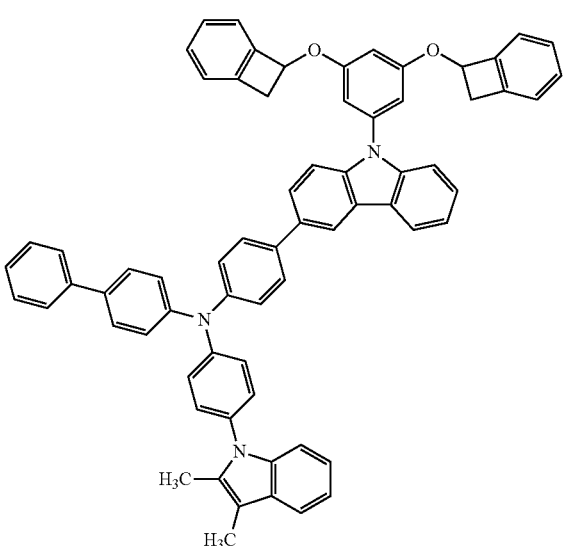
A16)

,

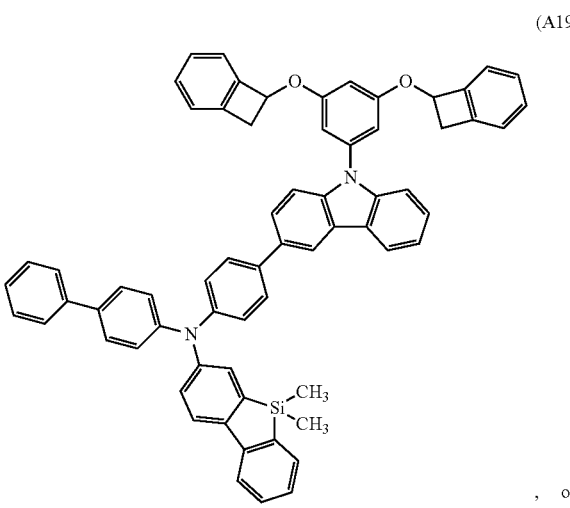
(A19)

, or

-continued

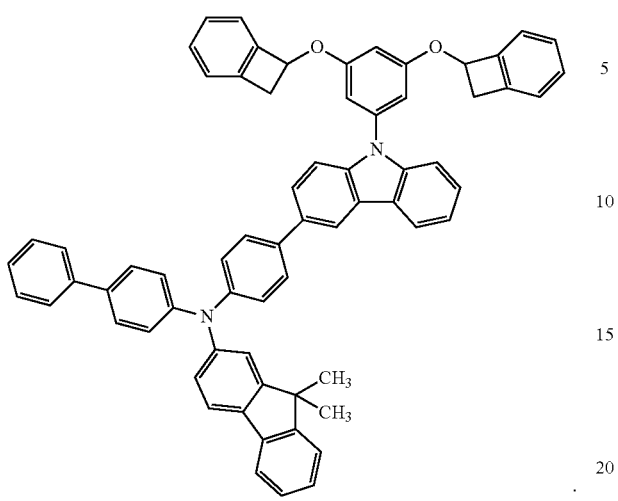
(A20)

7. A light emitting device comprising a polymeric charge transfer layer, wherein the polymeric charge transfer layer is formed from a composition comprising a polymer, said polymer comprising one or more polymerized units derived from A, and one or more polymerized units derived from B, each as follows:

A) a monomer having the Structure A1 to A8:

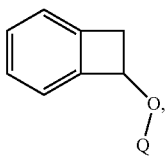
(A1)

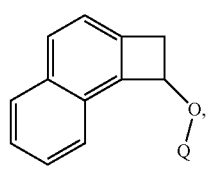
(A2)

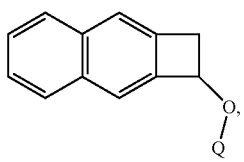
(A3)

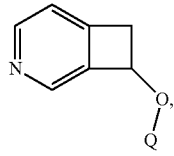
(A4)

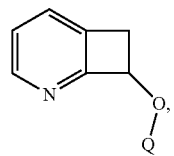
(A5)

-continued

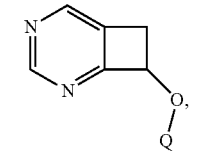
(A6)

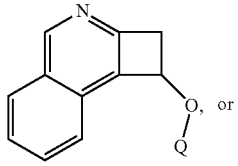
(A7)

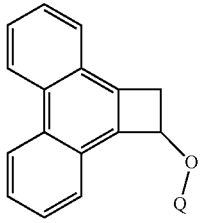
(A8)

wherein O is oxygen; and Q is selected from the following: hydrogen, deuterium, a hydrocarbyl, a substituted hydrocarbyl, a heterohydrocarbyl, a substituted heterohydrocarbyl, a halogen, a cyano, an aryl, an substituted aryl, a heteroaryl, a substituted heteroaryl; and B) a monomer comprising one or more dienophile moieties.

8. A light emitting device comprising a polymeric charge transfer layer, wherein the polymeric charge transfer layer is formed from a composition comprising a polymer, said polymer comprising one or more polymerized units derived from A, and one or more polymerized units derived from B, each as follows:

A) a monomer having the Structure A9 to A20:

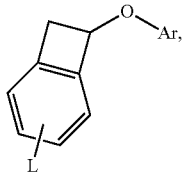
(A9)

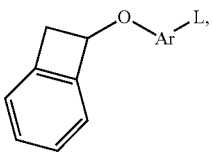
(A10)

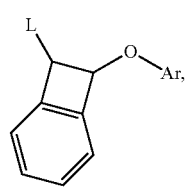
(A11)

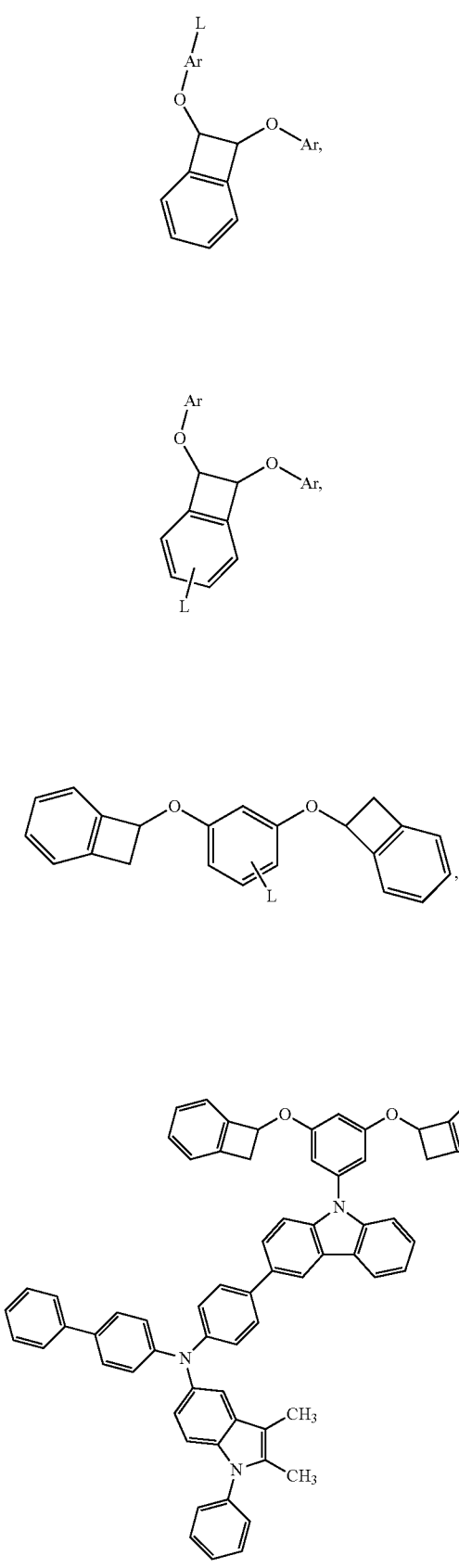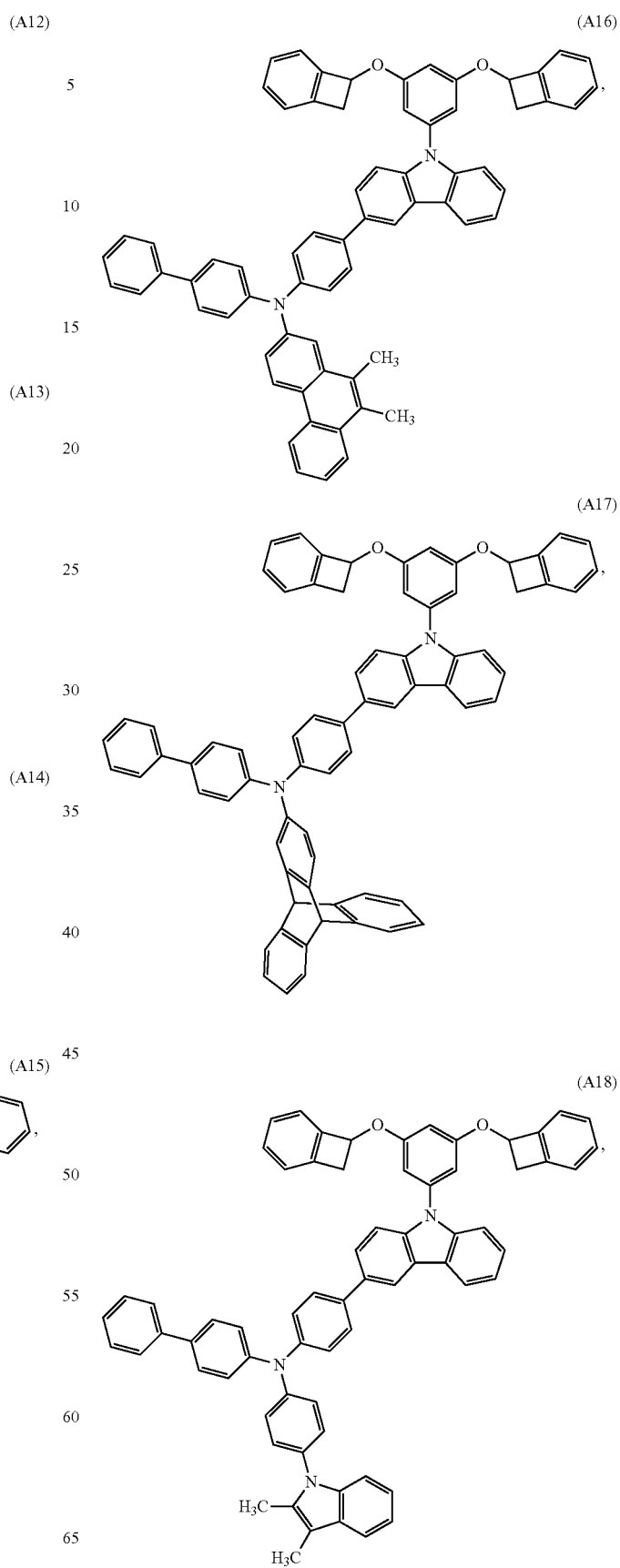

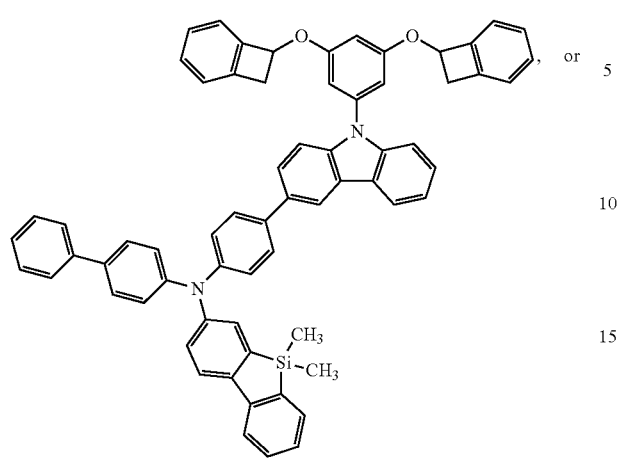
(A19)

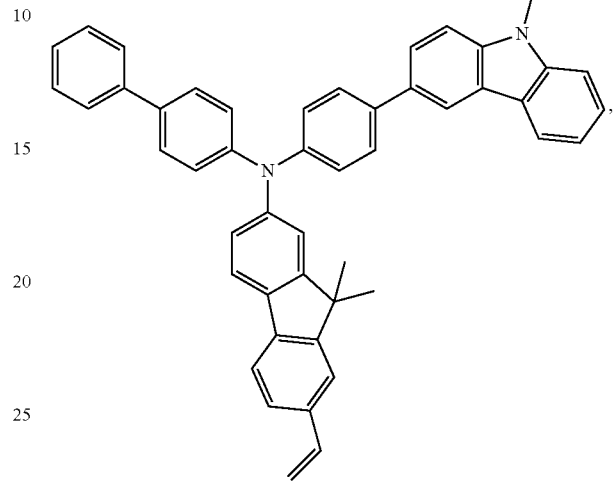
(B1)

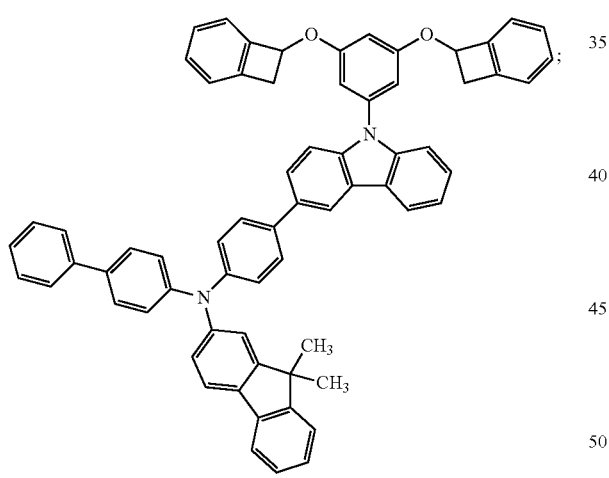
(A20)

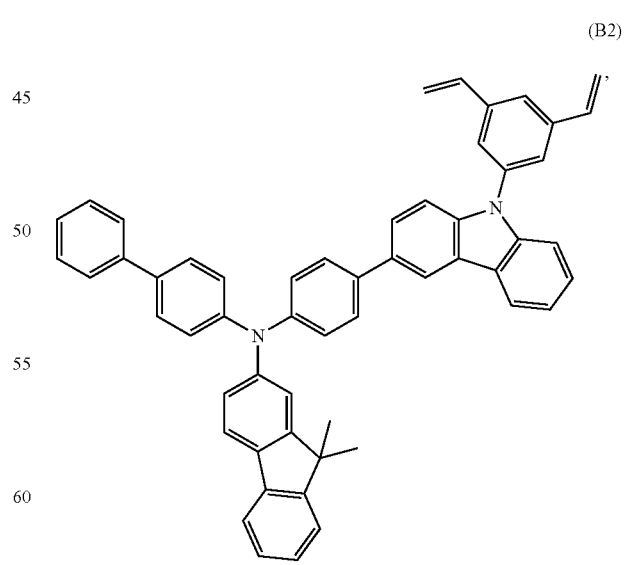
(B2)

wherein O is oxygen; L is independently selected from hydrogen, a hydrocarbon, or a substituted hydrocarbon; and each Ar is independently a substituted or unsubstituted aromatic moiety or a substituted or unsubstituted heteroaromatic moiety; and B) a monomer comprising one or more dienophile moieties.

9. The device of claim 8 wherein Structure B is selected from the following B1 through B6:

(B3)
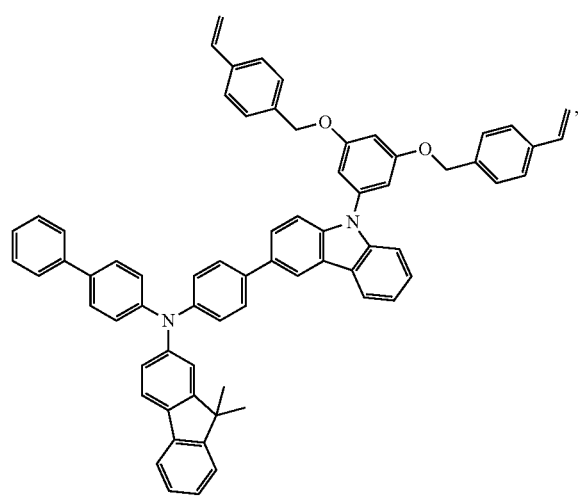
(B4)
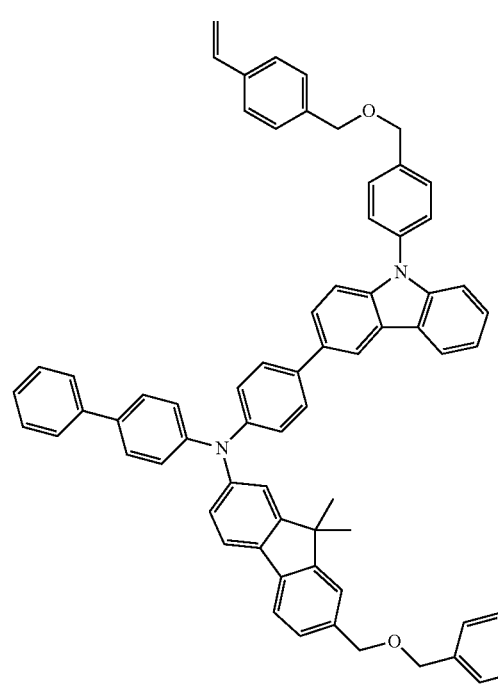
(B5)
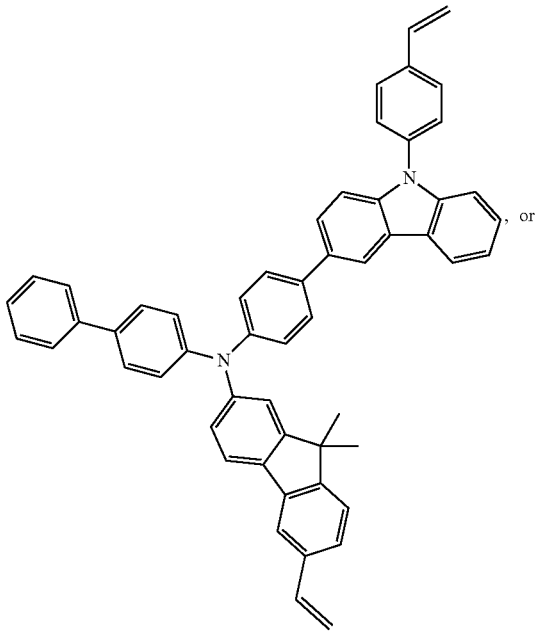
(B6)
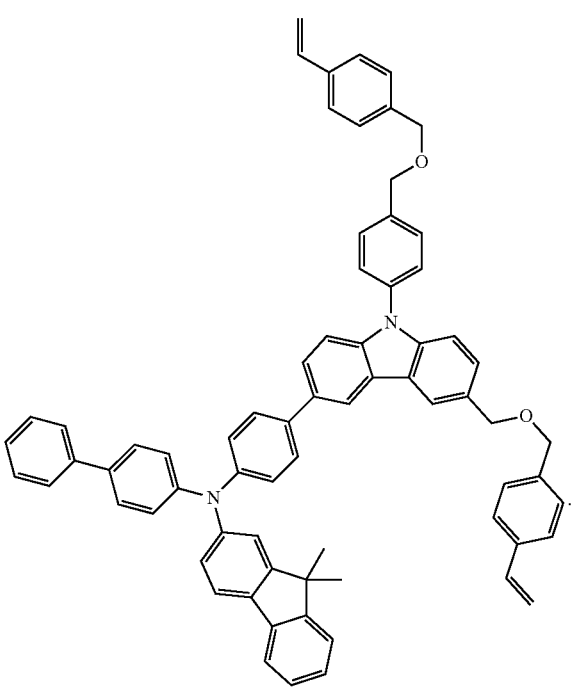
10. The device of claim 7, wherein B is selected from the following structures B1 through B6:

(B1)
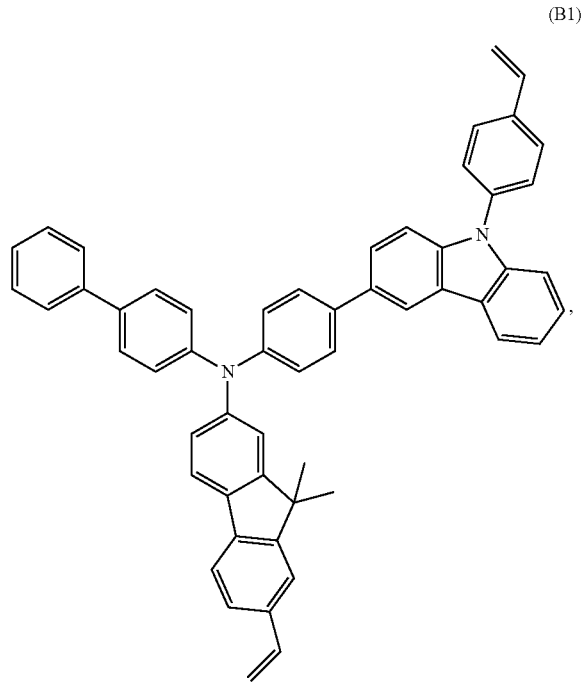
(B2)
(B3)
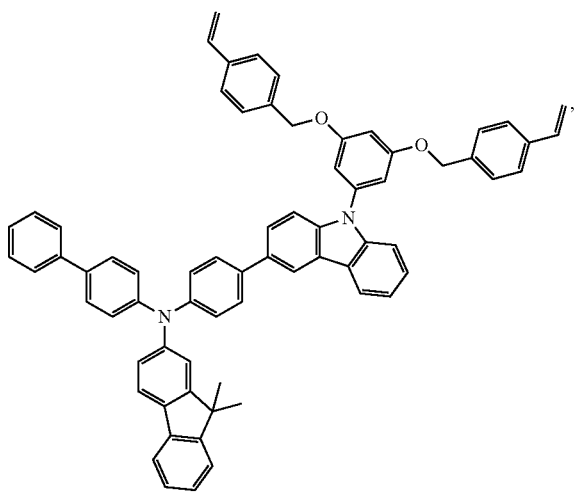
(B4)
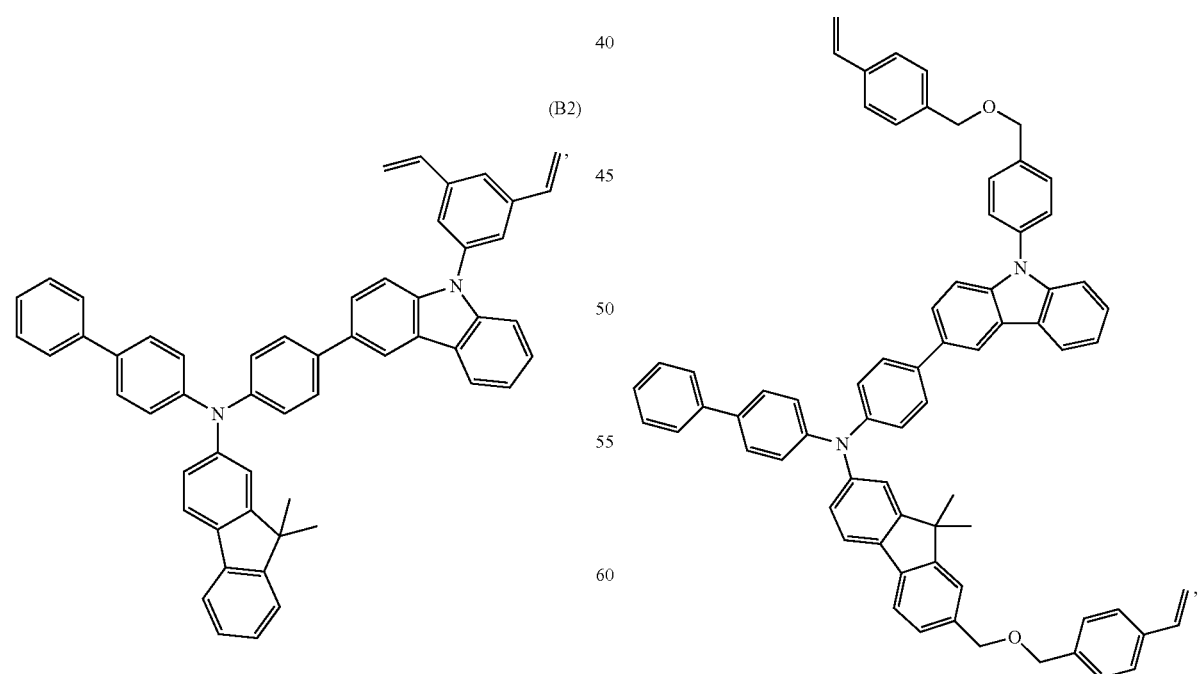

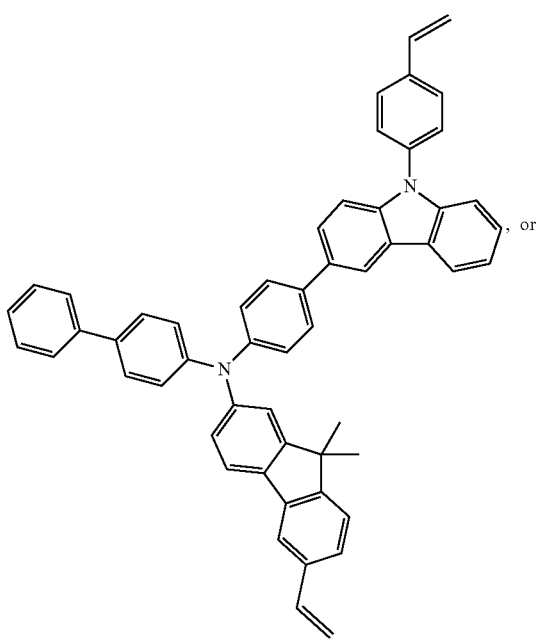
(B5)
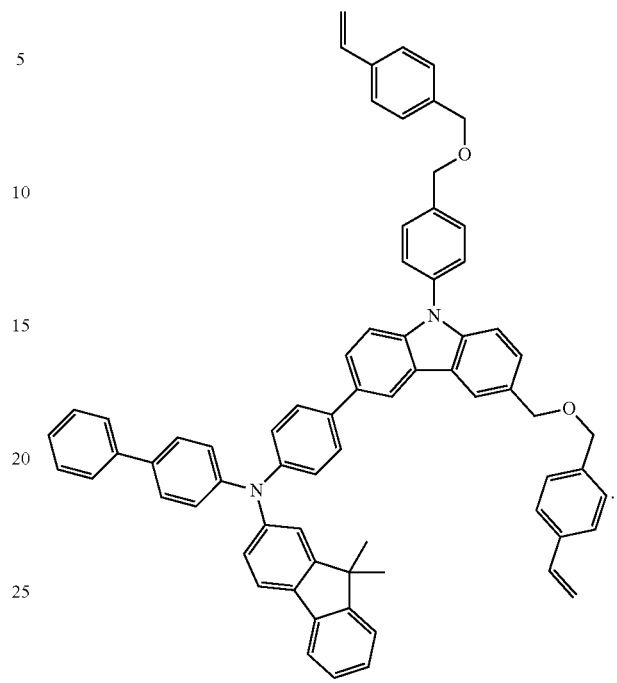
(B6)
* * * * *